US012660349B2

(12) United States Patent (10) Patent No.: US 12,660,349 B2
Jang et al. (45) Date of Patent: Jun. 16, 2026

(54) IMAGE SENSOR INCLUDING COLOR FILTERS ON AUTOFOCUS PIXELS HAVING PROTRUSIONS

(71) Applicant: SAMSUNG ELECTRONICS CO., LTD., Suwon-si (KR)

(72) Inventors: Yeaju Jang, Suwon-si (KR); Dongmin Keum, Suwon-si (KR); Kwanghee Lee, Suwon-si (KR); Bumsuk Kim, Suwon-si (KR); Jinho Kim, Suwon-si (KR); Yun Ki Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 383 days.

(21) Appl. No.: 18/221,736

(22) Filed: Jul. 13, 2023

(65) Prior Publication Data

US 2024/0021638 A1 Jan. 18, 2024

(30) Foreign Application Priority Data

Jul. 15, 2022 (KR) ........................ 10-2022-0087822
Apr. 18, 2023 (KR) ........................ 10-2023-0050504

(51) Int. Cl.
*H10F 39/00* (2025.01)
*H10F 39/18* (2025.01)

(52) U.S. Cl.
CPC ....... *H10F 39/8057* (2025.01); *H10F 39/182* (2025.01)

(58) Field of Classification Search
CPC .. H10F 39/8057; H10F 39/182; H10F 39/199; H10F 39/8053; H10F 39/8063; H10F 39/807
See application file for complete search history.

(56) References Cited

U.S. PATENT DOCUMENTS

| | | | |
|---|---|---|---|
| 7,477,304 B2 | 1/2009 | Hu | |
| 8,537,255 B2 * | 9/2013 | Lee ...................... | H04N 25/134 |
| | | | 257/435 |
| 9,172,892 B2 | 10/2015 | Dokoutchaev et al. | |
| 9,620,541 B2 | 4/2017 | Ito | |
| 9,780,132 B2 | 10/2017 | Lee et al. | |
| 10,002,899 B2 | 6/2018 | Chou et al. | |

(Continued)

FOREIGN PATENT DOCUMENTS

| | | |
|---|---|---|
| JP | 2020-48089 A | 3/2020 |
| KR | 10-0494031 B1 | 6/2005 |

(Continued)

*Primary Examiner* — Gevell V Selby
(74) *Attorney, Agent, or Firm* — Sughrue Mion, PLLC

(57) ABSTRACT

An image sensor includes a first pixel group on a substrate and including a plurality of first pixels, a second pixel group on the substrate and including a plurality of second pixels, where at least one of the plurality of first pixels and at least one of the plurality of second pixels are adjacent in a first direction, a first autofocus pixel group between the first pixel group and the second pixel group, the first autofocus pixel group including a first autofocus pixel adjacent to the first pixel group and a second autofocus pixel adjacent to the second pixel group, a first color filter on the first autofocus pixel and the second autofocus pixel, a second color filter on the plurality of second pixels, and a light-shield pattern that separates the first color filter and the second color filter.

20 Claims, 67 Drawing Sheets

(56)                    References Cited

U.S. PATENT DOCUMENTS

| | | | |
|---|---|---|---|
| 10,341,595 | B2 | 7/2019 | Jung et al. |
| 2015/0146054 | A1 | 5/2015 | Vaartstra et al. |
| 2016/0269662 | A1 | 9/2016 | Hepper et al. |
| 2019/0319060 | A1* | 10/2019 | Do ........................ H04N 25/704 |
| 2020/0258928 | A1* | 8/2020 | Seo ..................... H10F 39/8053 |
| 2021/0288090 | A1 | 9/2021 | Li et al. |
| 2022/0020797 | A1* | 1/2022 | Seo ..................... H10F 39/8053 |
| 2022/0102413 | A1 | 3/2022 | Cho |
| 2022/0149091 | A1* | 5/2022 | Joe ......................... H04N 25/13 |
| 2022/0190006 | A1 | 6/2022 | Shinohara |
| 2022/0232184 | A1 | 7/2022 | Lee |

FOREIGN PATENT DOCUMENTS

| | | | |
|---|---|---|---|
| KR | 10-2007-0014714 | A | 2/2007 |
| KR | 10-2009-0067264 | A | 6/2009 |
| KR | 10-2375989 | B1 | 3/2022 |

* cited by examiner

IMAGE SENSOR INCLUDING COLOR FILTERS ON AUTOFOCUS PIXELS HAVING PROTRUSIONS

CROSS-REFERENCE TO RELATED APPLICATIONS

This application is based on and claims priority under 35 U.S.C § 119 to Korean Patent Application No. 10-2023-0050504, filed on Apr. 18, 2023, and Korean Patent Application No. 10-2022-0087822, filed on Jul. 15, 2022, in the Korean Intellectual Property Office, the disclosures of which are incorporated by reference herein in their entireties.

BACKGROUND

The present disclosure relates to an image sensor, and more particularly, to a complementary metal oxide semiconductor (CMOS) image sensor.

An image sensor may be a device that converts optical images into electrical signals. An image sensor may be classified into a charge coupled device (CCD) type and a complementary metal oxide semiconductor (CMOS) type. A CMOS type image sensor may be referred to as a CMOS image sensor (CIS). The CIS may include a plurality of two-dimensionally arranged pixels. Each of the unit pixel regions includes a photodiode. The photodiode serves to convert incident light into electrical signals.

SUMMARY

One or more example embodiments provide an image sensor with increased optical properties and improved autofocus functions.

Additional aspects will be set forth in part in the description which follows and, in part, will be apparent from the description, or may be learned by practice of the presented embodiments.

According to an aspect of an example embodiment, an image sensor may include a first pixel group on a substrate and including a plurality of first pixels, a second pixel group on the substrate and including a plurality of second pixels, where at least one of the plurality of first pixels and at least one of the plurality of second pixels are adjacent in a first direction, a first autofocus pixel group between the first pixel group and the second pixel group, the first autofocus pixel group including a first autofocus pixel adjacent to the first pixel group and a second autofocus pixel adjacent to the second pixel group, a first color filter on the first autofocus pixel and the second autofocus pixel, a second color filter on the plurality of second pixels, and a light-shield pattern that separates the first color filter and the second color filter, where the first color filter may include a first protrusion that protrudes in a second direction toward the second color filter and that at least partially vertically overlaps the light-shield pattern, where the second color filter may include a second protrusion that protrudes in a third direction toward the first color filter and that at least partially vertically overlaps the light-shield pattern, and where a width of the second protrusion in the first direction may be greater than a width of the first protrusion in the first direction.

According to an aspect of an example embodiment, an image sensor may include a substrate including a first surface and a second surface opposite to the first surface, a first pixel group on the substrate, the first pixel group including a plurality of first pixels, a second pixel group on the substrate, the second pixel group including a plurality of second pixels, where at least one of the plurality of first pixels and at least one of the plurality of second pixels are adjacent in a first direction, a first autofocus pixel group between the first pixel group and the second pixel group, the first autofocus pixel group including a first autofocus pixel adjacent to the first pixel group and a second autofocus pixel adjacent to the second pixel group, a pixel isolation pattern in the substrate, the pixel isolation pattern defining the plurality of first pixels and the plurality of second pixels, a photoelectric conversion region in each of the plurality of first pixels and the plurality of second pixels, a transfer gate on the first surface of the substrate, a floating diffusion region in the substrate and adjacent to at least one side of the transfer gate, a first dielectric layer that at least partially covers the transfer gate, wiring lines in the first dielectric layer, a backside dielectric layer on the second surface of the substrate, a first color filter on the backside dielectric layer and that at least partially covers the first pixel group and the first autofocus pixel group, a second color filter on the backside dielectric layer and that at least partially covers the second pixel group, a light-shield pattern that separates the first color filter and the second color filter, and a microlens section on the first color filter and the second color filter, where the first color filter may include a first protrusion that protrudes in a second direction toward the second color filter and that at least partially vertically overlaps the light-shield pattern, where the second color filter may include a second protrusion that protrudes in a third direction toward the first color filter and that at least partially vertically overlaps the light-shield pattern, and where a width of the second protrusion in the first direction may be greater than a width of the first protrusion in the first direction.

According to an aspect of an example embodiment, an image sensor may include a substrate including a first image pixel, a first autofocus pixel, a second autofocus pixel, and a second image pixel that are arranged sequentially in a first direction, a first color filter on the substrate and that at least partially covers the first image pixel, the first autofocus pixel, and the second autofocus pixel, wherein the first color filter comprises a first color, and a second color filter that at least partially covers the second image pixel and including a second color different from the first color, where the first color filter may include a first thickness on the first autofocus pixel and a second thickness on the second autofocus pixel and where the first thickness may be greater than the second thickness.

BRIEF DESCRIPTION OF DRAWINGS

The above and other aspects, features, and advantages of certain example embodiments of the present disclosure will be more apparent from the following description taken in conjunction with the accompanying drawings, in which:

FIG. 3 is a cross-sectional view taken along line A-A' of FIG. 2 according to one or more embodiments of the disclosure;

FIGS. 9A, 9B, 9C, and 9D are cross-sectional views respectively taken along lines A-A', B-B', C-C', and D-D' of FIG. 8 according to one or more embodiments of the disclosure;

FIGS. 12A, 12B, 12C, and 12D are cross-sectional views respectively taken along lines A-A', B-B', C-C', and D-D' of FIG. 11 according to one or more embodiments of the disclosure;

FIGS. 24A and 24B are enlarged plan views illustrating section M of an image sensor depicted in FIG. 2 according to one or more embodiments of the disclosure;

FIGS. 27, 28, and 30 are cross-sectional views illustrating a method of fabricating an image sensor having a cross-section of FIG. 25 according to one or more embodiments of the disclosure;

DETAILED DESCRIPTION

Figure 1:
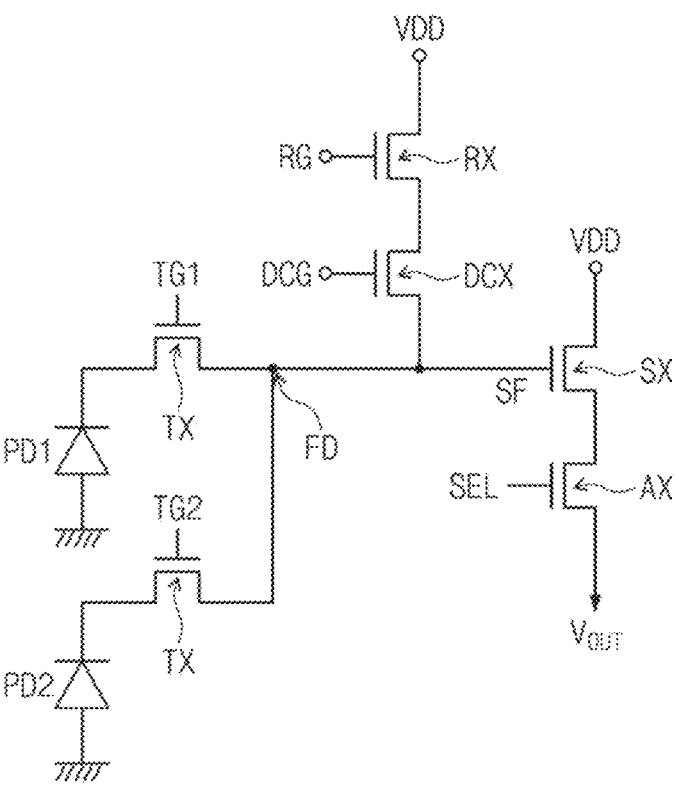
FIG. 1 is a diagram illustrating an image sensor according to one or more embodiments of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a diagram illustrating an image sensor according to one or more embodiments of the disclosure.

Referring to FIG. 1, unit pixels of an image sensor may include photodiodes PD1 and PD2, a transfer transistor TX, a source follower transistor SX, a reset transistor RX, a dual conversion transistor DCX, and a selection transistor AX. The transfer transistor TX, the source follower transistor SX, the reset transistor RX, the dual conversion transistor DCX, and the selection transistor AX may respectively include a transfer gate TG, a source follower gate SF, a reset gate RG, a dual conversion gate DCG, and a selection gate SEL.

The photodiodes PD1 and PD2 may include an n-type impurity region and a p-type impurity region. A floating diffusion region FD may serve as a drain of the transfer transistor TX. The floating diffusion region FD may serve as a source of the dual conversion transistor DCX. The floating diffusion region FD may be electrically connected to the source follower gate SF of the source follower transistor SX. The source follower transistor SX may be connected to the selection transistor AX.

FIG. 1 depicts an example structure in which the photodiodes PD1 and PD2 are connected to one floating diffusion region FD, but the disclosure is not limited thereto. For example, one unit pixel may include one of the photodiodes PD1 and PD2, the floating diffusion region FD, and five transistors TX, RX, DCX, AX, and SX, and neighboring unit pixels may share the reset transistor RX, the source follower transistor SX, the dual conversion transistor DCX, or the selection transistor AX. In addition, there is no limitation imposed on the number of the photodiodes PD1 and PD2 that electrically share one floating diffusion region FD. Therefore, the image sensor may increase in integration.

Figure 2:
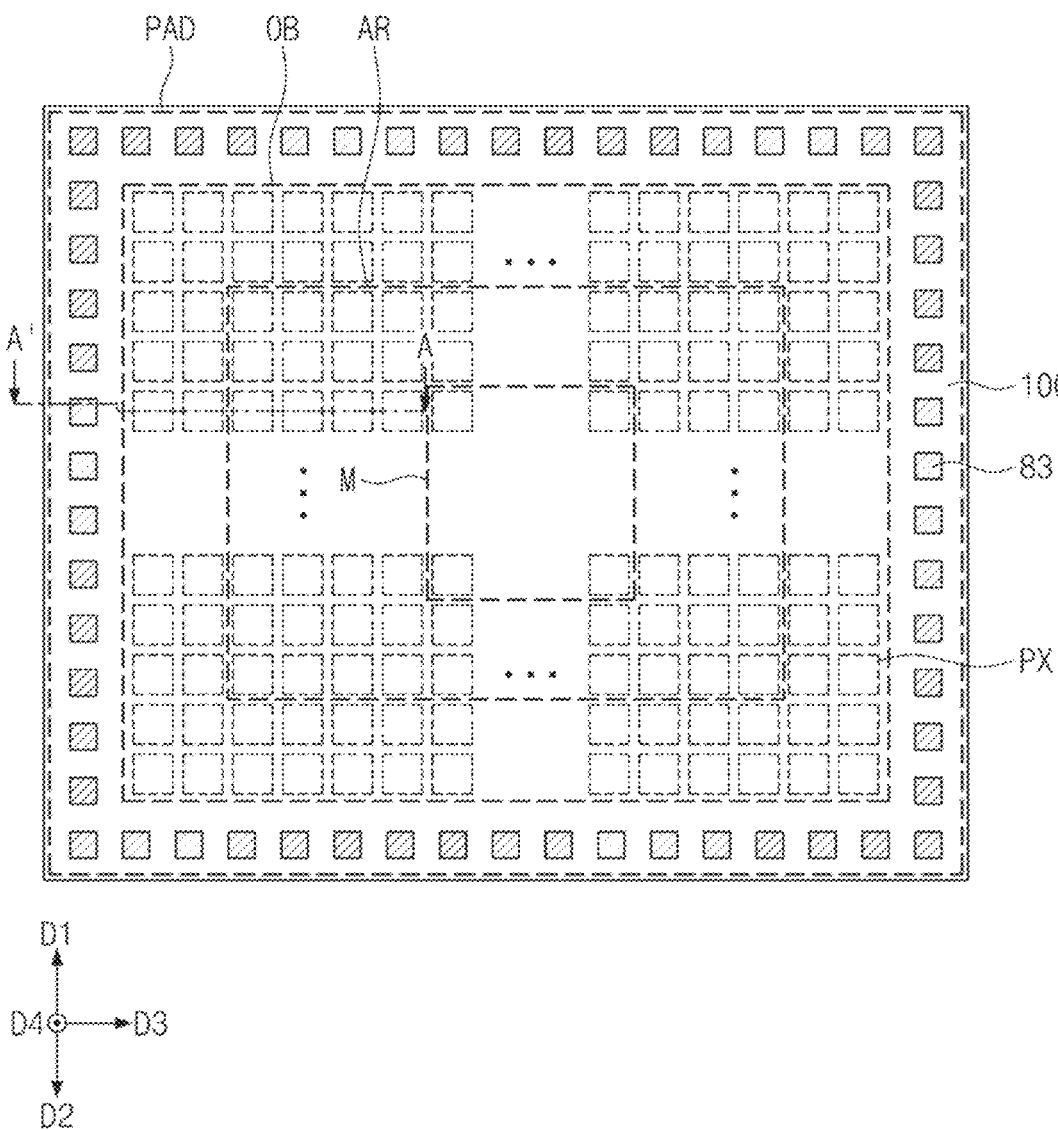
FIG. 2 is a plan view illustrating an image sensor according to one or more embodiments of the disclosure.
Figure 3:
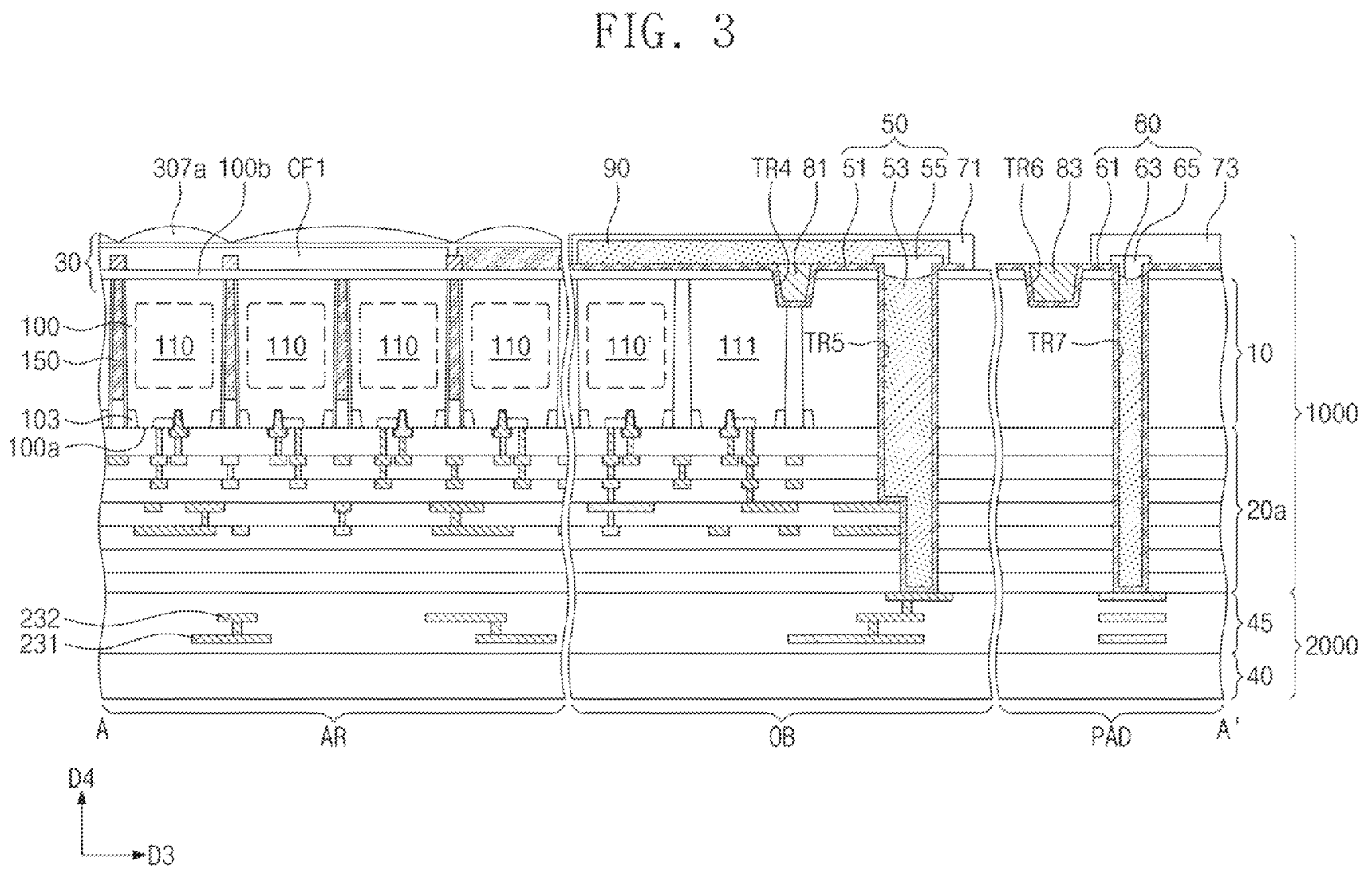

FIG. 2 is a plan view illustrating an image sensor according to one or more embodiments of the disclosure. FIG. 3 is a cross-sectional view taken along line A-A' of FIG. 2 according to one or more embodiments of the disclosure.

Referring to FIGS. 2 and 3, an image sensor may include a sensor chip 1000 and a logic chip 2000. The sensor chip 1000 may include a photoelectric conversion layer 10, a first wiring layer 20a, and an optical transmission layer 30. The photoelectric conversion layer 10 may include a first substrate 100, a pixel isolation pattern 150, a first device isolation pattern 103, and photoelectric conversion regions 110 provided in the first substrate 100. The photoelectric conversion regions 110 may convert externally incident light into electrical signals.

In a plan view, the first substrate 100 may include a pixel array area AR, an optical black area OB, and a pad area PAD. In a plan view, the pixel array area AR may be disposed on a central portion of the first substrate 100. The pixel array area AR may include a plurality of pixels PX. The plurality of pixels PX may output photoelectric signals from incident light. The plurality of pixels PX may be two-dimensionally arranged to constitute columns and rows. The columns may be parallel to a first direction D1. The rows may be parallel to a third direction D3. As described herein, the first direction D1 may be parallel to a first surface 100a of the first substrate 100. A second direction D2 may be parallel to the first surface 100a of the first substrate 100 and may be opposite to the first direction D1. The third direction D3 may be parallel to the first surface 100a of the first substrate 100 and may intersect the first direction D1. A fourth direction D4 may be substantially perpendicular to the first surface 100a of the first substrate 100.

The pad area PAD may be provided on an edge portion of the first substrate 100, and in a plan view, may surround or at least partially surround the pixel array area AR. The pad area PAD may include second pad terminals 83. The second pad terminals 83 may outwardly output electrical signals generated from the plurality of pixels PX. Alternatively, external electrical signals or voltages may be transferred through the second pad terminals 83 to the plurality of pixels PX. As the pad area PAD is disposed on the edge portion of the first substrate 100, the second pad terminals 83 may be easily coupled to the outside.

The optical black area OB may be disposed between the pad area PAD and the pixel array area AR of the first substrate 100. In a plan view, the optical black area OB may surround or at least partially surround the pixel array area AR. The optical black area OB may include a plurality of dummy regions 111. The dummy region 111 may generate signals that are used as information to eliminate subsequent process noise. The pixel array area AR of the image sensor will be further described in detail below with reference to FIGS. 4, 5A to 5D, and 6A to 6D.

Figure 4:
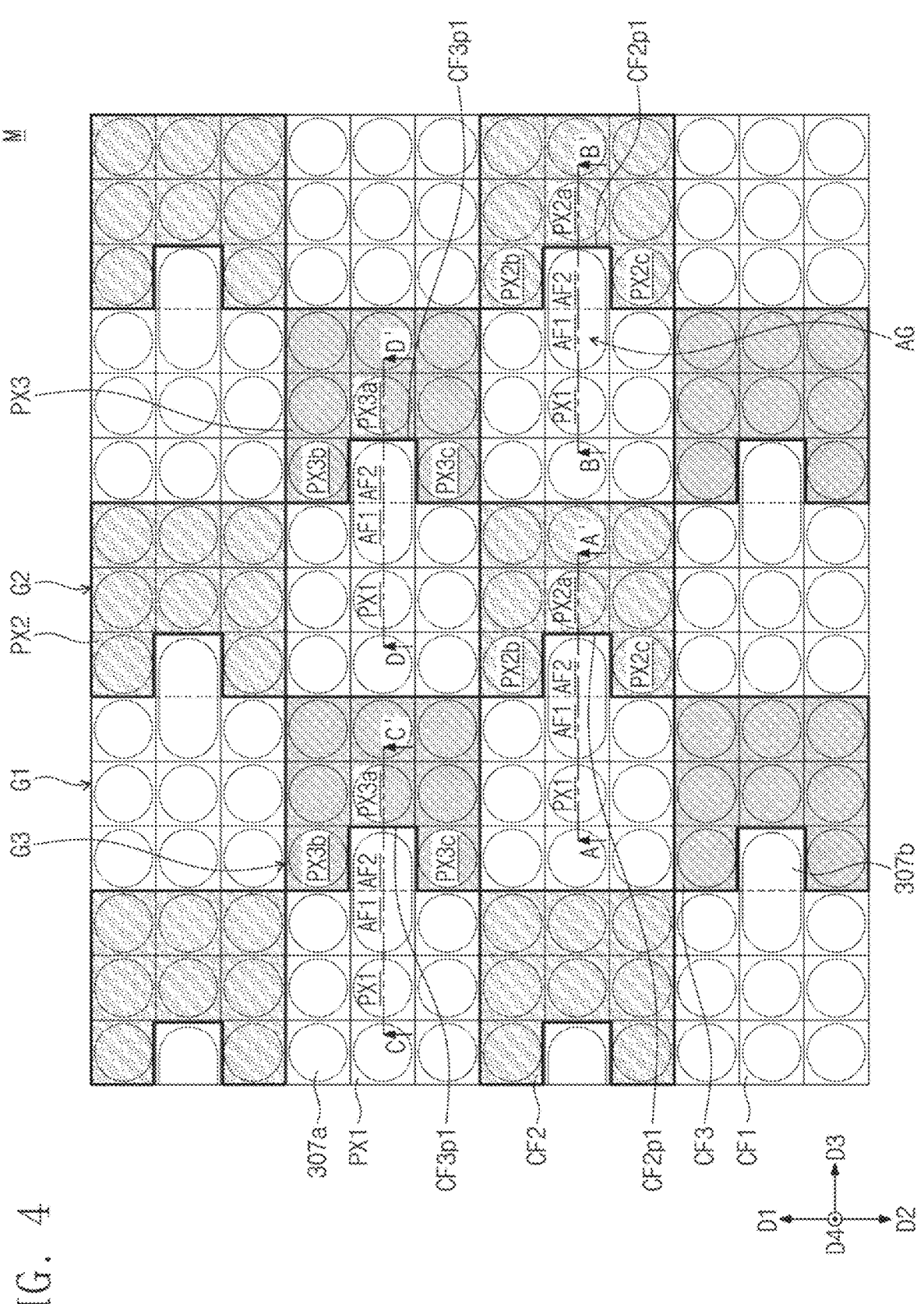
FIG. 4 is an enlarged plan view illustrating section M of FIG. 2 according to one or more embodiments of the disclosure.
Figure 5A:
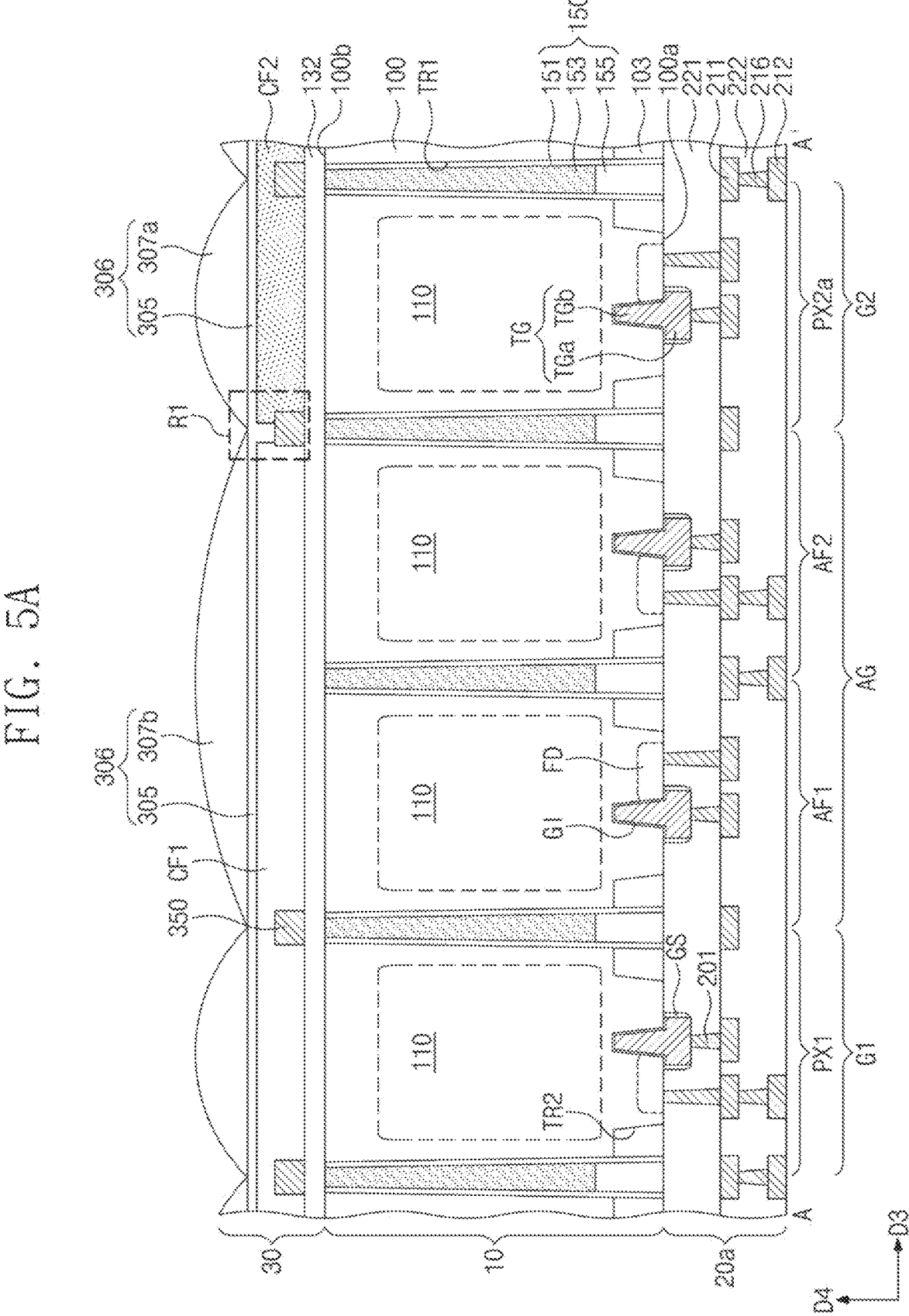
FIGS. 5A, 5B, 5C, and 5D are cross-sectional views respectively taken along lines A-A', B-B', C-C', and D-D' of FIG. 4 according to embodiments of the disclosure.
Figure 5B:
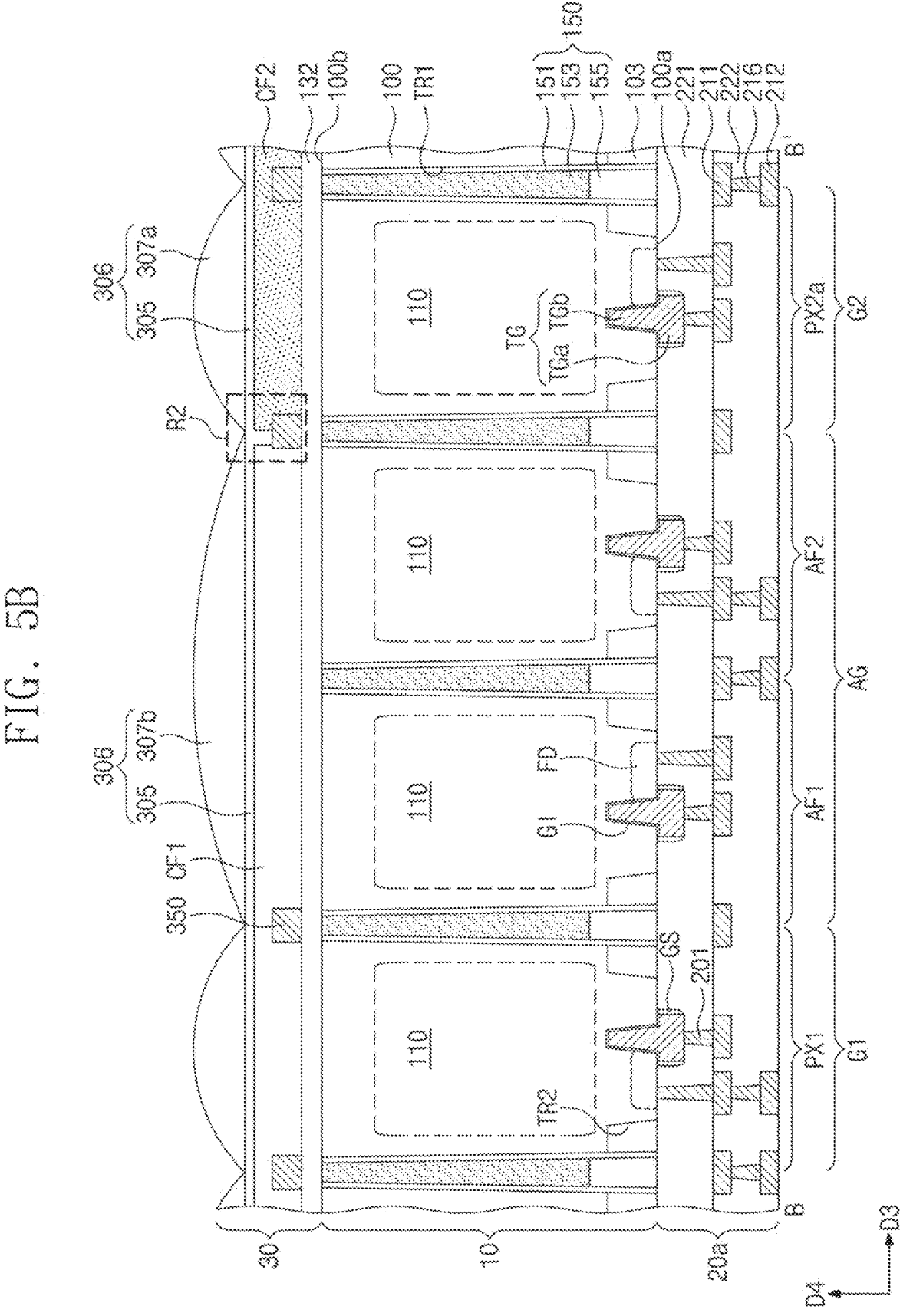
Figure 5C:
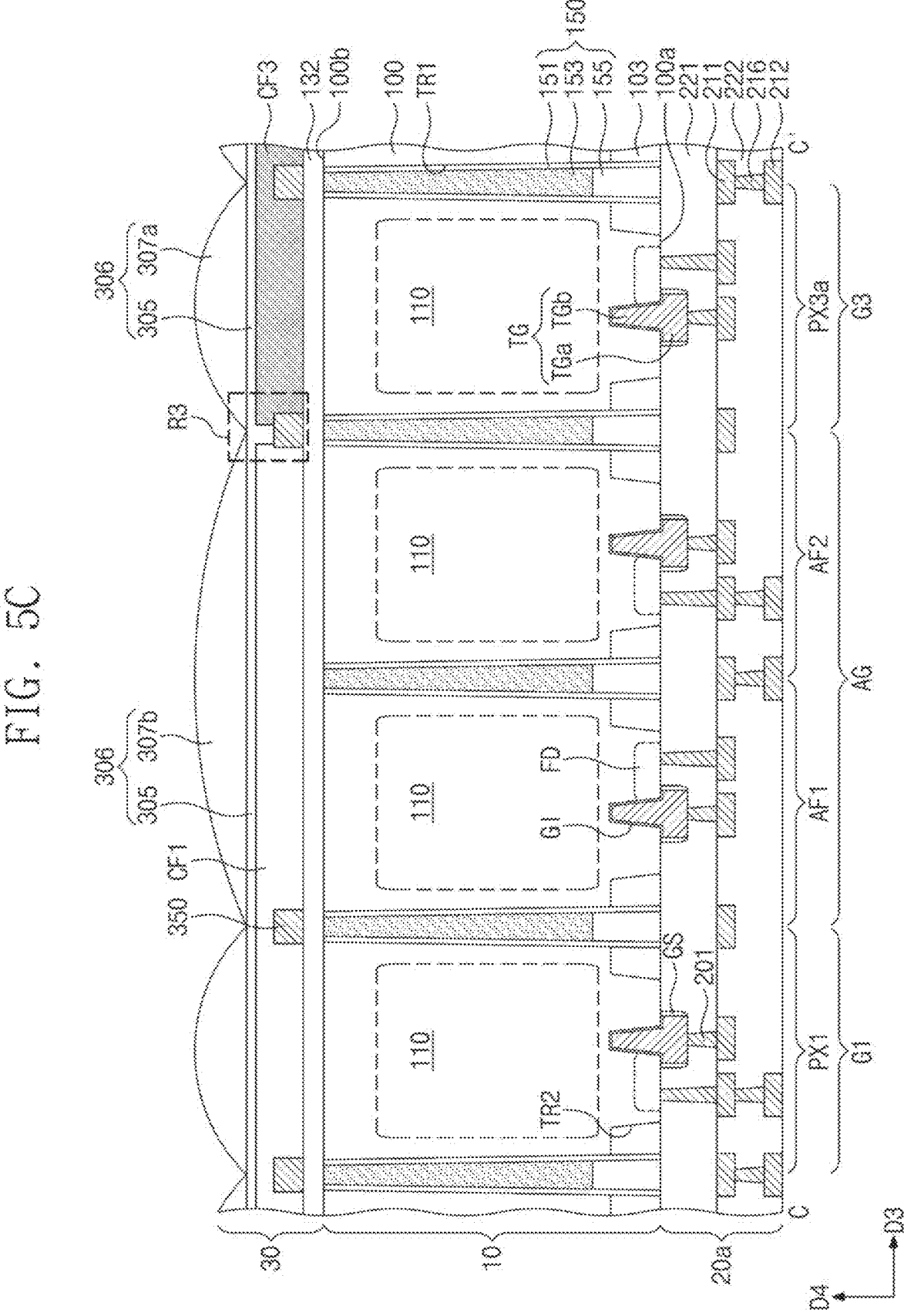
Figure 5D:
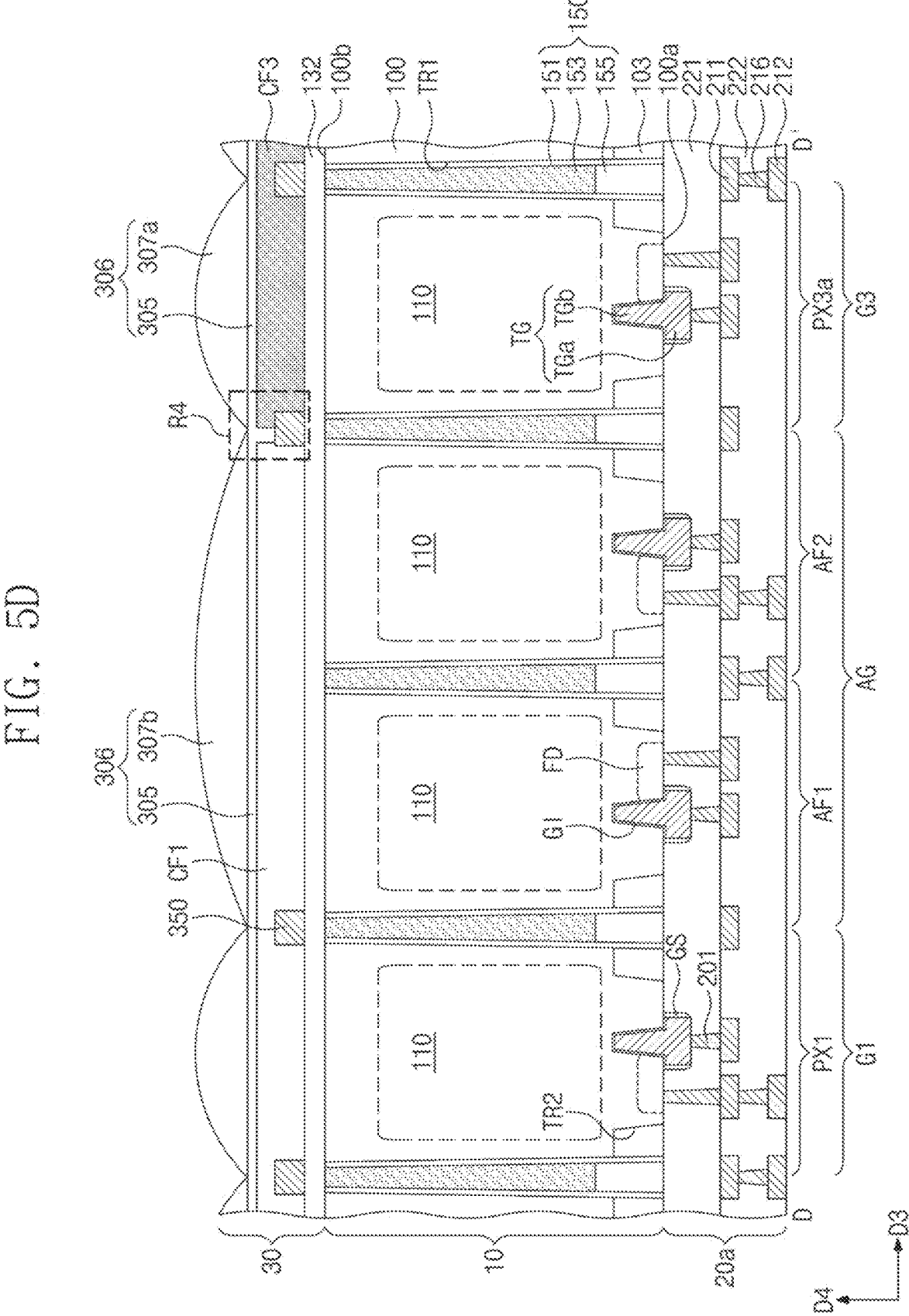
Figure 6A:
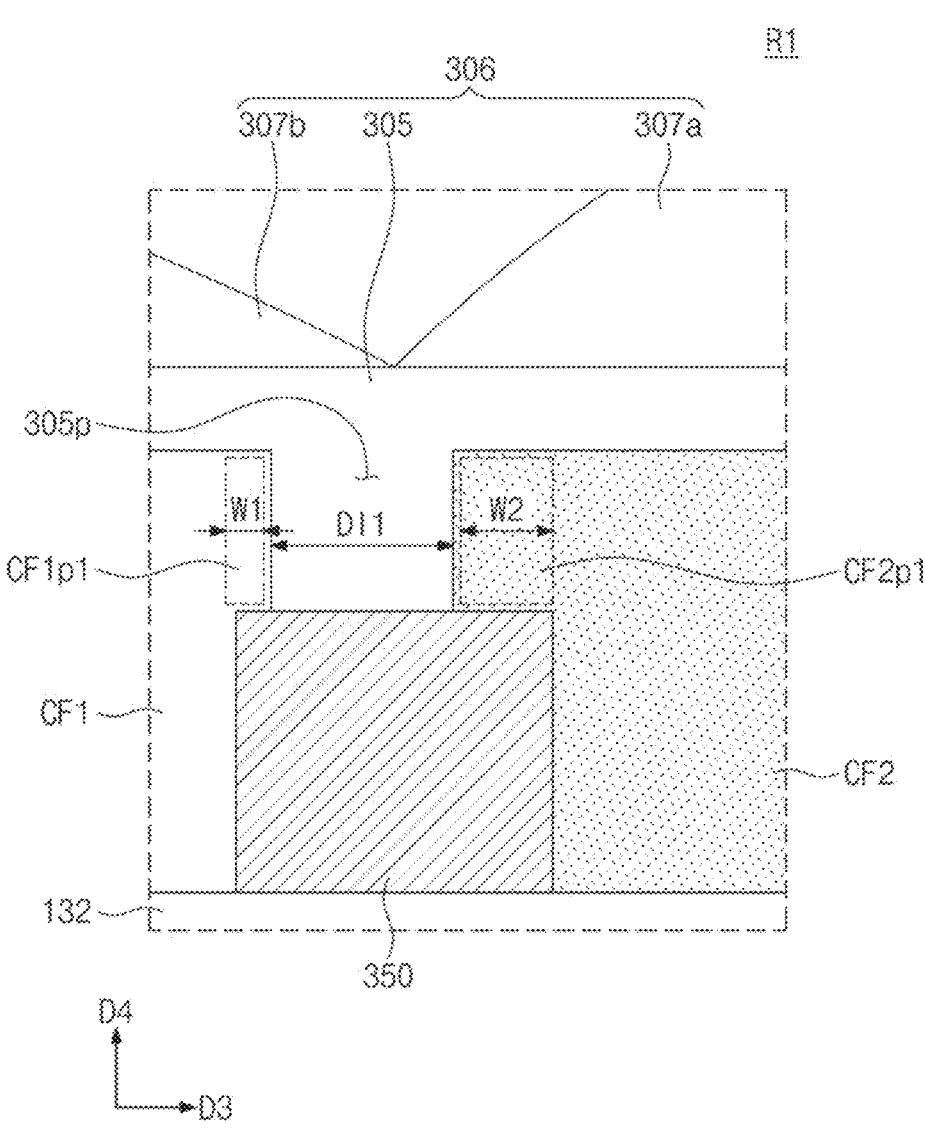
FIG. 6A is an enlarged cross-sectional view illustrating section R1 of FIG. 5A according to one or more embodiments of the disclosure.
Figure 6B:
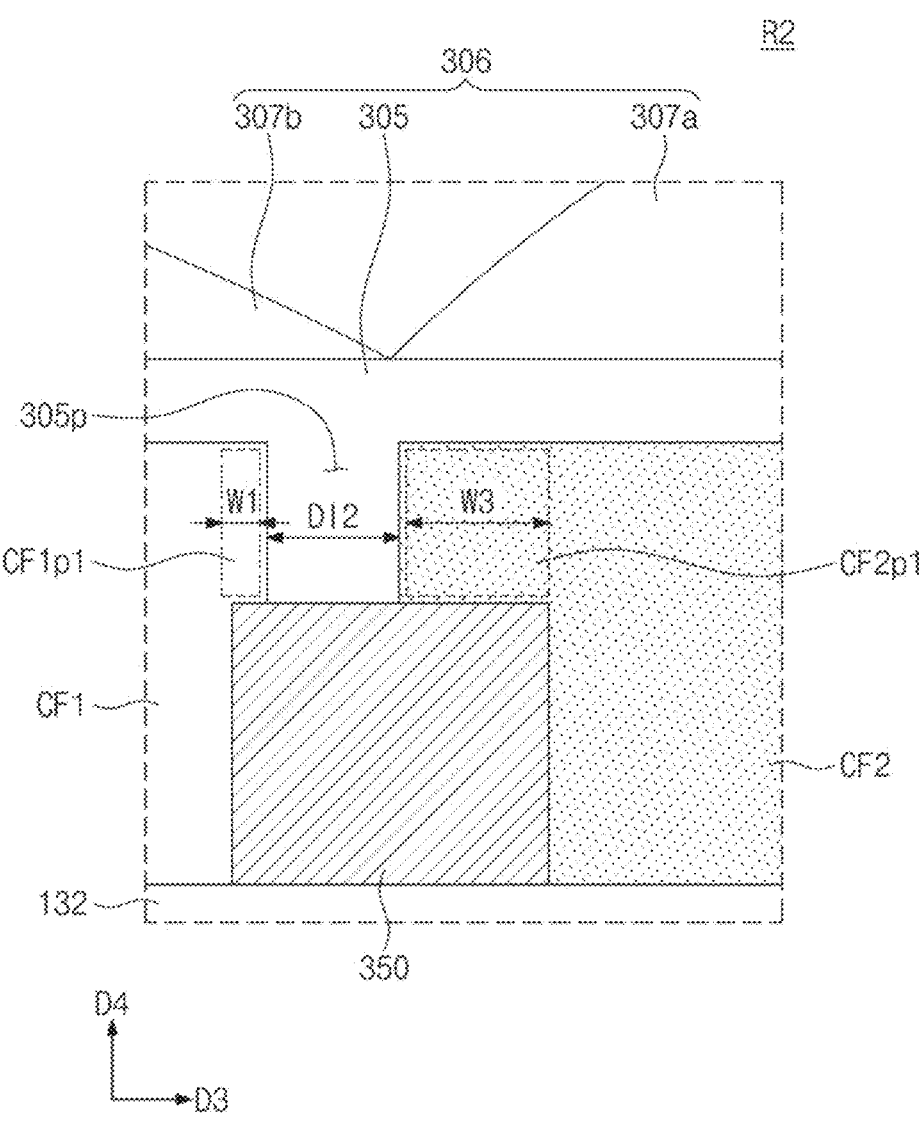
FIG. 6B is an enlarged cross-sectional view illustrating section R2 of FIG. 5B according to one or more embodiments of the disclosure.
Figure 6C:
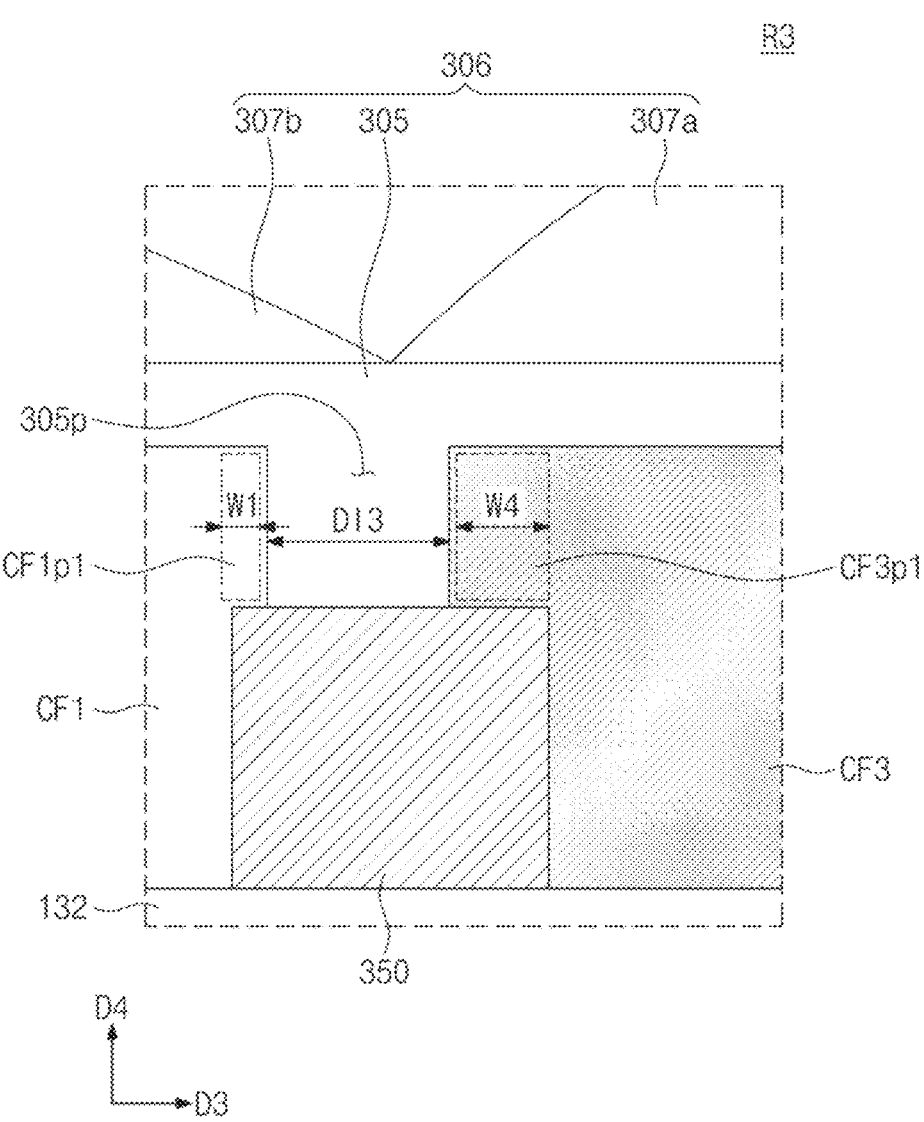
FIG. 6C is an enlarged cross-sectional view illustrating section R3 of FIG. 5C according to one or more embodiments of the disclosure.
Figure 6D:
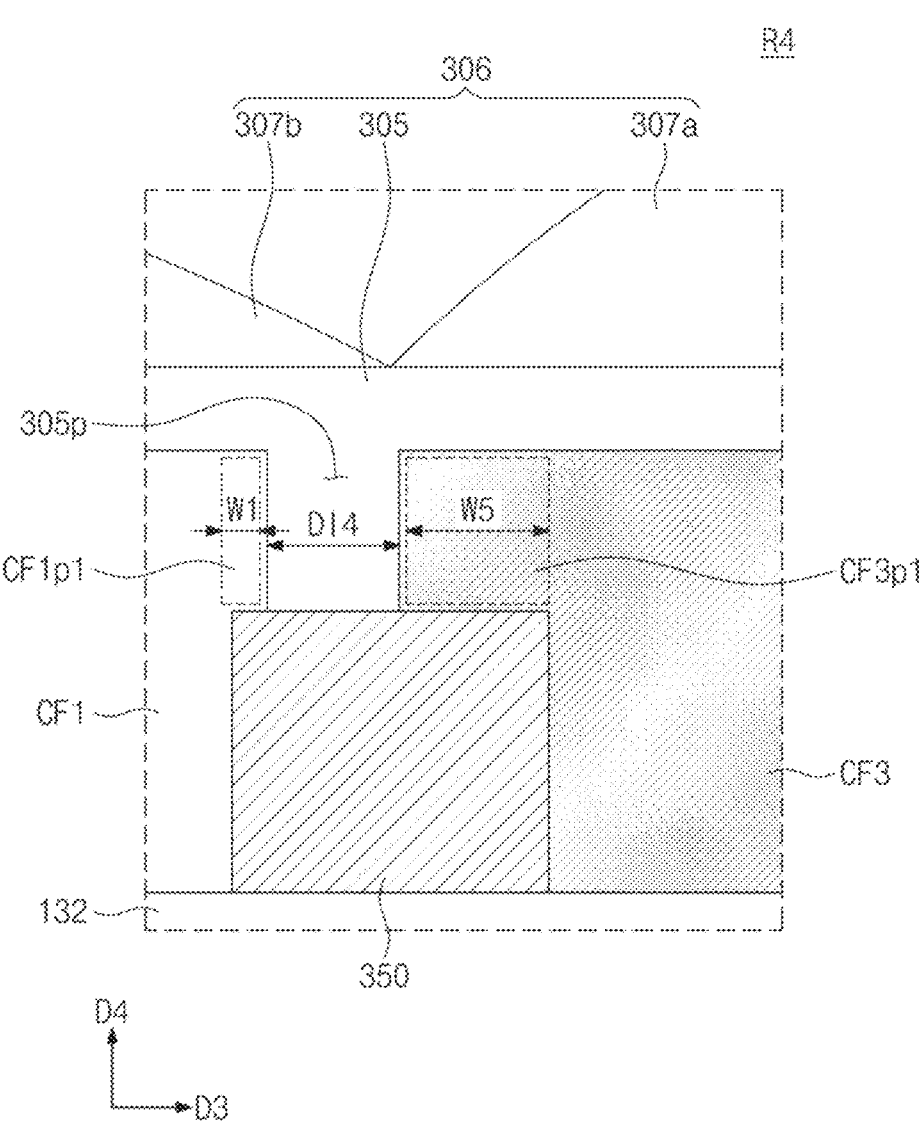
FIG. 6D is an enlarged cross-sectional view illustrating section R4 of FIG. 5D according to one or more embodiments of the disclosure.

FIG. 4 is an enlarged plan view illustrating section M of FIG. 2 according to one or more embodiments of the disclosure. FIGS. 5A, 5B, 5C, and 5D are cross-sectional views respectively taken along lines A-A', B-B', C-C', and D-D' of FIG. 4 according to one or more embodiments of the disclosure. FIG. 6A is an enlarged cross-sectional view illustrating section R1 of FIG. 5A according to one or more embodiments of the disclosure. FIG. 6B is an enlarged cross-sectional view illustrating section R2 of FIG. 5B according to one or more embodiments of the disclosure. FIG. 6C is an enlarged cross-sectional view illustrating section R3 of FIG. 5C according to one or more embodiments of the disclosure. FIG. 6D is an enlarged cross-sectional view illustrating section R4 of FIG. 5D according to one or more embodiments of the disclosure.

Referring to FIGS. 4 and 5A to 5D, the image sensor may include a photoelectric conversion layer 10, a first wiring layer 20a, and an optical transmission layer 30. The photoelectric conversion layer 10 may include a first substrate 100, a pixel isolation pattern 150, and a first device isolation pattern 103.

The first substrate 100 may have a first surface 100a and a second surface 100b that are opposite to each other. The first substrate 100 may receive light incident on the second surface 100b thereof. The first wiring layer 20a may be disposed on the first surface 100a of the first substrate 100, and the optical transmission layer 30 may be disposed on the second surface 100b of the first substrate 100. The first substrate 100 may be a silicon substrate or a silicon-on-insulator (SOI) substrate. The semiconductor substrate may be, for example, a silicon substrate, a germanium substrate, or a silicon-germanium substrate. The first substrate 100 may include first conductivity type impurities. For example, the first conductivity type impurities may include p-type impurities, such as one or more of aluminum (Al), boron (B), indium (In), and gallium (Ga).

The first substrate 100 may include a plurality of pixels PX defined by the pixel isolation pattern 150. The plurality of pixels PX may be arranged in a matrix shape along a first direction D1 and a second direction D2 that intersect each other. The first substrate 100 may include photoelectric conversion regions 110. The photoelectric conversion regions 110 may be provided on corresponding pixels in the first substrate 100. The photoelectric conversion regions 110 may have their functions and roles the same as those of the photodiodes PD1 and PD2 of FIG. 1. The photoelectric conversion regions 110 may be zones where second conductivity type impurities are doped into the first substrate 100. The second conductivity type impurities may have a conductivity type opposite to that of the first conductivity type impurities. The second conductivity type impurities may include n-type impurities, such as one or more of phosphorus, arsenic, bismuth, and antimony.

Each of the photoelectric conversion regions 110 may include a first section adjacent to the first surface 100a and a second section adjacent to the second surface 100b. The photoelectric conversion region 110 may have a difference in impurity concentration between the first section and the second section. Therefore, the photoelectric conversion region 110 may have a potential slope between the first and second surfaces 100a and 100b of the first substrate 100. The first substrate 100 and the photoelectric conversion region 110 may constitute a photodiode. For example, a photodiode may be constituted by a p-n junction between the first substrate 100 of the first conductivity type and the photoelectric conversion region 110 of the second conductivity type. The photoelectric conversion region 110 which constitutes the photodiode may generate and accumulate photocharges in proportion to intensity of incident light.

The pixel isolation pattern 150 may be provided in the first substrate 100 and may define the plurality of pixels PX. For example, the pixel isolation pattern 150 may be provided between the plurality of pixels PX of the first substrate 100. In a plan view, the pixel isolation pattern 150 may have a grid structure. In a plan view, the pixel isolation pattern 150 may completely surround each of the plurality of pixels PX. The pixel isolation pattern 150 may be provided in a first trench TR1. The first trench TR1 may be recessed from the first surface 100a of the first substrate 100. The pixel isolation pattern 150 may extend from the first surface 100a toward the second surface 100b of the first substrate 100. The pixel isolation pattern 150 may be a deep trench isolation (DTI) layer. The pixel isolation pattern 150 may penetrate the first substrate 100. The pixel isolation pattern 150 may have a vertical height substantially the same as a vertical thickness of the first substrate 100. For example, the pixel isolation pattern 150 may have a width which gradually decreases in a direction from the second surface 100b from the first surface 100a of the first substrate 100.

The pixel isolation pattern 150 may include a first isolation pattern 151, a second isolation pattern 153, and a capping pattern 155. The first isolation pattern 151 may be provided along a sidewall of the first trench TR1. The first isolation pattern 151 may include, for example, one or more of a silicon-based dielectric material (e.g., silicon nitride, silicon oxide, and/or silicon oxynitride) and a high-k dielectric material (e.g., hafnium oxide and/or aluminum oxide). Alternatively, the first isolation pattern 151 may include a plurality of layers, and the plurality of layers may include different materials from each other. The first isolation pattern 151 may have a refractive index less than that of the first substrate 100. Accordingly, crosstalk may be prevented or reduced between the plurality of pixels PX of the first substrate 100.

The second isolation pattern 153 may be provided in the first isolation pattern 151. For example, the second isolation pattern 153 may have a sidewall surrounded or at least partially surrounded by the first isolation pattern 151. The first isolation pattern 151 may be interposed between the second isolation pattern 153 and the first substrate 100. The first isolation pattern 151 may separate the second isolation pattern 153 from the first substrate 100. Therefore, when the image sensor operates, the second isolation pattern 153 may be electrically separated from the first substrate 100. The second isolation pattern 153 may include a crystalline semiconductor material, for example, polysilicon. For example, the second isolation pattern 153 may further include dopants, which dopants may include first conductivity type impurities or second conductivity type impurities. For example, the second isolation pattern 153 may include doped polysilicon. For another example, the second isolation pattern 153 may include undoped crystalline semiconductor material. For example, the second isolation pattern 153 may include undoped polysilicon. The term "undoped" may refer to an implementation where no doping process is intentionally performed. The dopants may include n-type dopants or p-type dopants.

The capping pattern 155 may be provided on a bottom surface of the second isolation pattern 153. The capping pattern 155 may be disposed adjacent to the first surface 100a of the first substrate 100. The capping pattern 155 may have a bottom surface coplanar with the first surface 100a of the first substrate 100. The capping pattern 155 may include a non-conductive material. For example, the capping pattern 155 may include one or more of a silicon-based dielectric material (e.g., silicon nitride, silicon oxide, and/or silicon oxynitride) and a high-k dielectric material (e.g., hafnium oxide and/or aluminum oxide). Therefore, the pixel isolation pattern 150 may prevent photo-charges generated from light incident on each pixel of the plurality of pixels PX from drifting into neighboring pixels. For example, the pixel isolation pattern 150 may prevent crosstalk between the plurality of pixels PX.

The first device isolation pattern 103 may be provided in the first substrate 100. For example, the first device isolation pattern 103 may be provided in a second trench TR2. The second trench TR2 may be recessed from the first surface 100a of the first substrate 100. The first device isolation pattern 103 may be a shallow trench isolation (STI) layer. The first device isolation pattern 103 may have a top surface provided in the first substrate 100. The first device isolation pattern 103 may have a width that gradually decreases in a direction from the first surface 100a toward the second surface 100b of the first substrate 100. The top surface of the first device isolation pattern 103 may be vertically spaced apart from the photoelectric conversion regions 110. The pixel isolation pattern 150 may overlap or at least partially overlap a portion of the first device isolation pattern 103. At least a portion of the first device isolation pattern 103 may be disposed on and contact a sidewall of the pixel isolation pattern 150. A stepwise structure may be constituted by the top surface and sidewall of the first device isolation pattern 103 and the sidewall of the pixel isolation pattern 150.

The pixel isolation pattern 150 may penetrate the first device isolation pattern 103. The first device isolation pattern 103 may have a depth less than that of the pixel isolation pattern 150. The first device isolation pattern 103 may include a silicon-based dielectric material. For example, the first device isolation pattern 103 may include one or more of silicon oxide, silicon nitride, and silicon oxynitride. For another example, the first device isolation pattern 103 may include a plurality of layers, which layers may include different materials from each other.

The first substrate 100 may be provided on its first surface 100a with the transfer transistor TX, the source follower transistor SX, the reset transistor RX, the dual conversion transistor DCX, and the selection transistor AX described above with reference to FIG. 1. The transfer transistor TX may be electrically connected to the photoelectric conversion region 110. The transfer transistor TX may include a transfer gate TG and a floating diffusion region FD. The transfer gate TG may include a first portion TGa provided on the first surface 100a of the first substrate 100 and a second portion TGb that extends from the first portion TGa into the first substrate 100. A maximum width in a third direction D3 of the first portion TGa may be greater than a maximum width in the third direction D3 of the second portion TGb.

A gate dielectric pattern GI may be interposed between the transfer gate TG and the first substrate 100. The gate dielectric pattern GI may extend along a top surface and sidewalls of the second portions TGb. The floating diffusion region FD may be adjacent to one side of the transfer gate TG. The floating diffusion region FD may have the second conductivity type (e.g., n-type) opposite to that of the first substrate 100.

The first substrate 100 may be provided with gate electrodes on the first surface 100a thereof. The gate electrode may be one of the selection gate SEL, the source follower gate SF, the dual conversion gate DCG, and the reset gate RG described with reference to FIG. 1.

A gate spacer GS may be disposed on a sidewall of the transfer gate TG. The gate spacer GS may include, for example, silicon nitride, silicon carbonitride, or silicon oxynitride.

The first wiring layer 20a may include upper dielectric layers 221 and 222, upper wiring lines 211 and 212, upper vias 216, and upper contacts 201. The upper dielectric layers 221 and 222 may include a first upper dielectric layer 221 and a second upper dielectric layer 222. The first upper dielectric layer 221 may cover or at least partially cover the first surface 100a of the first substrate 100. The second upper dielectric layer 222 may be provided on a bottom surface of the first upper dielectric layer 221. The first and second upper dielectric layers 221 and 222 may include a non-conductive material. For example, the first and second upper dielectric layers 221 and 222 may include a silicon-based dielectric material, such as one or more of silicon oxide, silicon nitride, and silicon oxynitride.

The upper wiring lines 211 and 212 may be provided in the second upper dielectric layer 222. The upper wiring lines 211 and 212 may be connected through the upper contacts 201 to one of the transfer gate TG and the floating diffusion region FD. Alternately, the upper wiring lines 211 and 212 may be electrically connected through the upper contacts 201 to gate electrodes.

The upper contacts 201 may penetrate the first upper dielectric layer 221. The first wiring layer 20a may signally process electrical signals converted in the photoelectric conversion regions 110. An arrangement of the upper wiring lines 211 and 212 may not depend on that of the photoelectric conversion regions 110, and may be variously changed without being limited to that shown. The upper wiring lines 211 and 212 may include first upper wiring lines 211 and second upper wiring lines 212. The first upper wiring lines 211 may be provided in an upper portion of the second upper dielectric layer 222. The second upper wiring lines 212 may be provided in a lower portion of the second upper dielectric layer 222. The upper vias 216 may be provided in the second upper dielectric layer 222. The upper vias 216 may electrically connect the first and second upper wiring lines 211 and 212 to each other. The first and second upper wiring lines 211 and 212, the upper vias 216, and the upper contacts 201 may include a metallic material. For example, the first and second upper wiring lines 211 and 212, the upper vias 216, and the upper contacts 201 may include copper (Cu).

The plurality of pixels PX may include at least one first pixel PX1, at least one second pixel PX2, at least one third pixel PX3, at least one first autofocus (AF) pixel AF1, and at least one second autofocus pixel AF2. The description below may be provided from various perspectives, such as, for example, from the perspective of a plurality of first pixels PX1, a single first pixel PX1, at least one first pixel PX1, etc., and such shifts in perspective should not be construed as limiting the description to the corresponding perspective. The first substrate 100 of the image sensor may include a first pixel group G1, a second pixel group G2, a third pixel group G3, and an autofocus pixel group AG. The first pixel group G1 may include a plurality of first pixels PX1. The second pixel group G2 may include a plurality of second pixels PX2. The third pixel group G3 may include a plurality of third pixels PX3. The autofocus pixel group AG may include a first autofocus pixel AF1 and a second autofocus pixel AF2. The autofocus pixel group AG may detect a phase. For example, a focus of a captured image may be corrected by comparing a difference in phase of an image sensed in each of the first autofocus pixel AF1 and the second autofocus pixel AF2. Accordingly, the image sensor may perform an autofocus function.

The autofocus pixel group AG may be disposed between the first pixel group G1 and the second pixel group G2. At least one of the plurality of first pixels PX1 in the first pixel group G1 may be adjacent in the third direction D3 to at least one of the plurality of second pixels PX2 in the second pixel group G2. The autofocus pixel group AG may be disposed between the first pixel group G1 and the third pixel group G3. At least one of the plurality of first pixels PX1 in the first pixel group G1 may be adjacent in the third direction D3 to at least one of the plurality of third pixels PX3 in the third pixel group G3.

For example, the image sensor may have a 3×3 Nona pixel arrangement. The autofocus pixel group AG may have 2×1 arranged pixels. Each of the first, second, and third pixel groups G1, G2, and G3 may have eight pixels except for one pixel arranged in a 3×3 arrangement.

The optical transmission layer 30 may include a first color filter CF1, a second color filter CF2, a third color filter CF3, and a microlens section 306. The optical transmission layer 30 may condense and filter externally incident light, and the photoelectric conversion layer 10 may receive the focused and filtered light.

For example, the first, second, and third color filters CF1, CF2, and CF3 may be provided on the second surface 100b of the first substrate 100. The first color filter CF1 may be provided on the first pixel group G1 and the autofocus pixel group AG. For example, the first color filter CF1 may cover or at least partially cover the plurality of first pixels PX1, the first autofocus pixel AF1, and the second autofocus pixel AF2. The second color filter CF2 may be provided on the second pixel group G2. The second color filter CF2 may cover or at least partially cover the plurality of second pixels PX2. The third color filter CF3 may be provided on the third pixel group G3. The third color filter CF3 may cover or at least partially cover the plurality of third pixels PX3. The first, second, and third color filters CF1, CF2, and CF3 may be disposed on a backside dielectric layer 132 which will be described below.

Each of the first, second, and third color filters CF1, CF2, and CF3 may include a primary color filter. The first, second, and third color filters CF1, CF2, and CF3 may include their color filters different from each other. For example, the first color filter CF1 may include a green color filter, the second color filter CF2 may include a red color filter, and the third color filter CF3 may include a blue color filter. The first, second, and third color filters may be arranged in a Bayer pattern format. For another example, the first, second, and third color filters CF1, CF2, and CF3 may include different colors such as cyan, magenta, or yellow.

The microlens section 306 may be provided on the color filters CF1, CF2, and CF3. The microlens section 306 may include a flat portion 305 and first and second microlenses 307a and 307b on the flat portion 305. The microlens section 306 may be configured such that no boundary is present between the flat portion 305 and the first and second microlenses 307a and 307b, and such that the flat portion 305 and the first and second microlenses 307a and 307b are connected into a single unitary body.

The first microlens 307a may be provided on each of the first pixel group G1, the second pixel group G2, and the third pixel group G3. The first microlenses 307a may be correspondingly provided on the plurality of first pixels PX1, the plurality of second pixels PX2, and the plurality of third pixels PX3. The second microlens 307b may be provided on the autofocus pixel group AG. The second microlens 307b may be provided on the first autofocus pixel AF1 and the second autofocus pixel AF2. The second microlens 307b may have a width in the third direction D3 greater than a width in the third direction D3 of the first microlens 307a. The second microlens 307b may have a curvature less than that of the first microlens 307a.

The image sensor may further include a light-shield pattern 350. The light-shield pattern 350 may have a grid structure in a plan view. In a plan view, the light-shield pattern 350 may completely surround or at least partially surround each of the first, second, and third pixels PX1, PX2, and PX3. In a plan view, the light-shield pattern 350 may completely surround the autofocus pixel group AG. The light-shield pattern 350 may vertically overlap or at least partially vertically overlap the pixel isolation pattern 150, but may be absent between the first autofocus pixel AF1 and the second autofocus pixel AF2. The light-shield pattern 350 may vertically overlap or at least partially vertically overlap the pixel isolation pattern 150 on a central portion of the first substrate 100, and displacement of the light-shield pattern 350 with respect to the pixel isolation pattern 150 may become increasingly larger in a direction toward an edge of the first substrate 100. The light-shield pattern 350 may optically separate the first, second, and third color filters CF1, CF2, and CF3 from each other. The light-shield pattern 350 may be disposed on a backside dielectric layer 132 which will be described below. The light-shield pattern 350 may include metal, metal nitride, or a low-refractive material. For example, the light-shield pattern 350 may include titanium nitride. The low-refractive material may include a polymer and nano-particles (e.g., silica) in the polymer, and may have dielectric properties.

The image sensor may further include a backside dielectric layer 132. The backside dielectric layer 132 may be interposed between the first substrate 100 and the color filters CF1, CF2, and CF3. The backside dielectric layer 132 may include a bottom antireflective coating (BARC) layer. The backside dielectric layer 132 may include a plurality of layers. For example, the backside dielectric layer 132 may include a fixed charge layer, a buried dielectric layer, a silicon nitride layer, and a capping layer that are stacked on the second surface 100b of the first substrate 100. The fixed charge layer may include metal oxide, such as stacked aluminum oxide and hafnium oxide. The buried dielectric layer may include tetraethylorthosilicate (TEOS) or silicon oxide. The capping layer may include metal oxide, such as hafnium oxide. The backside dielectric layer 132 may exclude at least one selected from the fixed charge layer, the buried dielectric layer, the silicon nitride layer, and the capping layer.

Referring back to FIG. 3, the image sensor may further include a logic chip 2000. The logic chip 2000 may be provided below the sensor chip 1000. The logic chip 2000 may include a lower substrate 40 and a lower wiring layer 45. The lower wiring layer 45 may be interposed between the first wiring layer 20a and the lower substrate 40.

On the optical black area OB, the first substrate 100 may be provided thereon with a first connection structure 50, a first pad terminal 81, and a bulk color filter 90. The first connection structure 50 may include a first light-shield pattern 51, a first dielectric pattern 53, and a first capping layer 55. The first light-shield pattern 51 may be provided on the second surface 100b of the first substrate 100. The first light-shield pattern 51 may conformally cover inner sidewalls of fourth and fifth trenches TR4 and TR5. The first light-shield pattern 51 may penetrate the photoelectric conversion layer 10, the first wiring layer 20a, and the lower wiring layer 45 to electrically connect the photoelectric conversion layer 10 to the lower wiring layer 45. For example, the first light-shield pattern 51 may contact wiring lines in the first wiring layer 20a and with the pixel isolation pattern 150 in the photoelectric conversion layer 10. Therefore, the first connection structure 50 may be electrically connected to the wiring lines in the first wiring layer 20a. The first light-shield pattern 51 may block incidence of light into the optical black area OB.

The fourth trench TR4 may be provided therein with the first pad terminal 81 that fills an unoccupied portion of the fourth trench TR4. The first pad terminal 81 may include a metallic material, such as aluminum. The first pad terminal 81 may be connected to the pixel isolation pattern 150 or the second isolation pattern 153. Therefore, a negative voltage may be applied through the first pad terminal 81 to the pixel isolation pattern 150.

The first light-shield pattern 51 may be provided thereon with the first dielectric pattern 53 that fills an unoccupied portion of the fifth trench TR5. The first dielectric pattern 53 may penetrate the photoelectric conversion layer 10 and the first wiring layer 20a. The first capping layer 55 may be provided on the first dielectric pattern 53. The first capping layer 55 may include the same material as that of the capping pattern 155.

The bulk color filter 90 may be provided on the first pad terminal 81, the first light-shield pattern 51, and the first capping layer 55. The bulk color filter 90 may cover or at least partially cover the first pad terminal 81, the first light-shield pattern 51, and the first capping layer 55. A first protection layer 71 may be provided on and cover or at least partially cover the bulk color filter 90.

A photoelectric conversion region 110' and a dummy region 111 may be provided on the optical black area OB of the first substrate 100. The photoelectric conversion region 110' may be doped with impurities of the second conductivity type (e.g., n-type) different from the first conductivity type. The photoelectric conversion region 110' may have a similar structure to that of the photoelectric conversion region 110 described in FIGS. 5A to 5D, but may not generate electrical signals from received light. The dummy region 111 may not be doped with impurities. The photoelectric conversion region 110' and the dummy region 111 may generate signals that are used as information to eliminate subsequent process noise.

On the pad area PAD, the first substrate 100 may be provided thereon with a second connection structure 60, a second pad terminal 83, and a second protection layer 73. The second connection structure 60 may include a second light-shield pattern 61, a second dielectric pattern 63, and a second capping layer 65.

The second light-shield pattern 61 may be provided on the second surface 100b of the first substrate 100. For example, the second light-shield pattern 61 may conformally cover inner sidewalls of the sixth and seventh trenches TR6 and TR7. The second light-shield pattern 61 may penetrate the photoelectric conversion layer 10 and a portion of the first wiring layer 20a. For example, the second light-shield pattern 61 may be in contact with wiring lines 231 and 232 in the lower wiring layer 45. The second light-shield pattern 61 may include a metallic material, such as tungsten.

The second pad terminal 83 may be provided in the sixth trench TR6. The second light-shield pattern 61 may be provided thereon with the second pad terminal 83 that fills an unoccupied portion of the sixth trench TR6. The second pad terminal 83 may include a metallic material, such as aluminum. The second pad terminal 83 may serve as an electrical connection path between the image sensor and the outside. The second dielectric pattern 63 may fill an unoccupied portion of the seventh trench TR7. The second dielectric pattern 63 may penetrate the photoelectric conversion layer 10 and the first wiring layer 20a. The second capping layer 65 may be provided on the second dielectric pattern 63. The second capping layer may include the same material as that of the capping pattern 155. The second protection layer 73 may cover or at least partially cover the second capping layer 65 and a portion of the second light-shield pattern 61.

A current applied through the second pad terminal 83 may flow toward the pixel isolation pattern 150 through the second light-shield pattern 61, the wiring lines 231 and 232 in the lower wiring layer 45, and the first light-shield pattern 51. The photoelectric conversion regions 110 and 110' and the dummy region 111 may generate electrical signals, and the electrical signals may be outwardly transmitted through the wiring lines in the first wiring layer the wiring lines 231 and 232 in the lower wiring layer 45, the second light-shield pattern 61, and the second pad terminal 83.

The first, second, and third color filters CF1, CF2, and CF3 will be further described in detail below with reference to FIGS. 6A to 6D.

Referring to FIGS. 4 and 6A, the second pixel group G2 may have a second pixel PX2a adjacent to the second autofocus pixel AF2 in the third direction D3, a second pixel PX2b adjacent to the second autofocus pixel AF2 in the first direction D1, and a second pixel PX2c adjacent to the second autofocus pixel AF2 in the second direction D2.

The first color filter CF1 may include a first protrusion CF1p1 adjacent to the second color filter CF2 in the third direction D3. The first protrusion CF1p1 of the first color filter CF1 may protrude in a direction toward the second pixel PX2a. The first protrusion CF1p1 of the first color filter CF1 may vertically overlap or at least partially vertically overlap the light-shield pattern 350. The second color filter CF2 may include a first protrusion CF2p1 adjacent to the first color filter CF1 in the third direction D3. The first protrusion CF2p1 of the second color filter CF2 may protrude in a direction toward the second autofocus pixel AF2. The first protrusion CF2p1 of the second color filter CF2 may vertically overlap or at least partially vertically overlap the light-shield pattern 350. The flat portion 305 may include an interposition 305p interposed between the first color filter CF1 and the second color filter CF2. The interposition 305p may be contact the light-shield pattern 350.

The first protrusion CF1p1 of the first color filter CF1 may have a first width W1 in the third direction D3. The first protrusion CF2p1 of the second color filter CF2 may have a second width W2 in the third direction D3. The second width W2 may be greater than the first width W1. A first distance DI1 may be a minimum distance between the first color filter CF1 and the second color filter CF2 in the third direction D3. The first distance DI1 may be a minimum distance between the first protrusion CF1p1 of the first color filter CF1 and the first protrusion CF2p1 of the second color filter CF2. The first distance DI1 may be substantially the same as a width in the third direction D3 of the interposition 305p.

Referring to FIG. 6B, the first protrusion CF2p1 of the second color filter CF2 that is closer than the second color filter CF2 (described with reference to FIG. 6A) to the edge of the first substrate 100 (e.g., adjacent to the pad area PAD described with reference to FIG. 2) may have a third width W3. The third width W3 may be greater than the second width W2. For example, the first protrusion CF2p1 of the second color filter CF2 may have a width that increases in the third direction D3. A second distance DI2 may be a minimum distance between the first protrusion CF2p1 of the second color filter CF2 and the first protrusion CF1p1 of the first color filter CF1 that is closer than the first color filter CF1 described with reference to FIG. 6A to the edge of the first substrate 100. The second distance DI2 may be less than the first distance DI1.

Referring to FIG. 6C, the third pixel group G3 may have a third pixel PX3a adjacent to the second autofocus pixel AF2 in the third direction D3, a third pixel PX3b adjacent to the second autofocus pixel AF2 in the first direction D1, and a third pixel PX3c adjacent to the second autofocus pixel AF2 in the second direction D2.

The first color filter CF1 may include a first protrusion CF1p1 adjacent to the third color filter CF3 in the third direction D3. The first protrusion CF1p1 of the first color filter CF1 may protrude in a direction toward the third pixel PX3a. The third color filter CF3 may include a first protrusion CF3p1 adjacent to the first color filter CF1 in the third direction D3. The first protrusion CF3p1 of the third color filter CF3 may protrude in a direction toward the second autofocus pixel AF2. The first protrusion CF3p1 of the third color filter CF3 may vertically overlap or at least partially vertically overlap the light-shield pattern 350.

The first protrusion CF3p1 of the third color filter CF3 may have a fourth width W4 in the third direction D3. The fourth width W4 may be greater than the first width W1. A third distance DI3 may be a minimum distance in the third direction D3 between the first color filter CF1 and the third color filter CF3. The third distance DI3 may be a minimum distance between the first protrusion CF1p1 of the first color filter CF1 and the first protrusion CF3p1 of the third color filter CF3.

Referring to FIG. 6D, the first protrusion CF3p1 of the third color filter CF3 that is closer than the third color filter CF3 (described with reference to FIG. 6C) to the edge of the first substrate 100 may have a fifth width W5. The fifth width W5 may be greater than the fourth width W4. For example, the first protrusion CF3p1 of the third color filter CF3 may have a width that increases in the third direction D3. A fourth distance DI4 may be a minimum distance between the first protrusion CF3$p$1 of the third color filter CF3 and the first protrusion CF1$p$1 of the first color filter CF1 that is closer than the first color filter CF1 described with reference to FIG. 6C to the edge of the first substrate 100. The fourth distance DI4 may be less than the third distance DI3.

For the image sensor including the autofocus pixel group AG, an oblique light ray incident on the image sensor and a structural difference between the first and second microlenses 307$a$ and 307$b$ may induce a relative increase in sensitivity of the second and third pixels PX2 and PX3 adjacent to the autofocus pixel group AG. Accordingly, the image sensor may have an irregular color ratio between regions thereof, which may result in creation of defective images.

According to the disclosure, the second color filter CF2 and the third color filter CF3 may include protrusions that protrude toward the autofocus pixel group AG. For example, as the second and third color filters CF2 and CF3 are formed to have relatively large sizes, sensitivity of the second and third pixels PX2 and PX3 adjacent to the autofocus pixel group AG may be reduced. Accordingly, the image sensor may decrease in irregularity of color ratio between regions thereof.

Moreover, the degree of increase in sensitivity of the second and third pixels PX2 and PX3 adjacent to the autofocus pixel group AG may be relatively more prominent due to the effect of oblique light and the like as positions of the second and third pixels PX2 and PX3 are closer to the edge of the first substrate 100. According to the disclosure, because color filters are formed to include their protrusions each having a width that gradually increases in a direction toward the edge of the first substrate 100, the occurrence of irregularity of color ratio between regions of the image sensor may be effectively reduced. As a result, the image sensor may improve in optical properties.

Figure 7A:
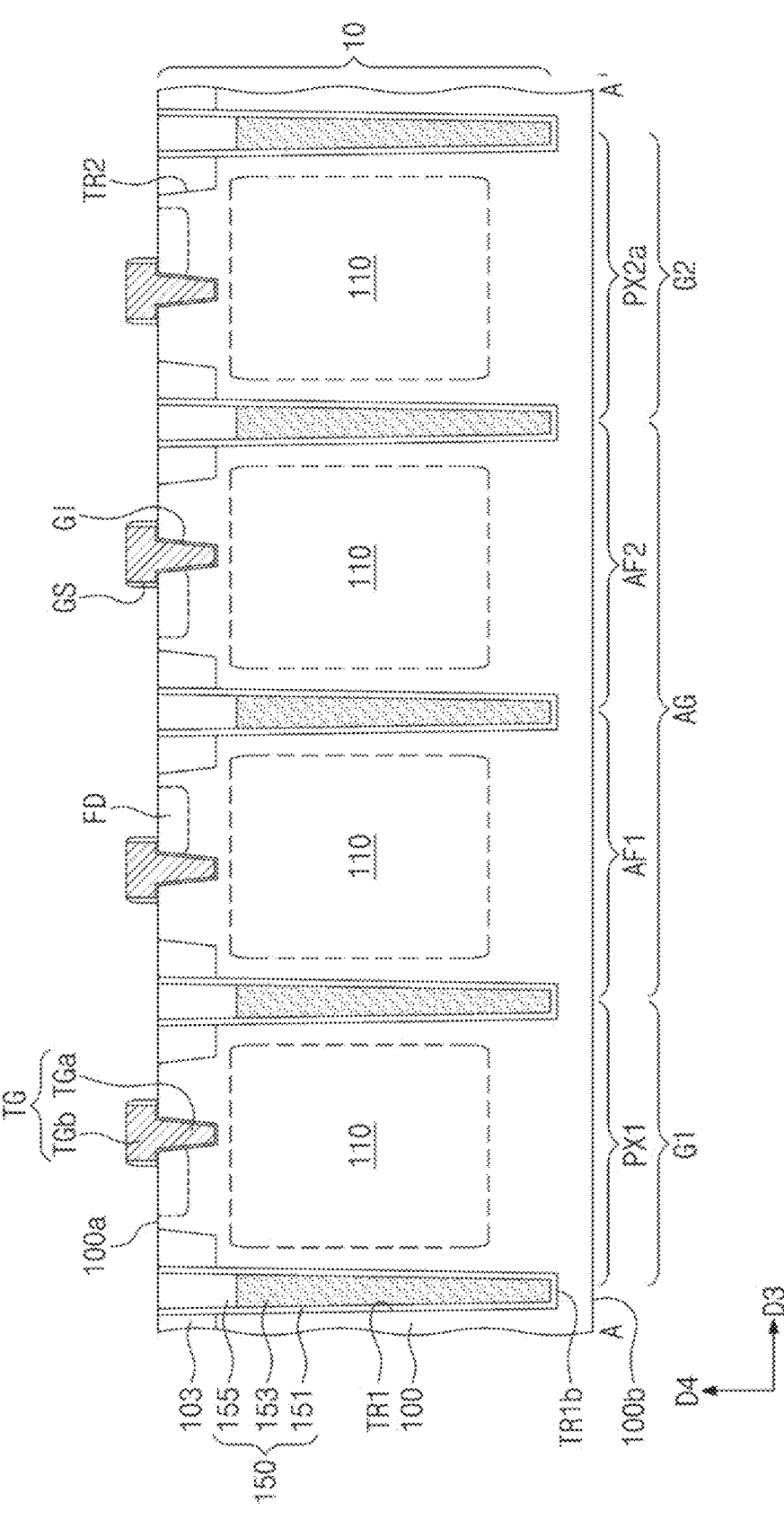
FIGS. 7A, 7B and 7C are cross-sectional views taken along line A-A' of FIG. 4, illustrating a method of fabricating an image sensor according to one or more embodiments of the disclosure.
Figure 7B:
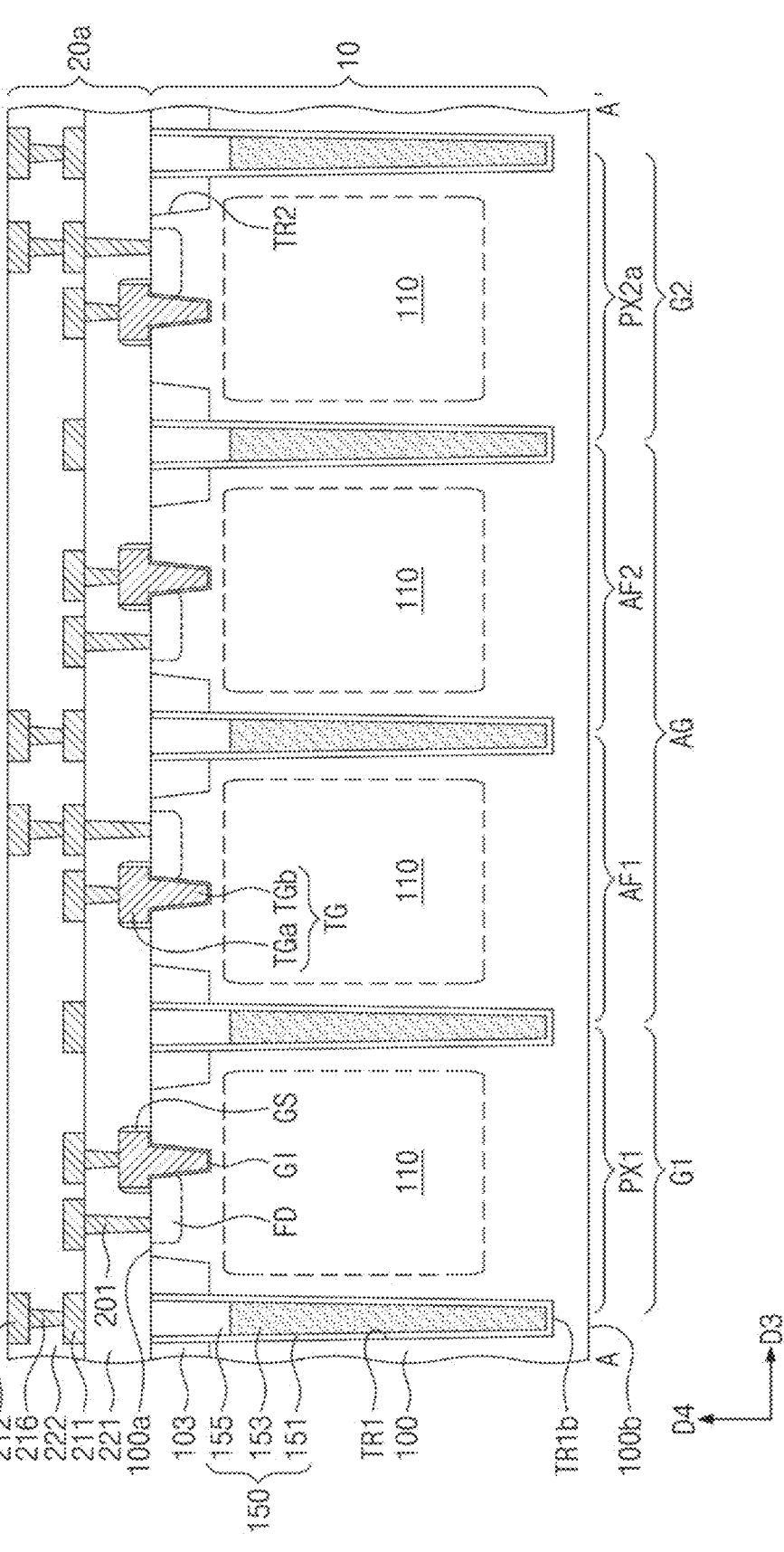
Figure 7C:
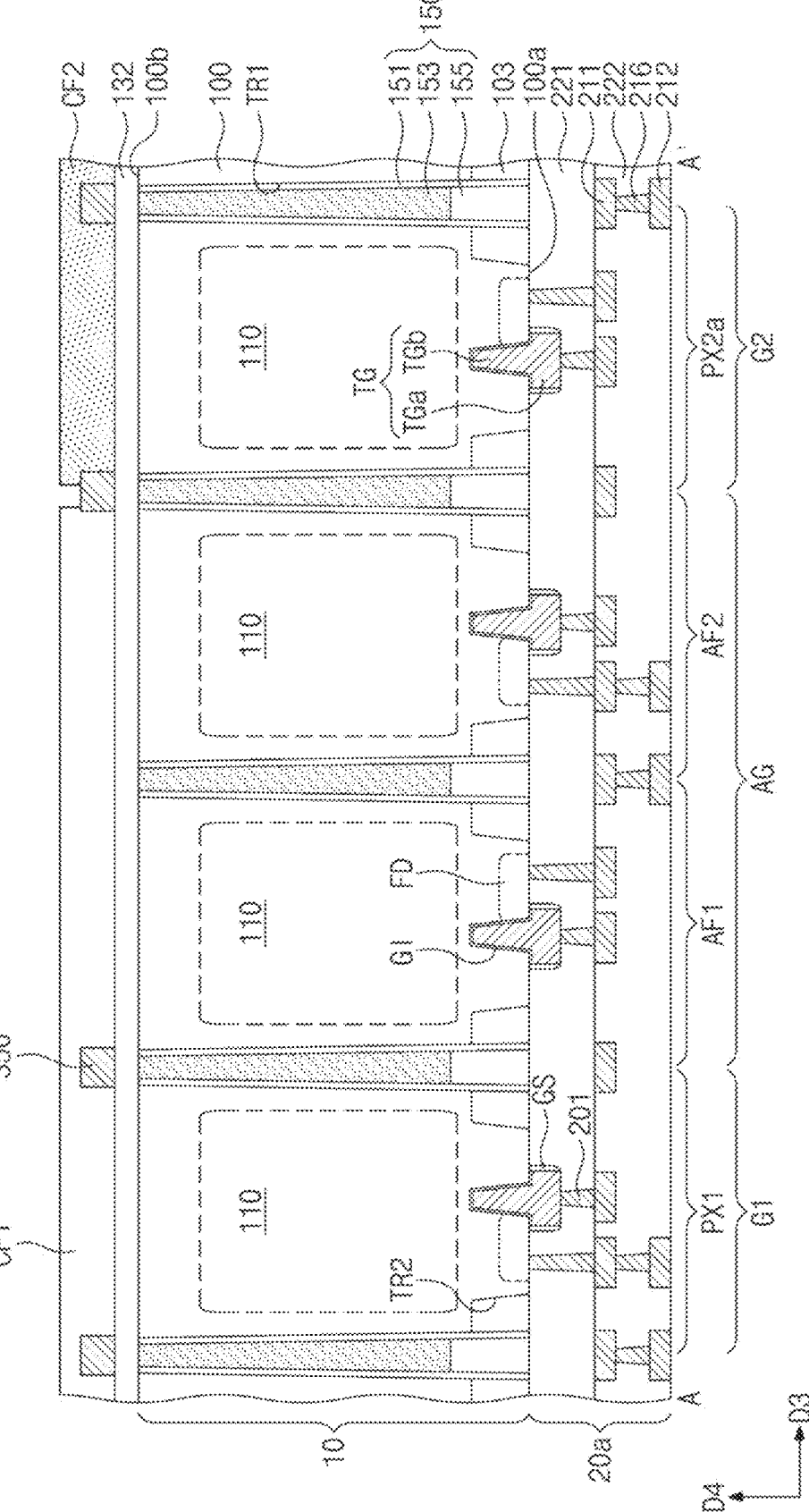

FIGS. 7A, 7B and 7C are cross-sectional views taken along line A-A' of FIG. 4, illustrating a method of fabricating an image sensor according to one or more embodiments of the disclosure.

Referring to FIGS. 4 and 7A, a first substrate 100 may be prepared which has an autofocus pixel group AG and first, second, and third pixel groups G1, G2, and G3. The first substrate 100 may be doped with impurities having a first conductivity type. The first substrate 100 may be implanted with impurities having a second conductivity type to form photoelectric conversion regions 110. A second trench TR2 and a first device isolation pattern 103 may be formed on a first surface 100$a$ of the first substrate 100. A first trench TR1 and a pixel isolation pattern 150 may be formed in the first substrate 100. The first trench TR1 may have a bottom surface TR1$b$ located at a higher level than that of a second surface 100$b$ of the first substrate 100. The pixel isolation pattern 150 may define a plurality of pixels. The plurality of pixels may include first, second, and third pixels PX1, PX2, and PX3, a first autofocus pixel AF1, and a second autofocus pixel AF2. The first surface 100$a$ of the first substrate 100 may be implanted with impurities having the first conductivity type to form floating diffusion regions FD. A transfer gate TG may be formed on the first surface 100$a$ of the first substrate 100.

Referring to FIGS. 4 and 7B, a first upper dielectric layer 221 may be formed on the first surface 100$a$ of the first substrate 100, covering or at least partially covering the transfer gate TG. Upper contacts 201 may be formed to penetrate the first upper dielectric layer 221. First upper wiring lines 211 may be formed on the first upper dielectric layer 221. A second upper dielectric layer 222 may be formed to cover or at least partially cover the first upper wiring lines 211. Upper vias 216 and second upper wiring lines 212 may be formed in the second upper dielectric layer 222.

Referring to FIGS. 4 and 7C, the second surface 100$b$ of the first substrate 100 may undergo a grinding process to thin the first substrate 100. A backside dielectric layer 132, a light-shield pattern 350, and first, second, and third color filters CF1, CF2, and CF3 may be formed on the second surface 100$b$ of the thinned first substrate 100. For example, the first color filter CF1 may include a green color filter, the second color filter CF2 may include a red color filter, and the third color filter CF3 may include a blue color filter.

Referring back to FIGS. 4 and 5A to 5D, a flat portion 305 may be formed on the first, second, and third color filters CF1, CF2, and CF3. A first microlens 307$a$ and a second microlens 307$b$ may be formed on the flat portion 305.

Figure 8:
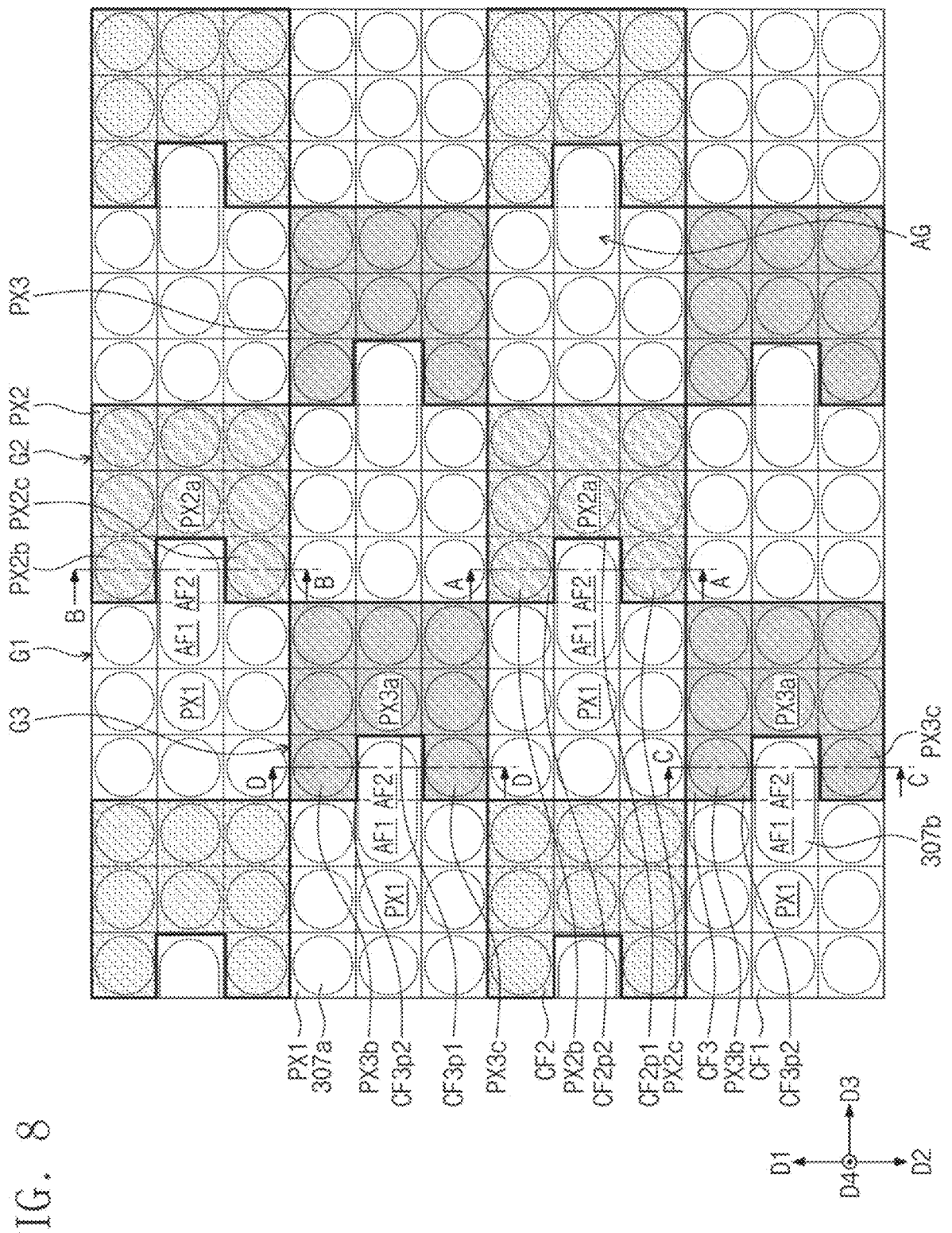
FIG. 8 is an enlarged plan view of M depicted in FIG. 2, illustrating an image sensor according to one or more embodiments of the disclosure.
Figure 9A:
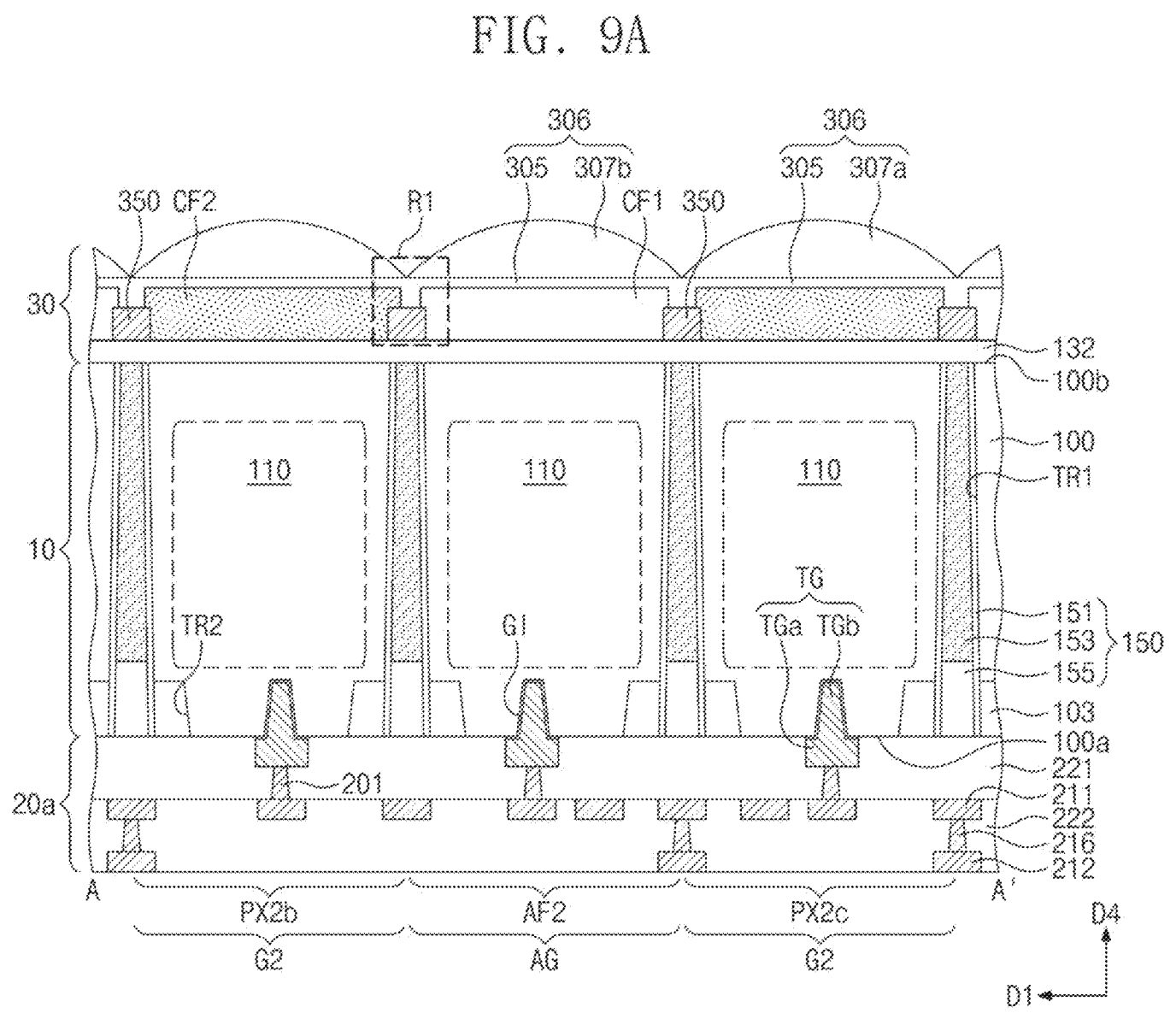
Figure 9B:
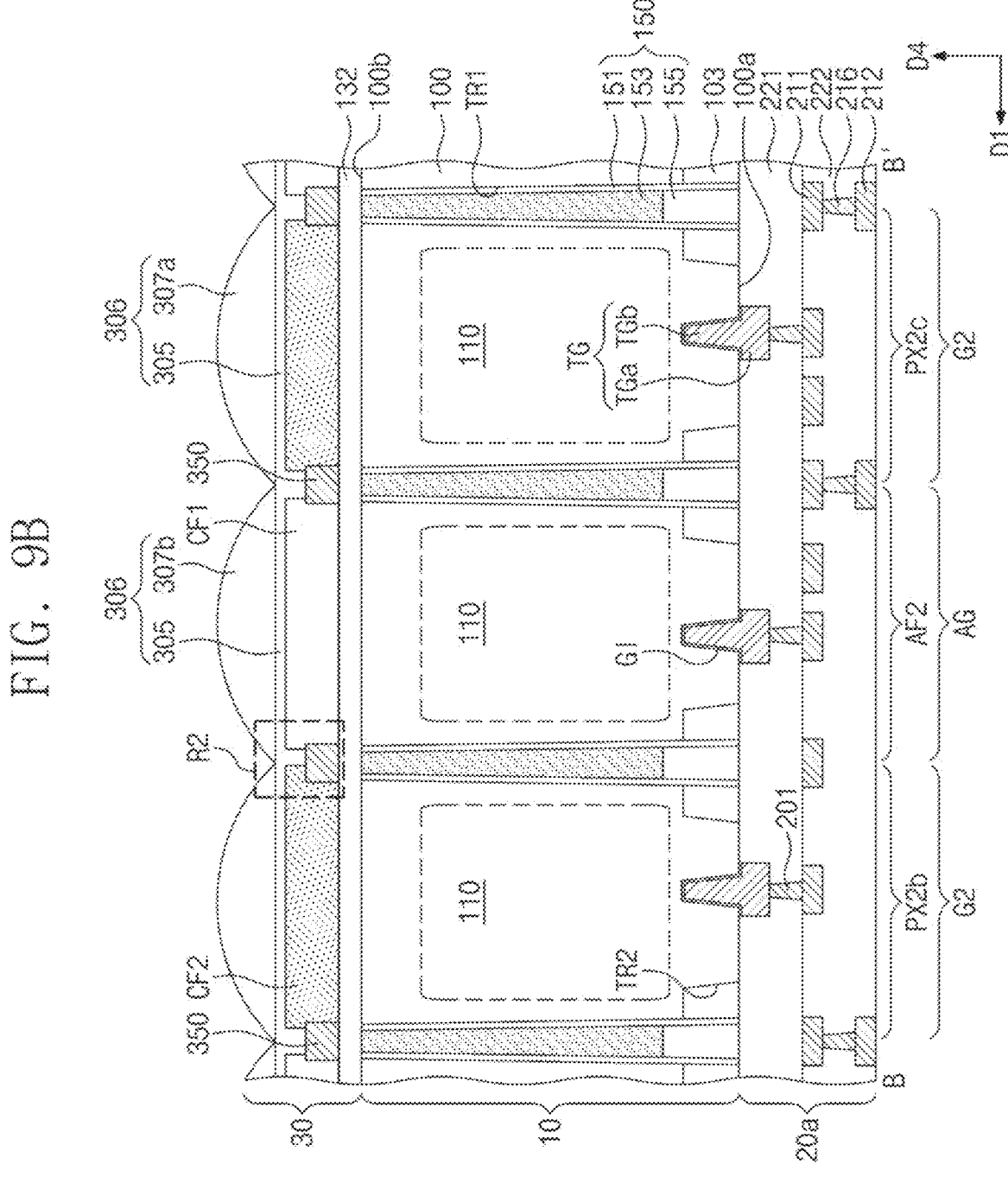
Figure 9C:
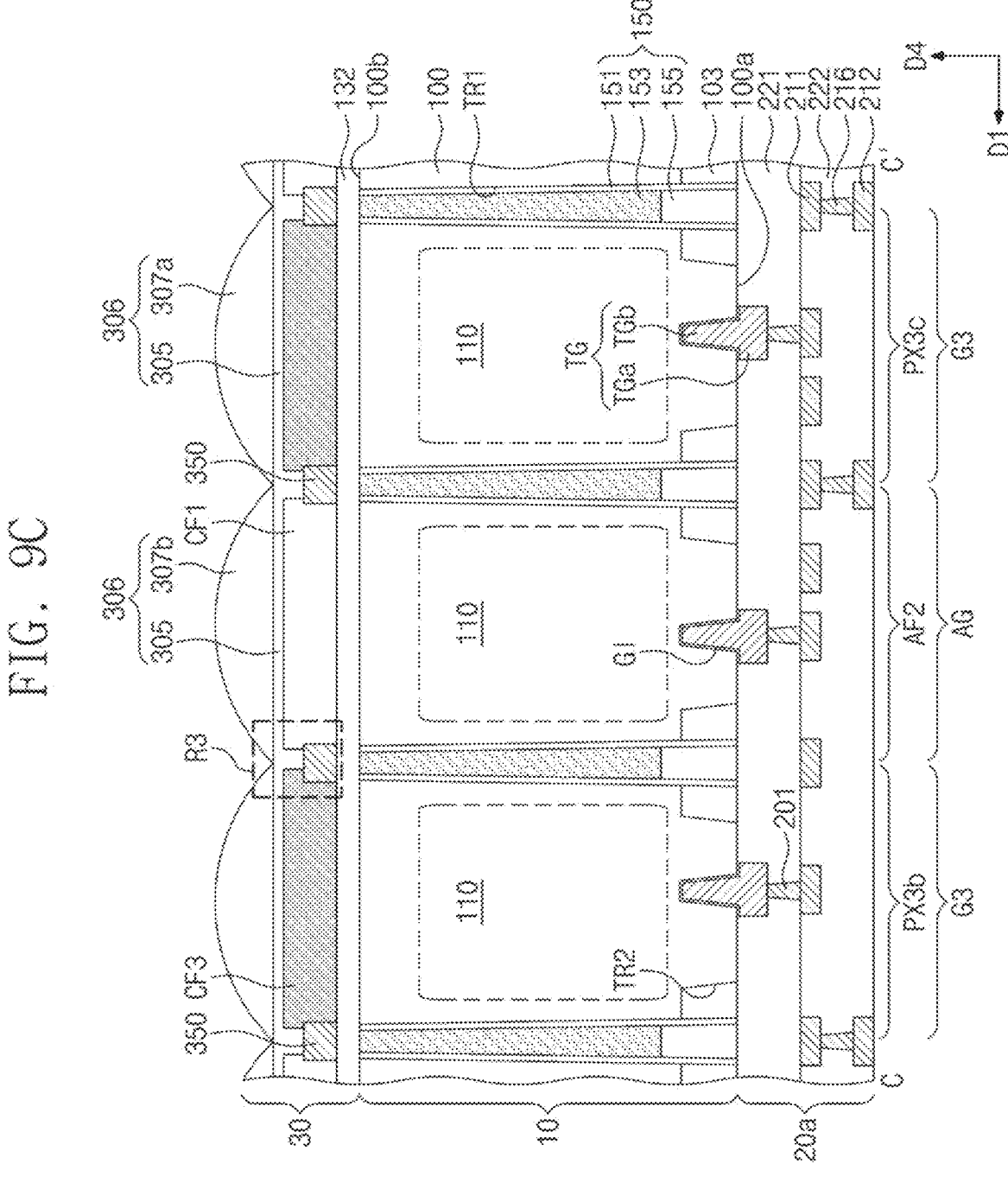
Figure 9D:
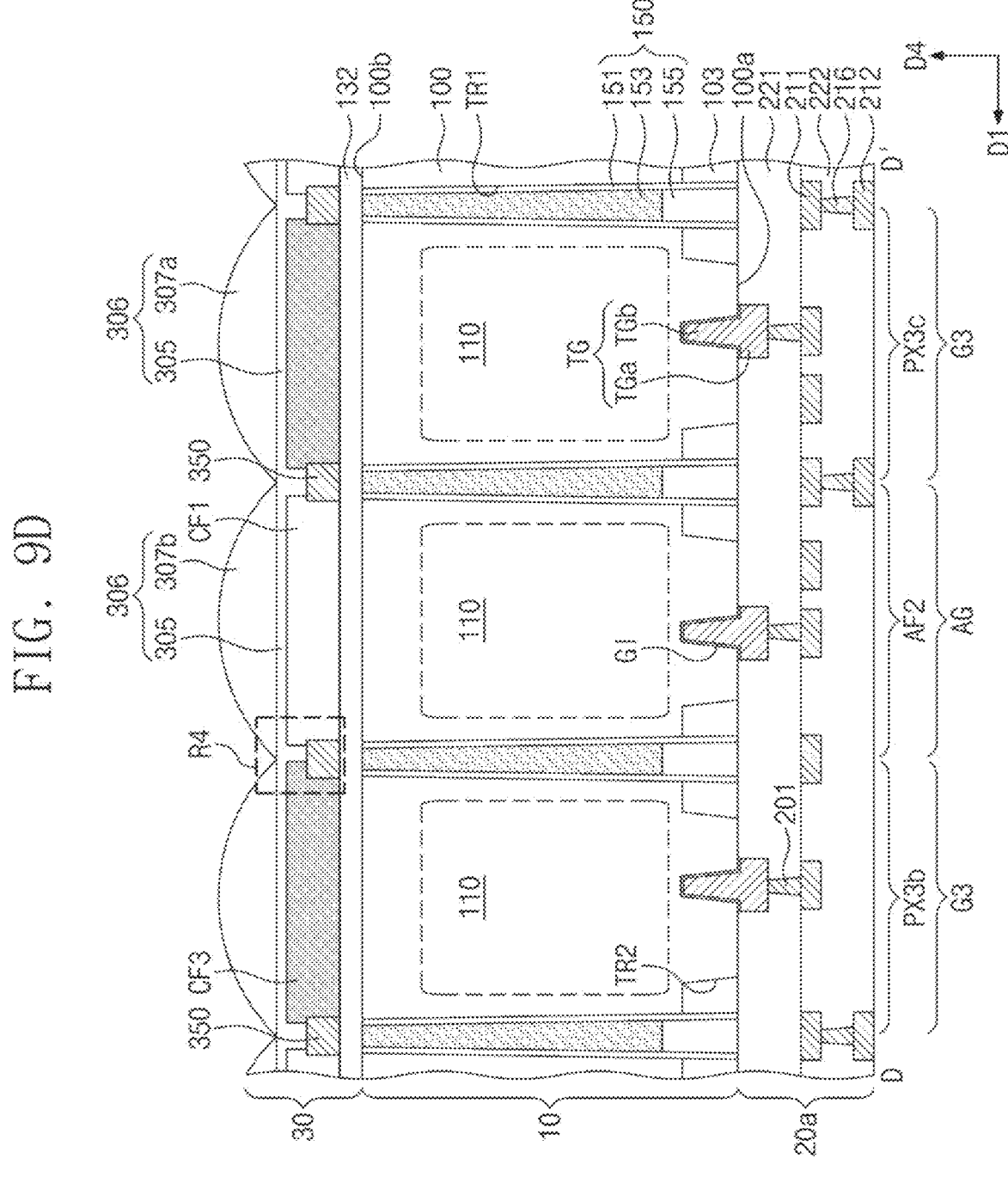
Figure 10A:
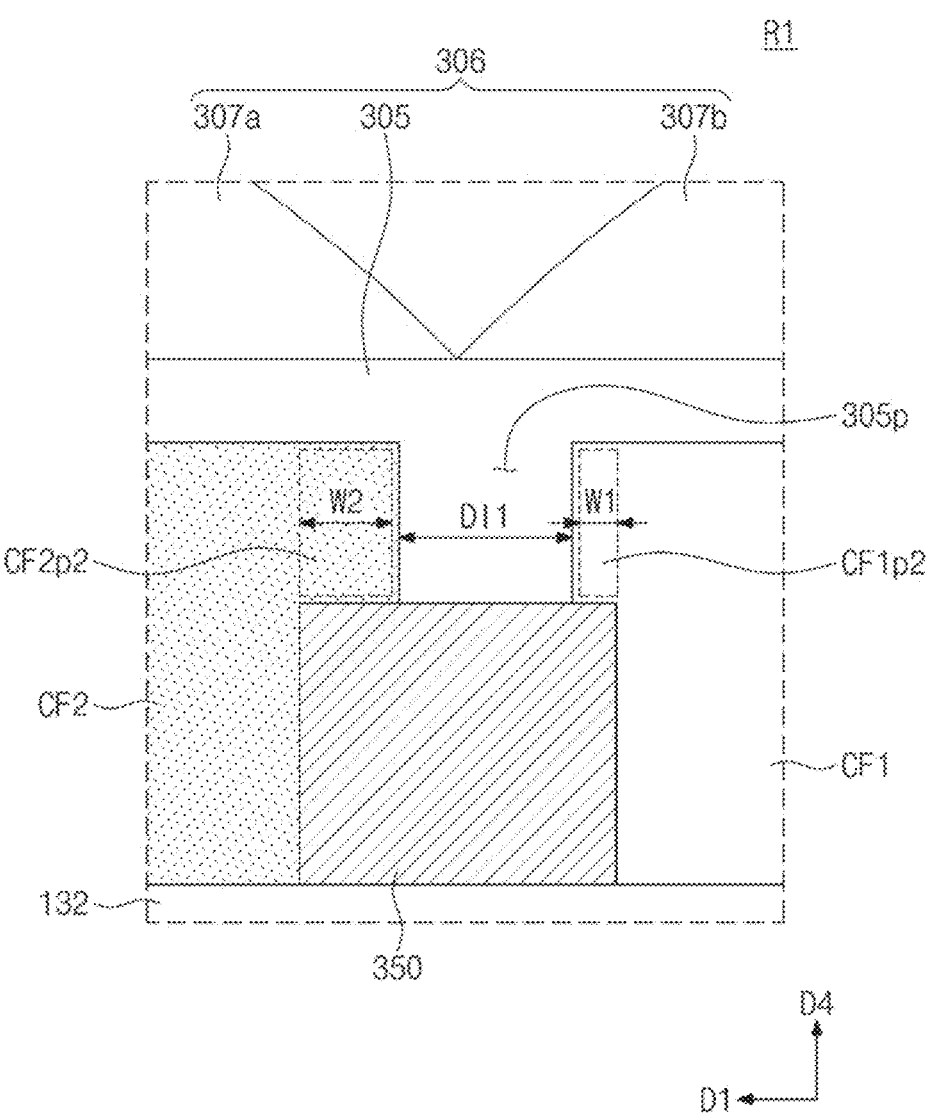
FIG. 10A is an enlarged cross-sectional view illustrating section R1 of FIG. 9A according to one or more embodiments of the disclosure.
Figure 10B:
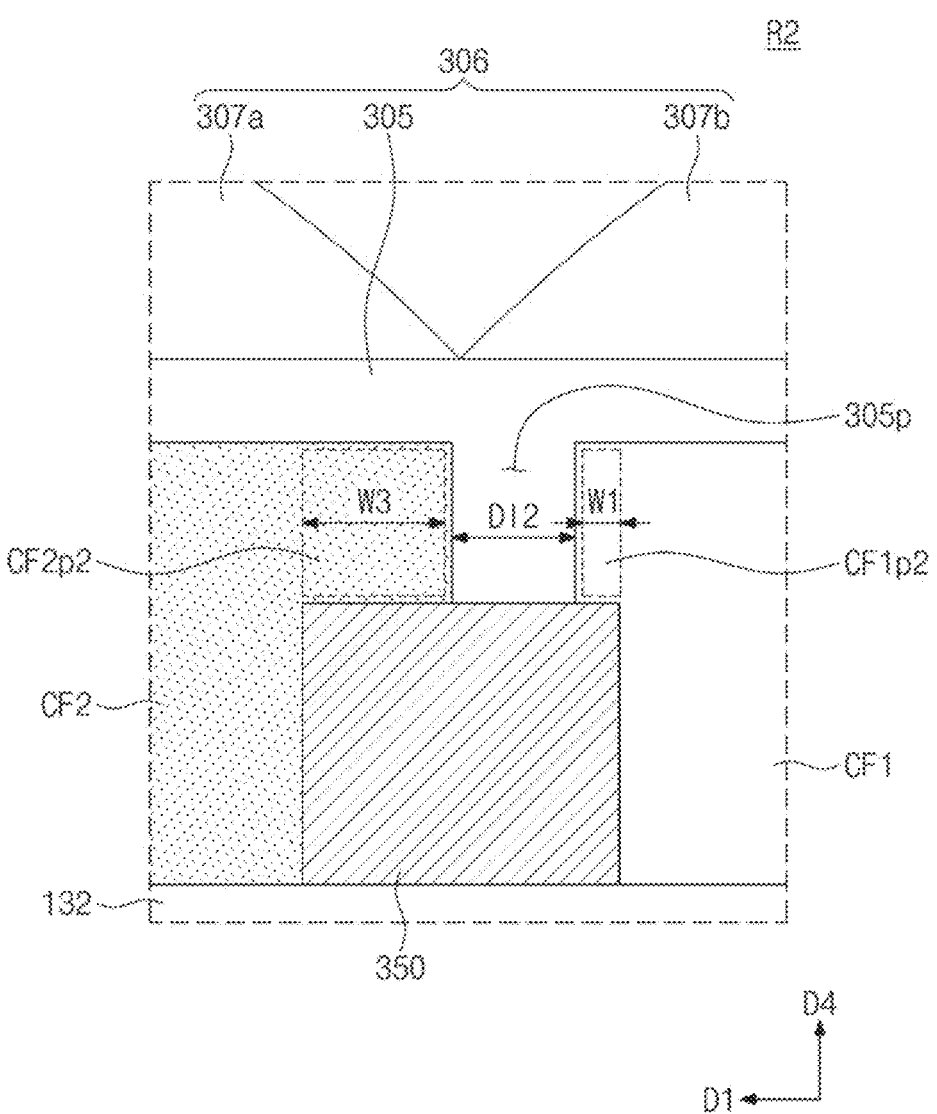
FIG. 10B is an enlarged cross-sectional view illustrating section R2 of FIG. 9B according to one or more embodiments of the disclosure.
Figure 10C:
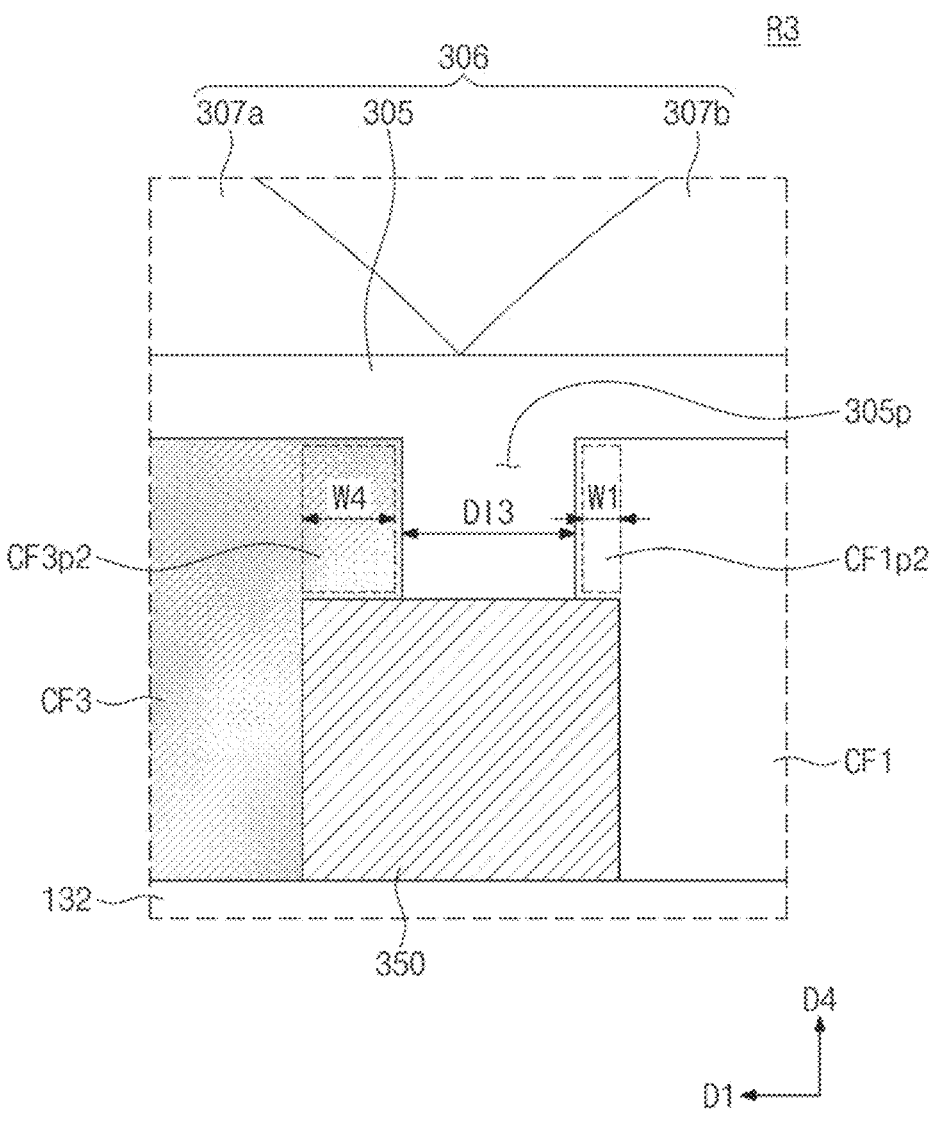
FIG. 10C is an enlarged cross-sectional view illustrating section R3 of FIG. 9C according to one or more embodiments of the disclosure.
Figure 10D:
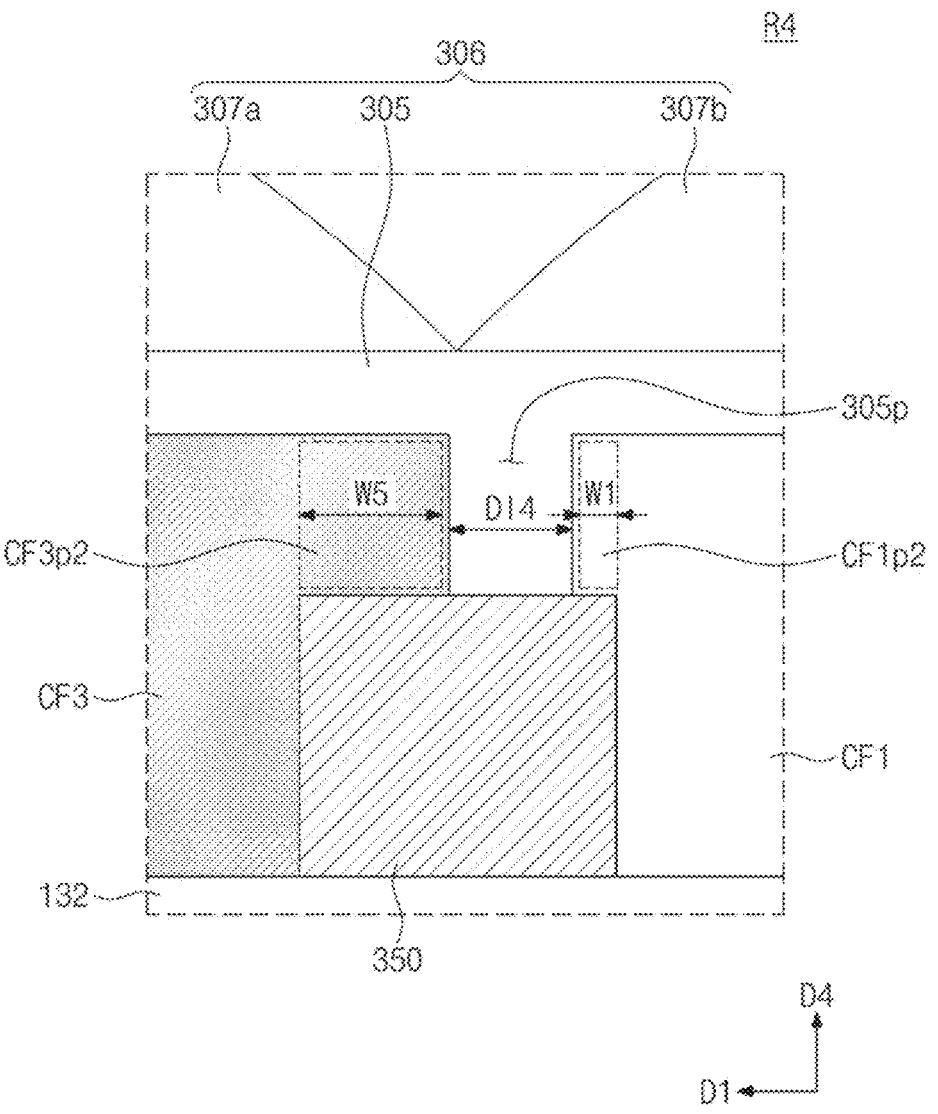
FIG. 10D is an enlarged cross-sectional view illustrating section R4 of FIG. 9D according to one or more embodiments of the disclosure.

FIG. 8 is an enlarged plan view of M depicted in FIG. 2, illustrating an image sensor according to one or more embodiments of the disclosure. FIGS. 9A, 9B, 9C, and 9D are cross-sectional views respectively taken along lines A-A', B-B', C-C', and D-D' of FIG. 8 according to one or more embodiments of the disclosure. FIG. 10A is an enlarged cross-sectional view illustrating section R1 of FIG. 9A according to one or more embodiments of the disclosure. FIG. 10B is an enlarged cross-sectional view illustrating section R2 of FIG. 9B according to one or more embodiments of the disclosure. FIG. 10C is an enlarged cross-sectional view illustrating section R3 of FIG. 9C according to one or more embodiments of the disclosure. FIG. 10D is an enlarged cross-sectional view illustrating section R4 of FIG. 9D according to one or more embodiments of the disclosure. Repeated descriptions of aspects described with reference to FIGS. 4, 5A to 5D, and 6A to 6D may be omitted.

Referring to FIGS. 8 and 9A to 9D, the second color filter CF2 may further include a second protrusion CF2$p$2 that is adjacent to the second autofocus pixel AF2 in the first direction D1. The third color filter CF3 may further include a second protrusion CF3$p$2 adjacent to the second autofocus pixel AF2 in the first direction D1.

Referring to FIG. 10A, the first color filter CF1 may include a second protrusion CF1$p$2 adjacent to the second color filter CF2 in the first direction D1. The second protrusion CF1$p$2 of the first color filter CF1 may protrude in a direction toward the second pixel PX2$b$. The second protrusion CF1$p$2 of the first color filter CF1 may vertically overlap or at least partially vertically overlap the light-shield pattern 350. The second color filter CF2 may include a second protrusion CF2$p$2 adjacent to the first color filter CF1 in the first direction D1. The second protrusion CF2$p$2 of the second color filter CF2 may protrude in a direction toward the second autofocus pixel AF2. The second protrusion CF2$p$2 of the second color filter CF2 may vertically overlap or at least partially vertically overlap the light-shield pattern 350.

The second protrusion CF1$p$2 of the first color filter CF1 may have a first width W1 in the first direction D1. The second protrusion CF2$p$2 of the second color filter CF2 may have a second width W2 in the first direction D1. The second width W2 may be greater than the first width W1. A first distance DI1 may be a minimum distance in the first direction D1 between the first color filter CF1 and the second color filter CF2. The first distance DI1 may be a minimum distance between the second protrusion CF1$p2$ of the first color filter CF1 and the second protrusion CF2$p2$ of the second color filter CF2.

Referring to FIG. 10B, the second protrusion CF2$p2$ of the second color filter CF2 that is closer than the second color filter CF2 (described with reference to FIG. 10A) to the edge of the first substrate 100 (e.g., adjacent to the pad area PAD described with reference to FIG. 2) may have a third width W3. The third width W3 may be greater than the second width W2. For example, the second protrusion CF2$p2$ of the second color filter CF2 may have a width that increases in the first direction D1. A second distance DI2 may be a minimum distance between the second protrusion CF2$p2$ of the second color filter CF2 and the second protrusion CF1$p2$ of the first color filter CF1 that is closer than the first color filter CF1 described with reference to FIG. 10A to the edge of the first substrate 100. The second distance DI2 may be less than the first distance DI1.

Referring to FIG. 10C, the first color filter CF1 may include a second protrusion CF1$p2$ adjacent to the third color filter CF3 in the first direction D1. The second protrusion CF1$p2$ of the first color filter CF1 may protrude in a direction toward the third pixel PX3$b$. The third color filter CF3 may include a second protrusion CF3$p2$ adjacent to the first color filter CF1 in the first direction D1. The second protrusion CF3$p2$ of the third color filter CF3 may protrude in a direction toward the second autofocus pixel AF2. The second protrusion CF3$p2$ of the third color filter CF3 may vertically overlap or at least partially vertically overlap the light-shield pattern 350.

The second protrusion CF3$p2$ of the third color filter CF3 may have a fourth width W4 in the first direction D1. The fourth width W4 may be greater than the first width W1. A third distance DI3 may be a minimum distance in the first direction D1 between the first color filter CF1 and the third color filter CF3. The third distance DI3 may be a minimum distance between the second protrusion CF1$p2$ of the first color filter CF1 and the second protrusion CF3$p2$ of the third color filter CF3.

Referring to FIG. 10D, the second protrusion CF3$p2$ of the third color filter CF3 that is closer than the third color filter CF3 (described with reference to FIG. 10C) to the edge of the first substrate 100 may have a fifth width W5. The fifth width W5 may be greater than the fourth width W4. For example, the second protrusion CF3$p2$ of the third color filter CF3 may have a width that increases in the first direction D1. A fourth distance DI4 may be a minimum distance between the second protrusion CF3$p2$ of the third color filter CF3 and the second protrusion CF1$p2$ of the first color filter CF1 that is closer than the first color filter CF1 described with reference to FIG. 10C to the edge of the first substrate 100. The fourth distance DI4 may be less than the third distance DI3.

According to the disclosure, based on design of the image senor and/or asymmetry of color ratio between regions of the image sensor, the second and third color filters CF2 and CF3 may be formed to selectively include their protrusions on locations adjacent to the autofocus pixel group AG.

Figure 11:
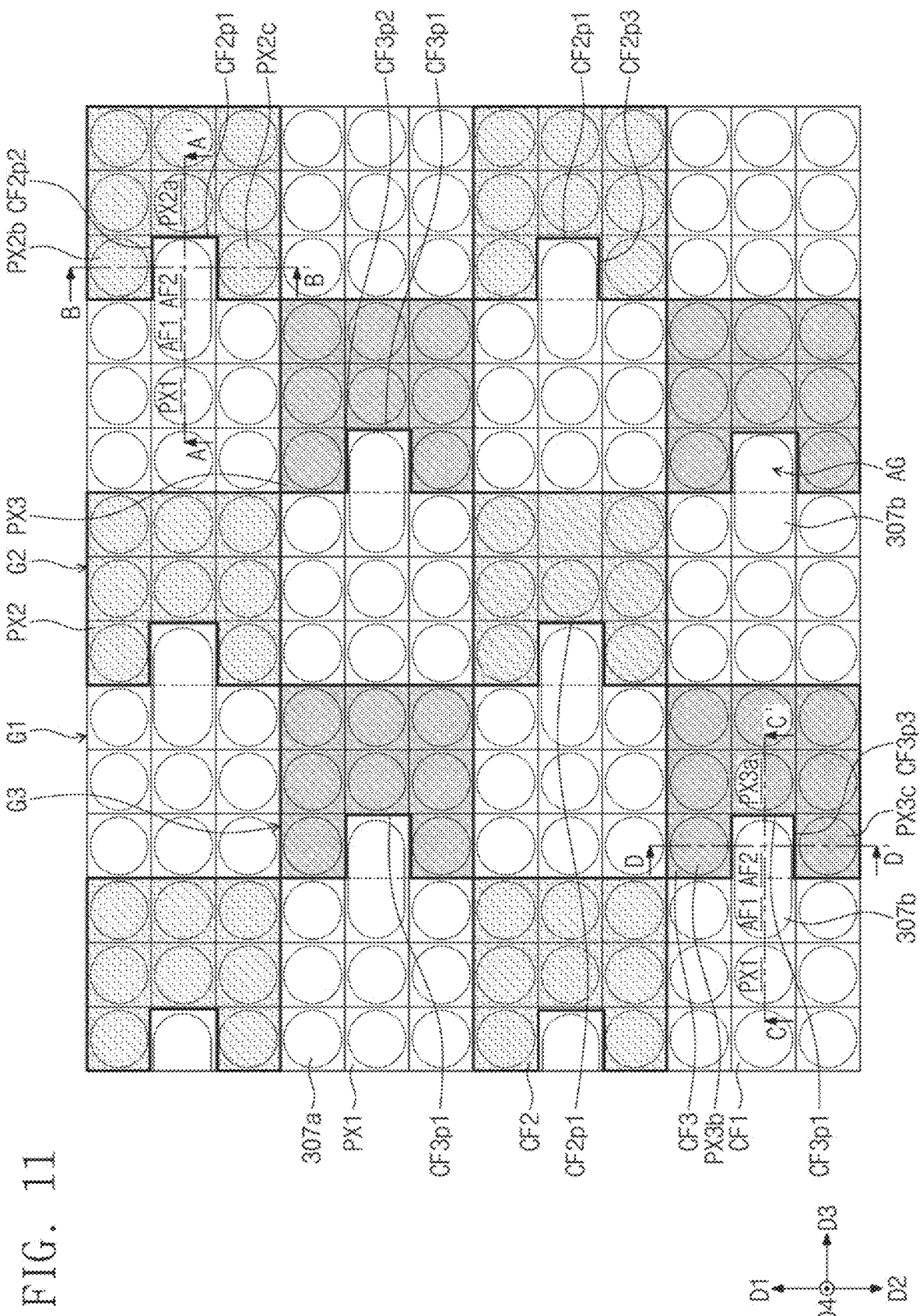
FIG. 11 is an enlarged plan view of M depicted in FIG. 2, illustrating an image sensor according to one or more embodiments of the disclosure.
Figure 12A:
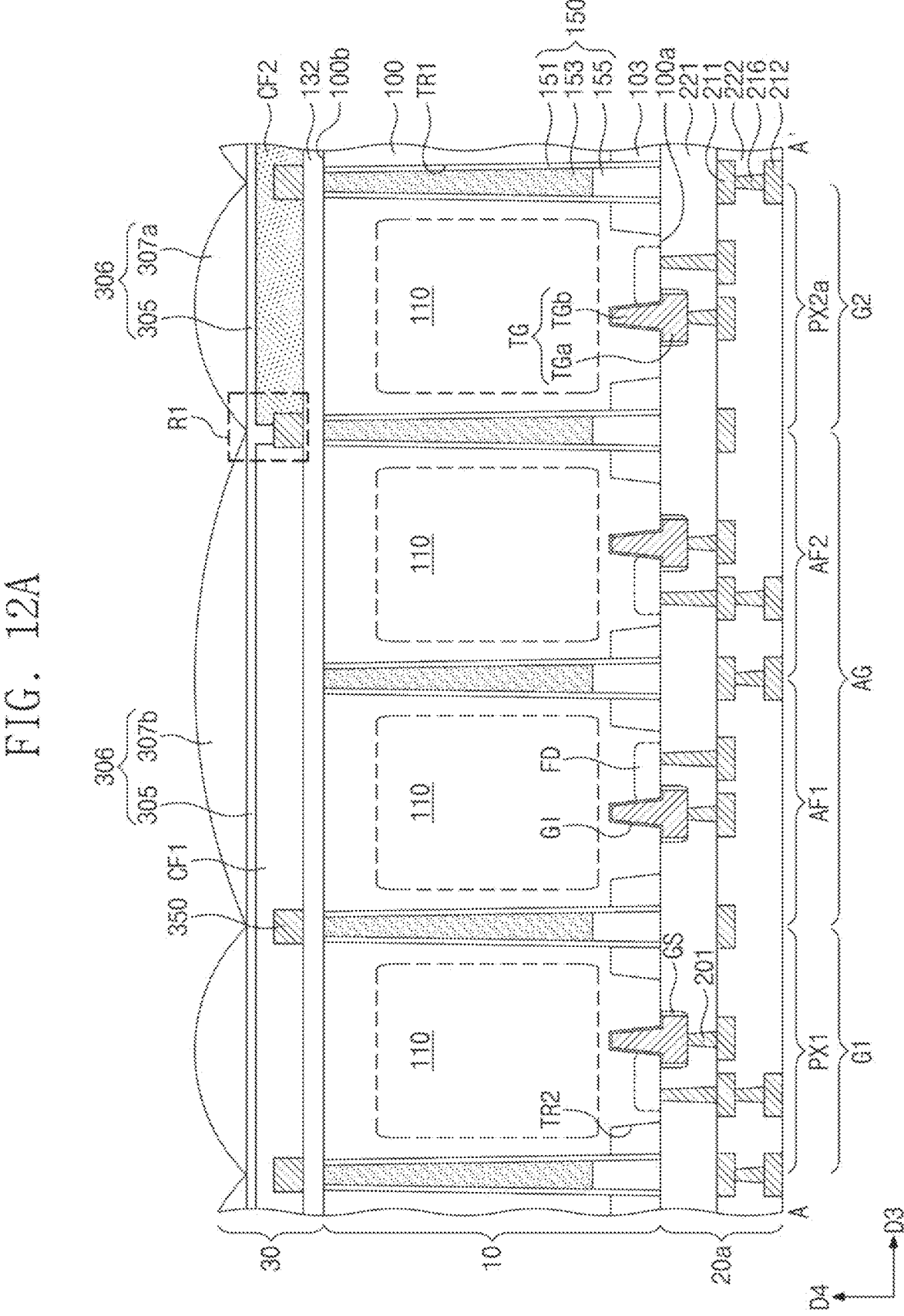
Figure 12B:
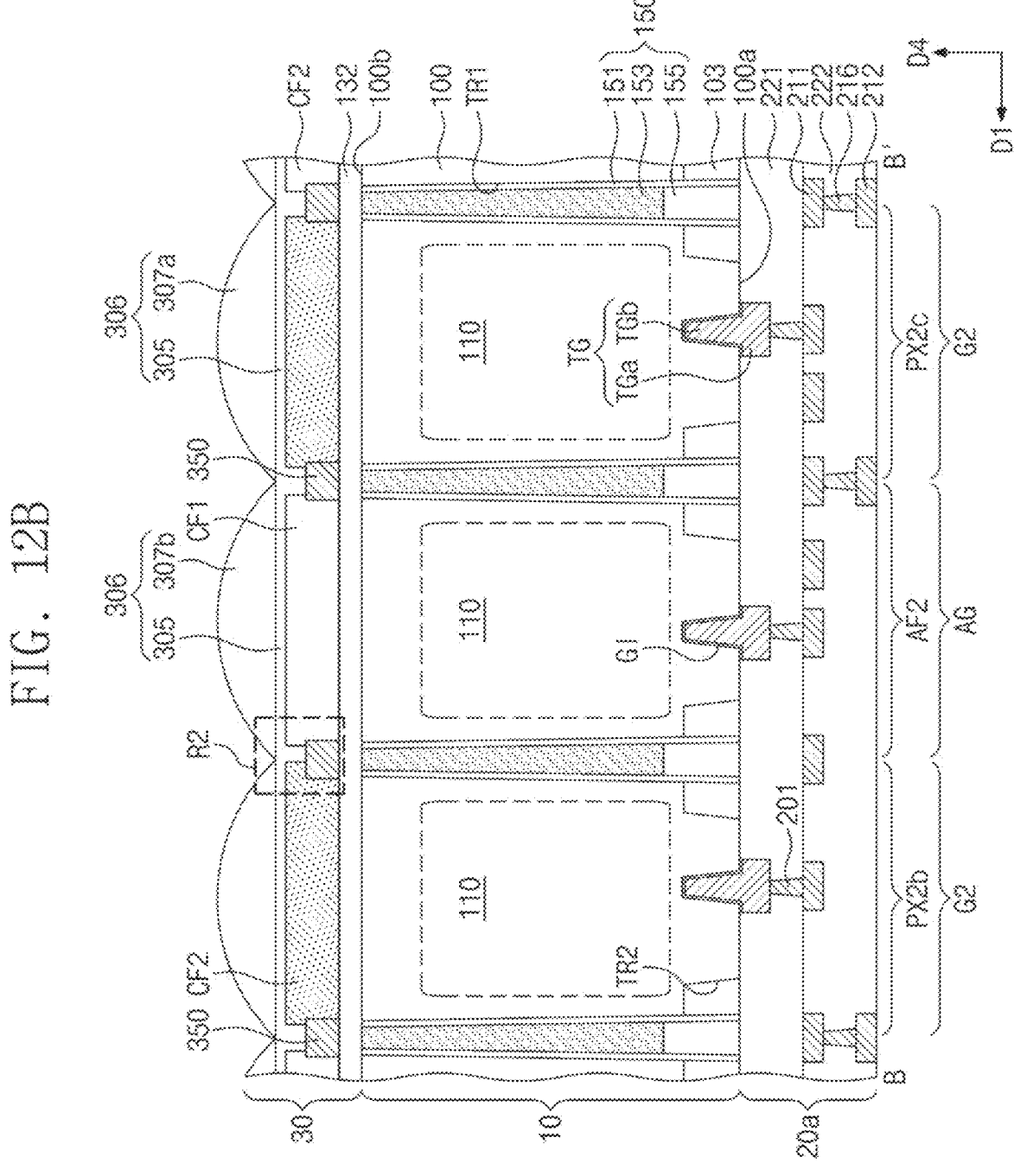
Figure 12C:
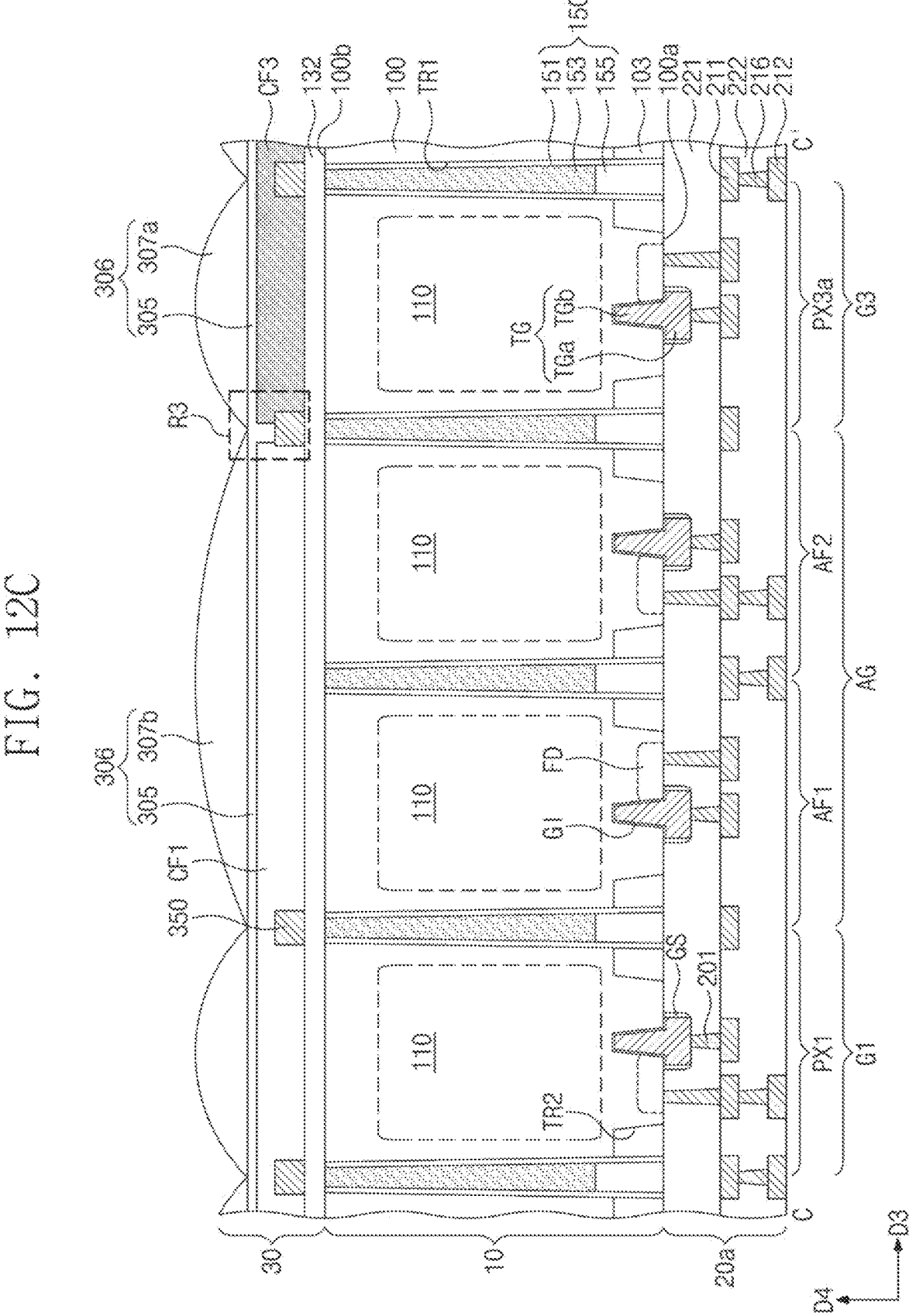
Figure 12D:
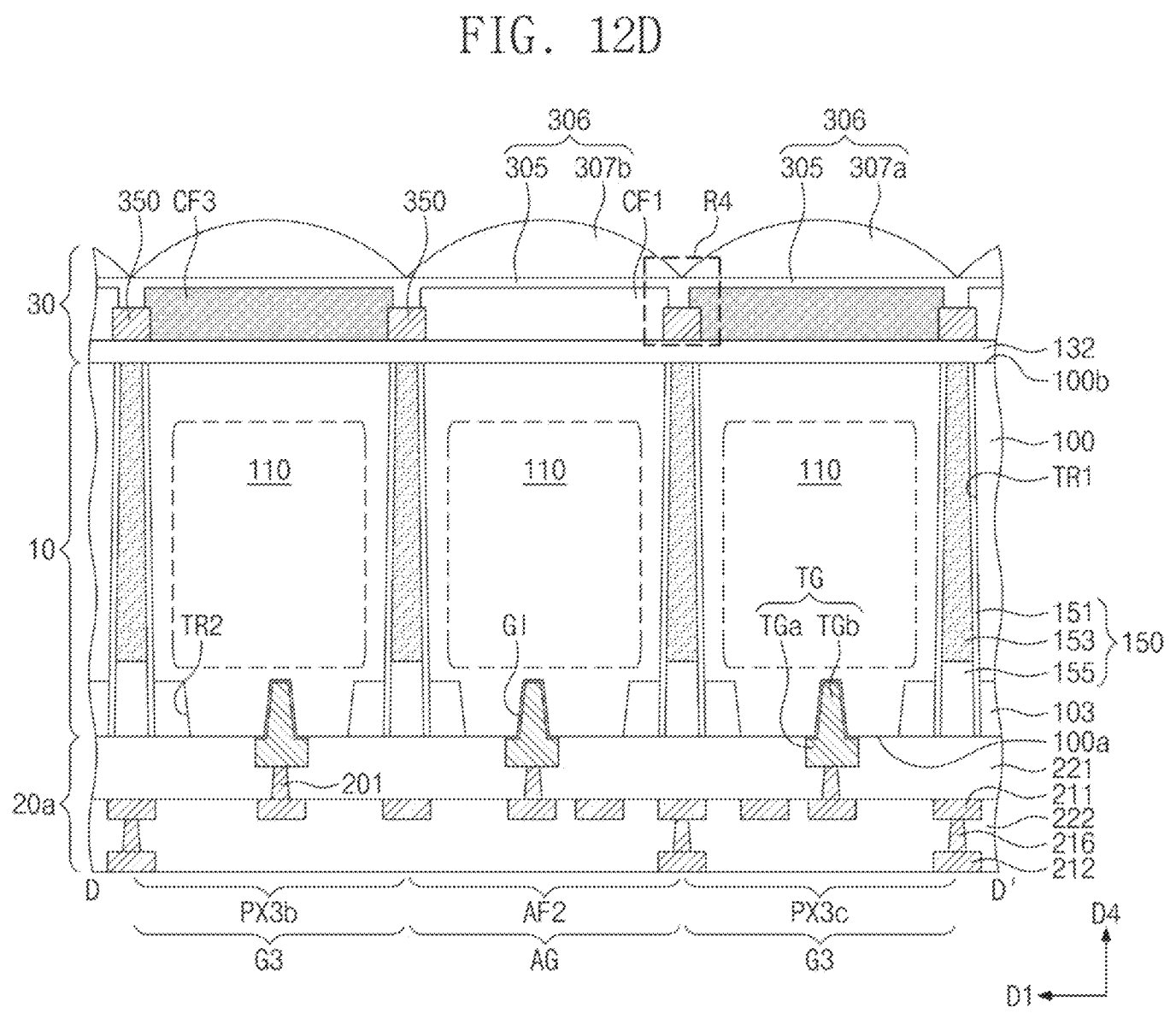
Figure 13A:
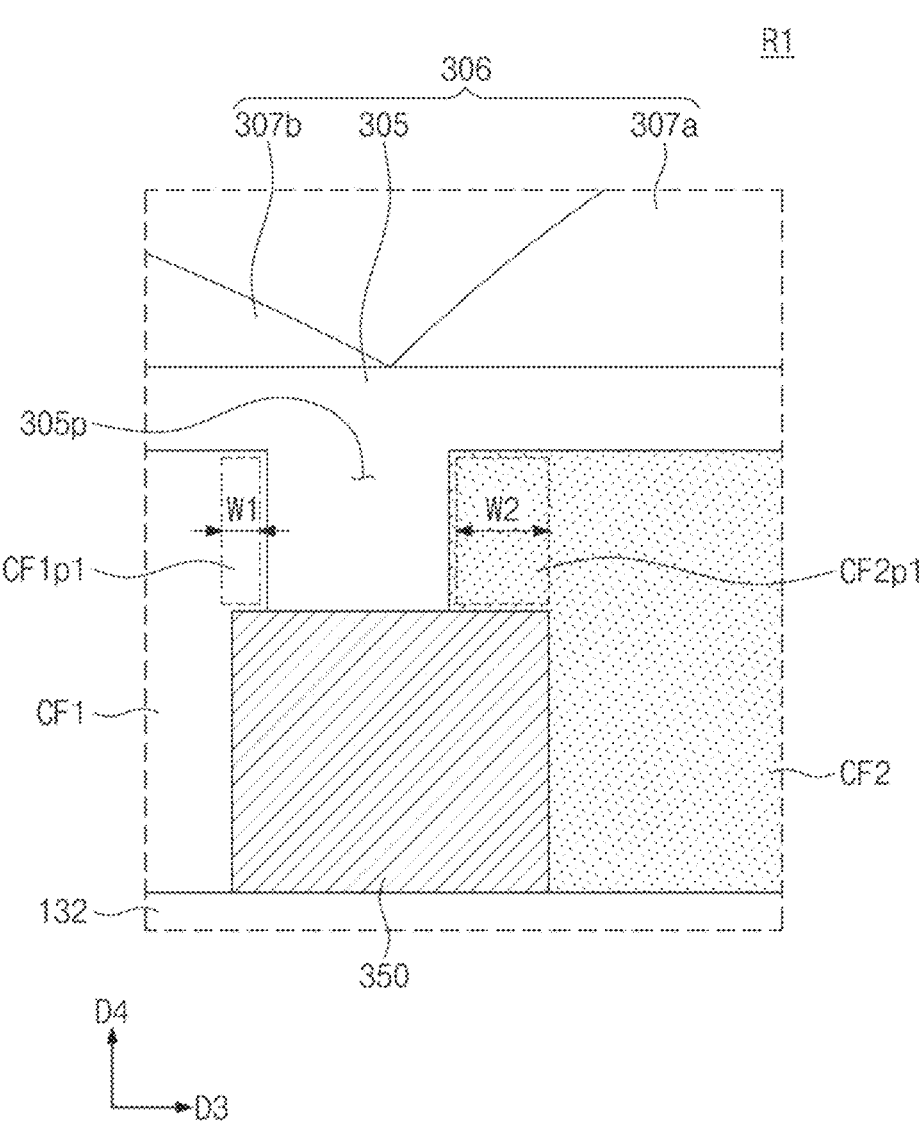
FIG. 13A is an enlarged cross-sectional view illustrating section R1 of FIG. 12A according to one or more embodiments of the disclosure.
Figure 13B:
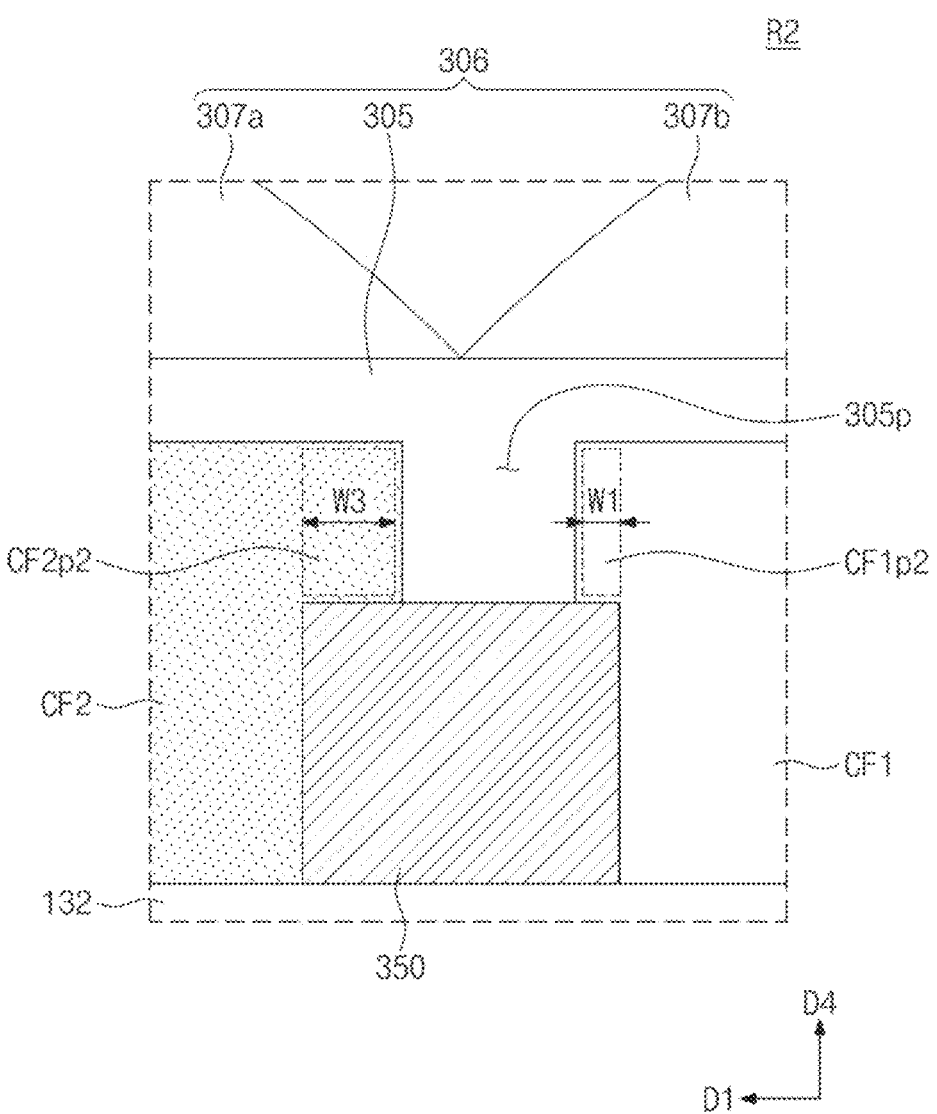
FIG. 13B is an enlarged cross-sectional view illustrating section R2 of FIG. 12B according to one or more embodiments of the disclosure.
Figure 13C:
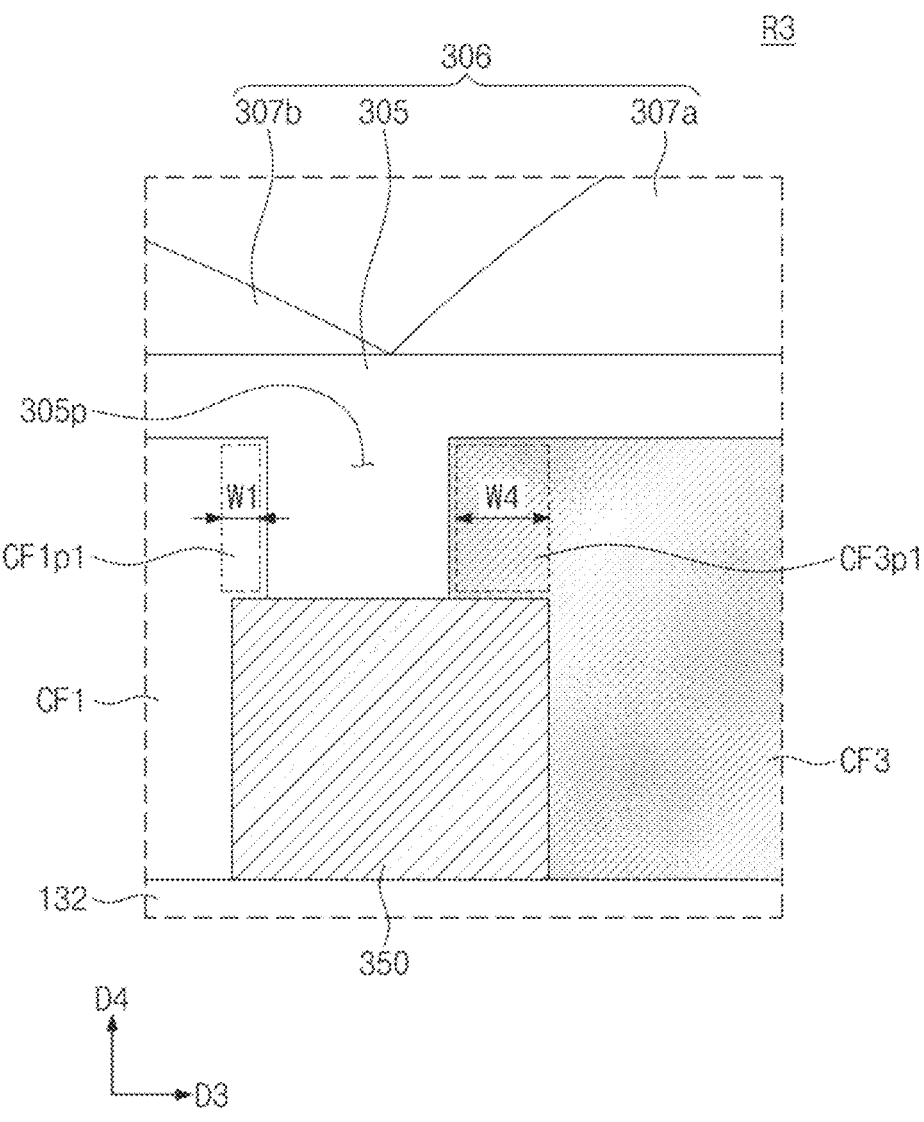
FIG. 13C is an enlarged cross-sectional view illustrating section R3 of FIG. 12C according to one or more embodiments of the disclosure.
Figure 13D:
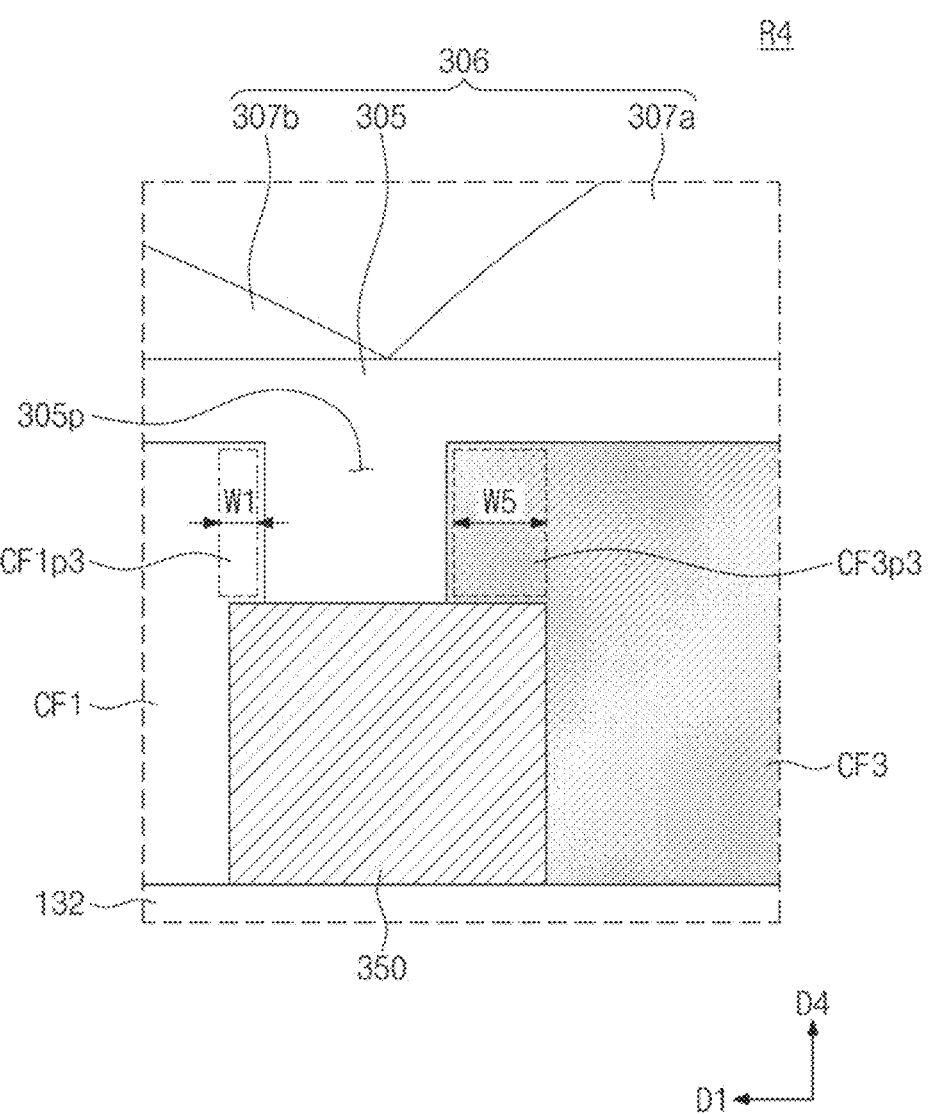
FIG. 13D is an enlarged cross-sectional view illustrating section R4 of FIG. 12D according to one or more embodiments of the disclosure.

FIG. 11 is an enlarged plan view of M depicted in FIG. 2, illustrating an image sensor according to one or more embodiments of the disclosure. FIGS. 12A, 12B, 12C, and 12D are cross-sectional views respectively taken along lines A-A', B-B', C-C', and D-D' of FIG. 11 according to one or more embodiments of the disclosure. FIG. 13A is an enlarged cross-sectional view illustrating section R1 of FIG. 12A according to one or more embodiments of the disclosure. FIG. 13B is an enlarged cross-sectional view illustrating section R2 of FIG. 12B according to one or more embodiments of the disclosure. FIG. 13C is an enlarged cross-sectional view illustrating section R3 of FIG. 12C according to one or more embodiments of the disclosure. FIG. 13D is an enlarged cross-sectional view illustrating section R4 of FIG. 12D according to one or more embodiments of the disclosure. Repeated descriptions made with reference to FIGS. 4, 5A to 5D, and 6A to 6D may be omitted.

Referring to FIGS. 11 and 12A to 12D, the second color filter CF2 positioned on an upside of the pixel array area AR in a plan view may include a first protrusion CF2$p1$ and a second protrusion CF2$p2$.

Referring to FIGS. 13A and 13B, the second color filter CF2 may include a first protrusion CF2$p1$ adjacent to the second autofocus pixel AF2 in the third direction D3 and a second protrusion CF2$p2$ adjacent to the second autofocus pixel AF2 in the first direction D1. The first protrusion CF2$p1$ of the second color filter CF2 may have a width W2 in the third direction D3 that is greater than a width W1 in the third direction D3 of the first protrusion CF1$p1$ of the first color filter CF1. The second protrusion CF2$p2$ of the second color filter CF2 may have a width W3 in the first direction D1 that is greater than a width W1 in the first direction D1 of the second protrusion CF1$p2$ of the first color filter CF1. The third color filter CF3 positioned on the upside of the pixel array area AR in a plan view may also have a first protrusion CF3$p1$ and a second protrusion CF3$p2$.

Referring back to FIGS. 11 and 12A to 12D, the third color filter CF3 positioned on a downside of the pixel array area AR in a plan view may include a first protrusion CF3$p1$ and a third protrusion CF3$p3$ that is adjacent to the second autofocus pixel AF2 in the second direction D2.

Referring to FIGS. 13C and 13D, the third color filter CF3 may include a first protrusion CF3$p1$ adjacent to the second autofocus pixel AF2 in the third direction D3 and a third protrusion CF3$p3$ adjacent to the second autofocus pixel AF2 in the second direction D2. The first protrusion CF3$p1$ of the third color filter CF3 may have a width W3 in the third direction D3 greater than the width W1 in the third direction D3 of the first protrusion CF1$p1$ of the first color filter CF1.

The first color filter CF1 may include a third protrusion CF1$p3$ adjacent to the third color filter CF3 in the second direction D2. The third protrusion CF1$p3$ of the first color filter CF1 may protrude in a direction toward the third pixel PX3$c$. The third protrusion CF3$p3$ of the third color filter CF3 may protrude in a direction toward the second autofocus pixel AF2. The third protrusion CF3$p3$ of the third color filter CF3 may vertically overlap or at least partially vertically overlap the light-shield pattern 350.

The third protrusion CF3$p3$ of the third color filter CF3 may have a fifth width W5 in the first direction D1. The fifth width W5 may be greater than a width W1 of the third protrusion CF1$p3$ of the first color filter CF1 in the first direction D1. The second color filter CF2 positioned on the downside of the pixel array area AR in a plan view may also have a first protrusion CF2$p1$ and a third protrusion CF2$p3$.

Figure 14:
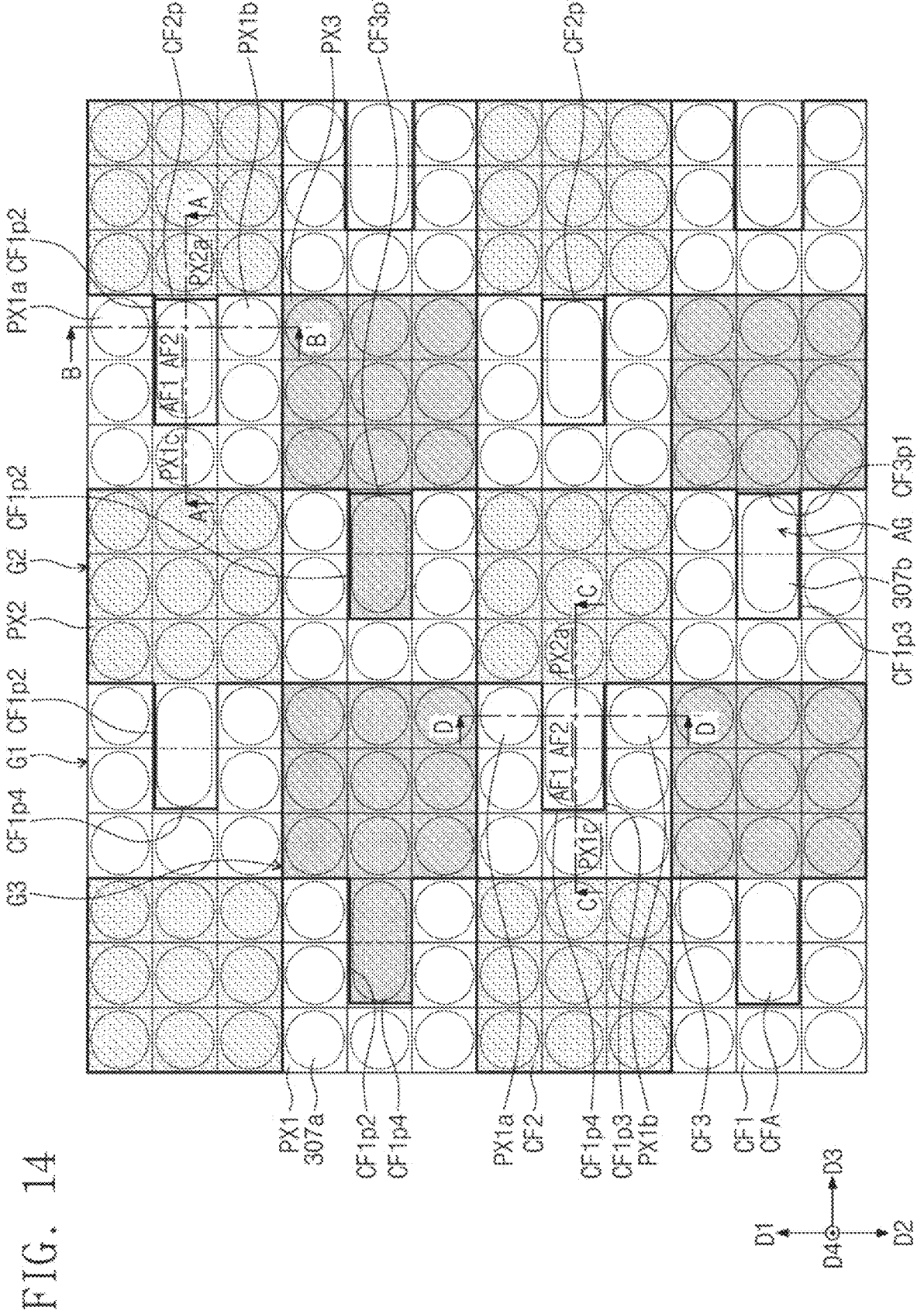
FIG. 14 is an enlarged plan view of M depicted in FIG. 2, illustrating an image sensor according to one or more embodiments of the disclosure.
Figure 15A:
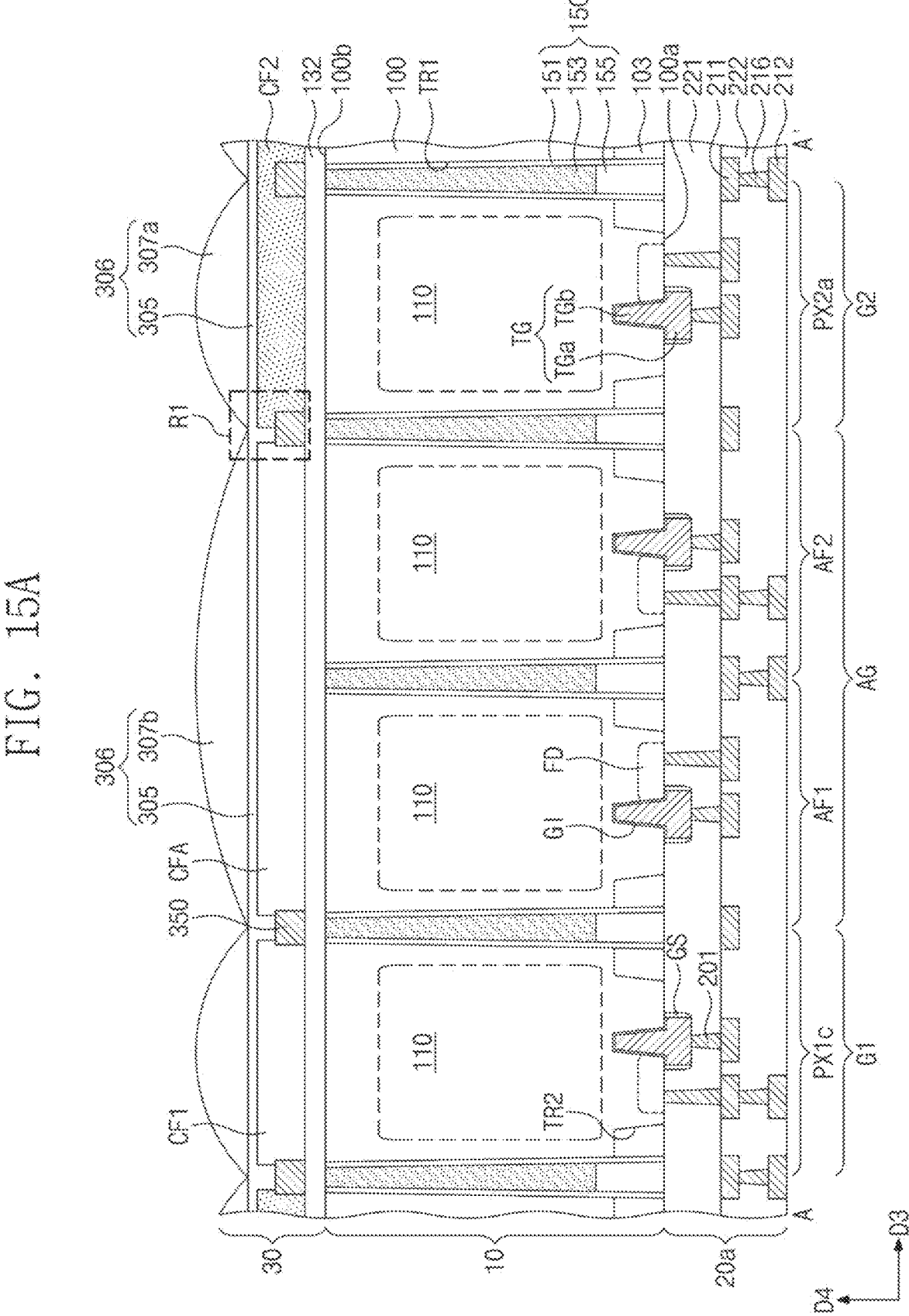
FIGS. 15A, 15B, 15C, and 15D are cross-sectional views respectively taken along lines A-A', B-B', C-C', and D-D' of FIG. 14 according to one or more embodiments of the disclosure.
Figure 15B:
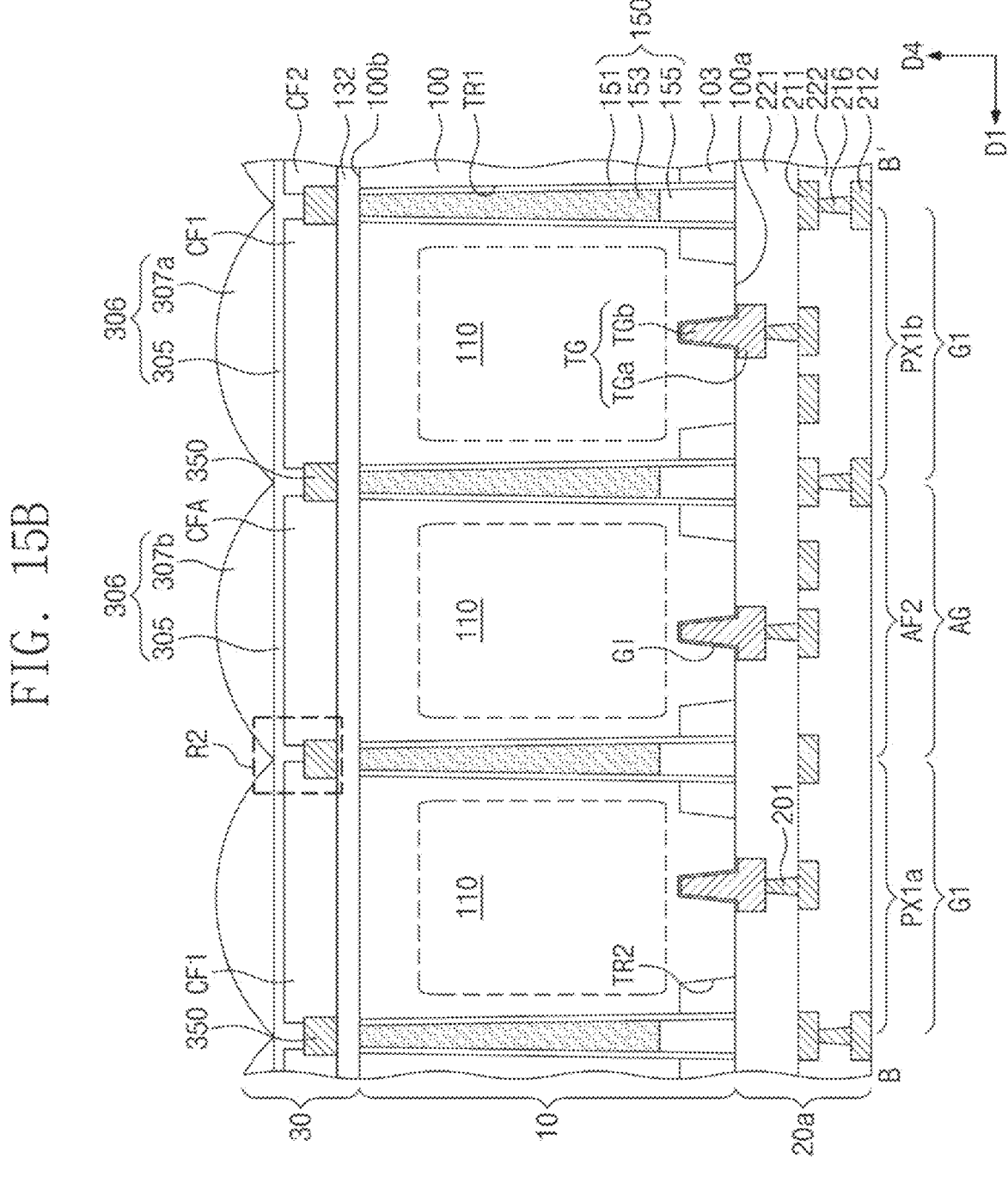
Figure 15C:
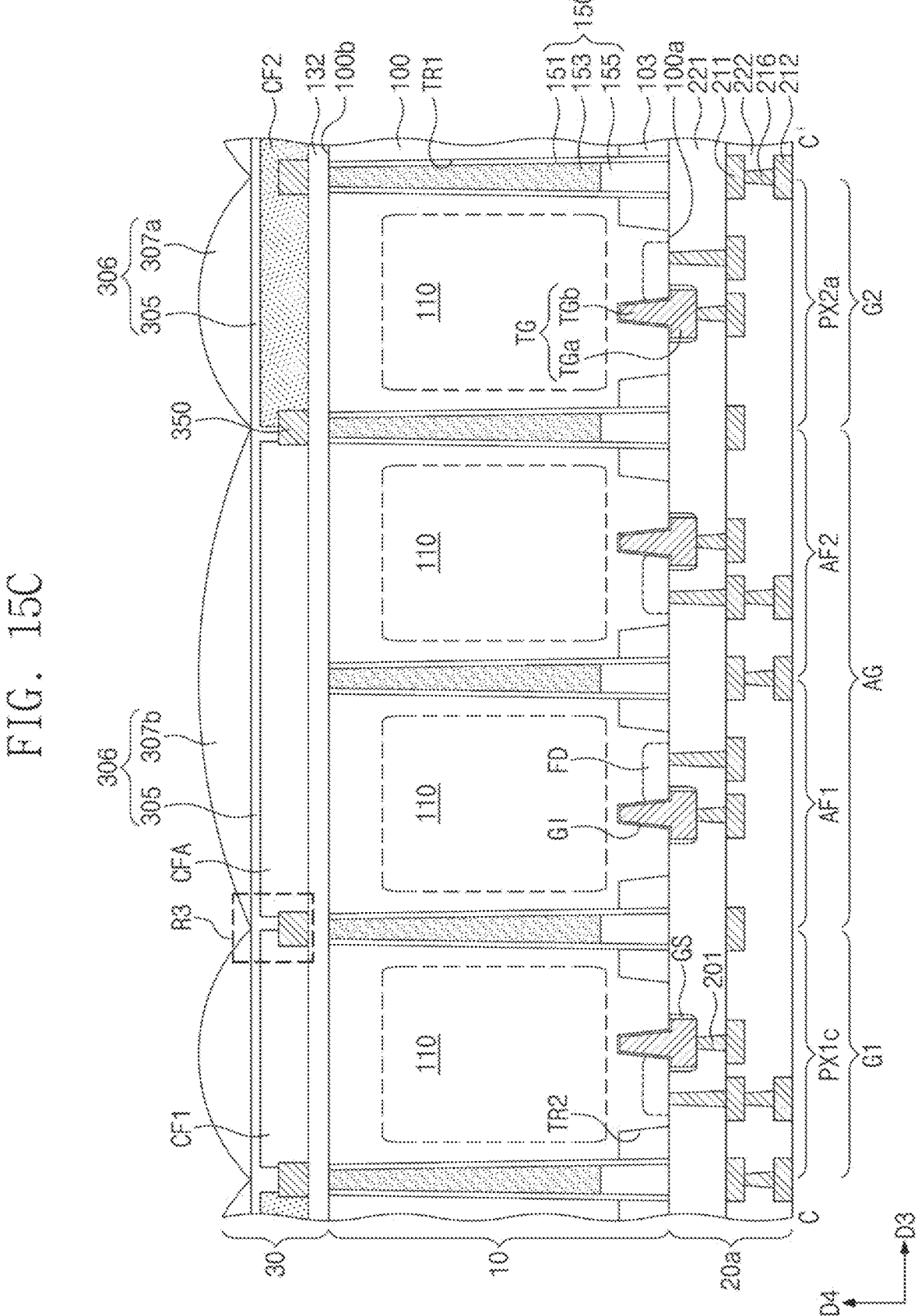
Figure 15D:
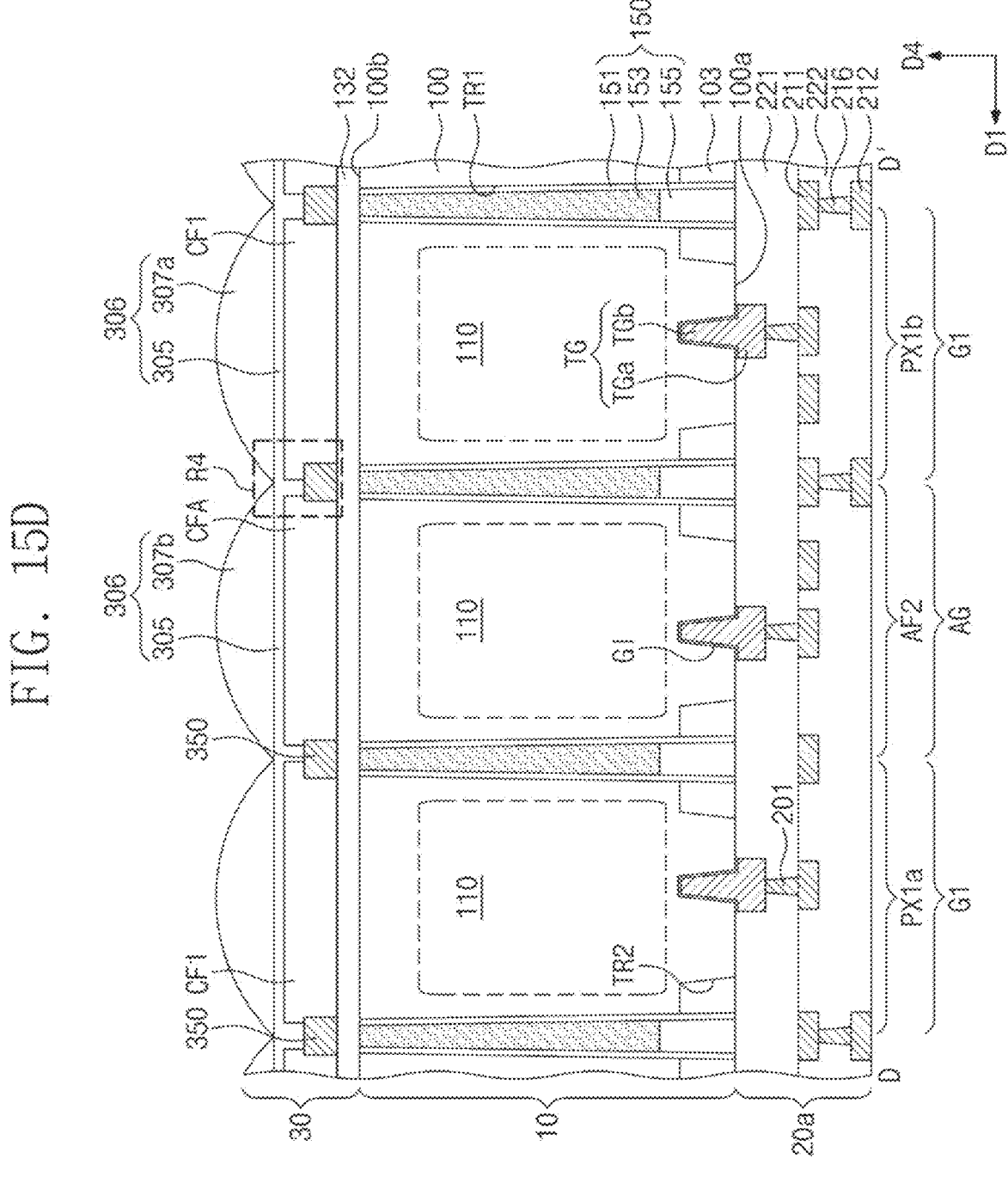
Figure 16A:
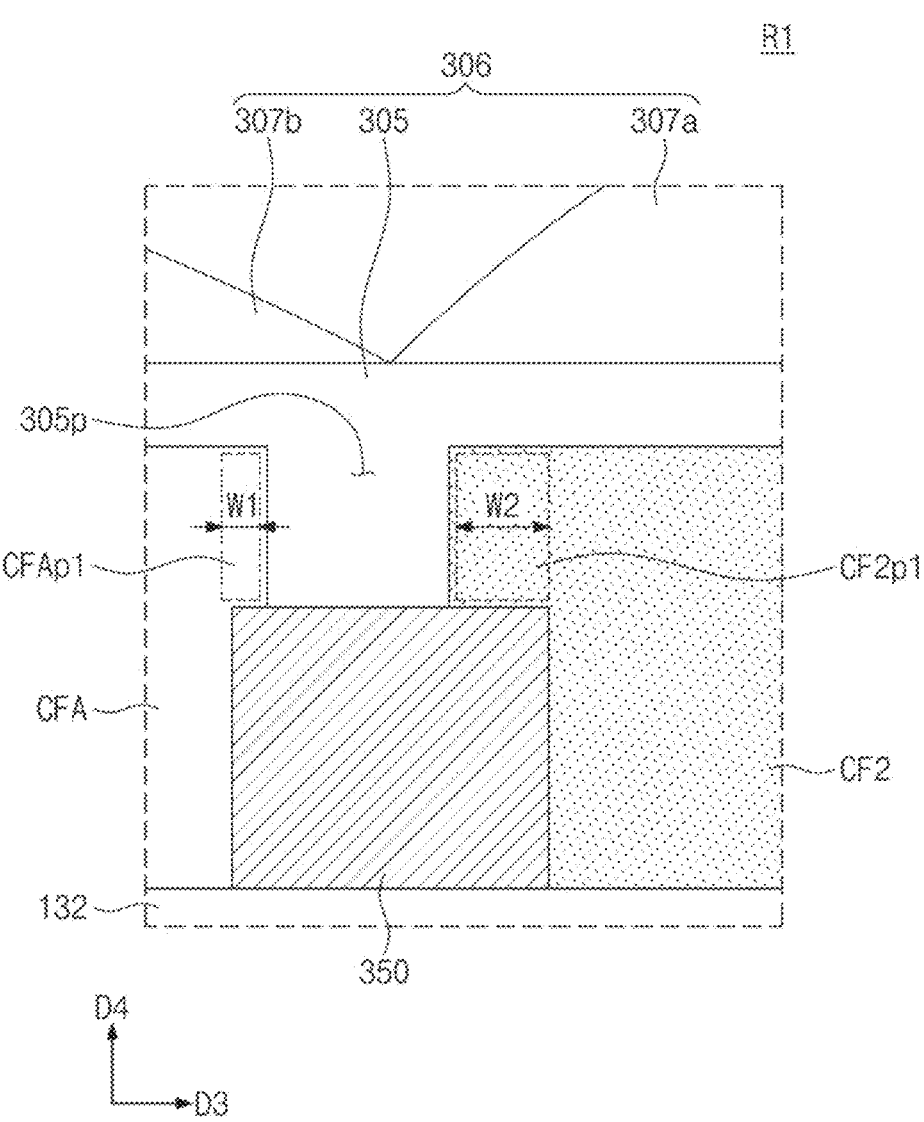
FIG. 16A is an enlarged cross-sectional view illustrating section R1 of FIG. 15A according to one or more embodiments of the disclosure.
Figure 16B:
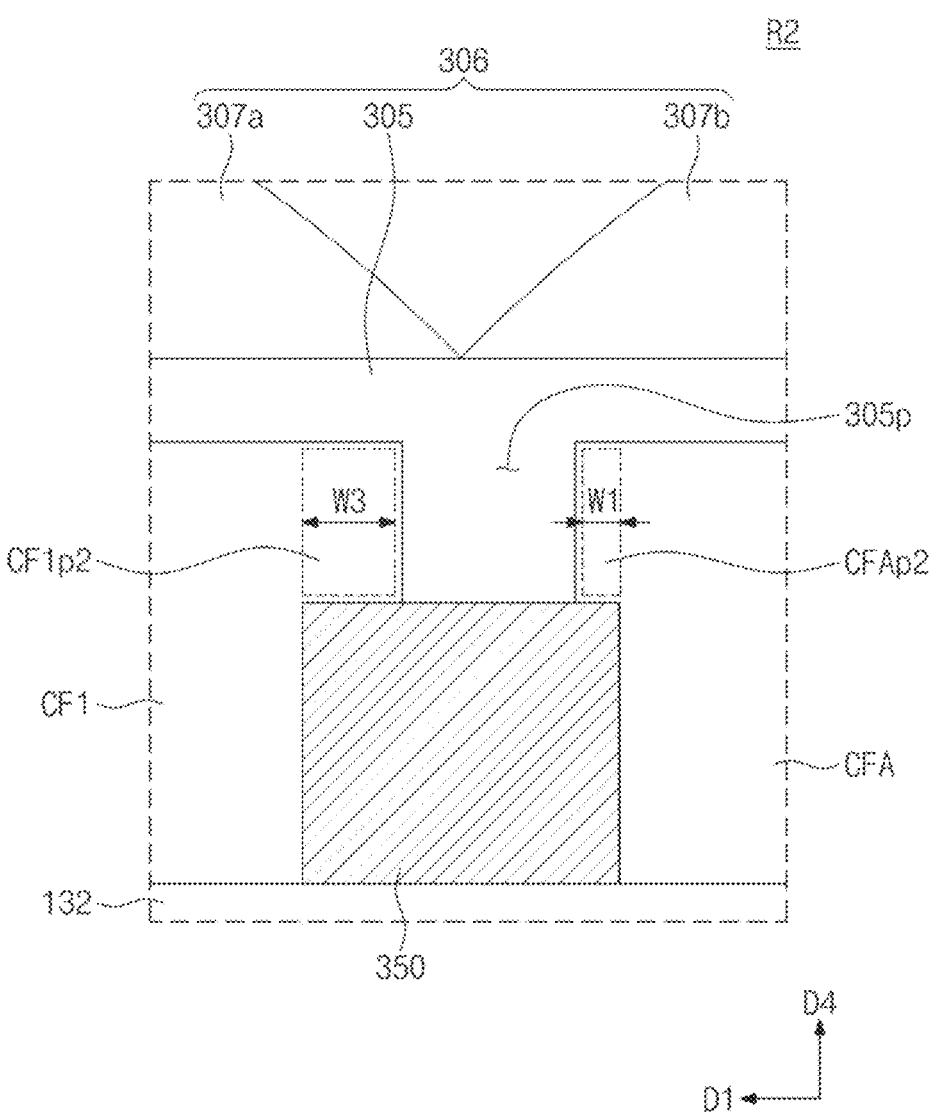
FIG. 16B is an enlarged cross-sectional view illustrating section R2 of FIG. 15B according to one or more embodiments of the disclosure.
Figure 16C:
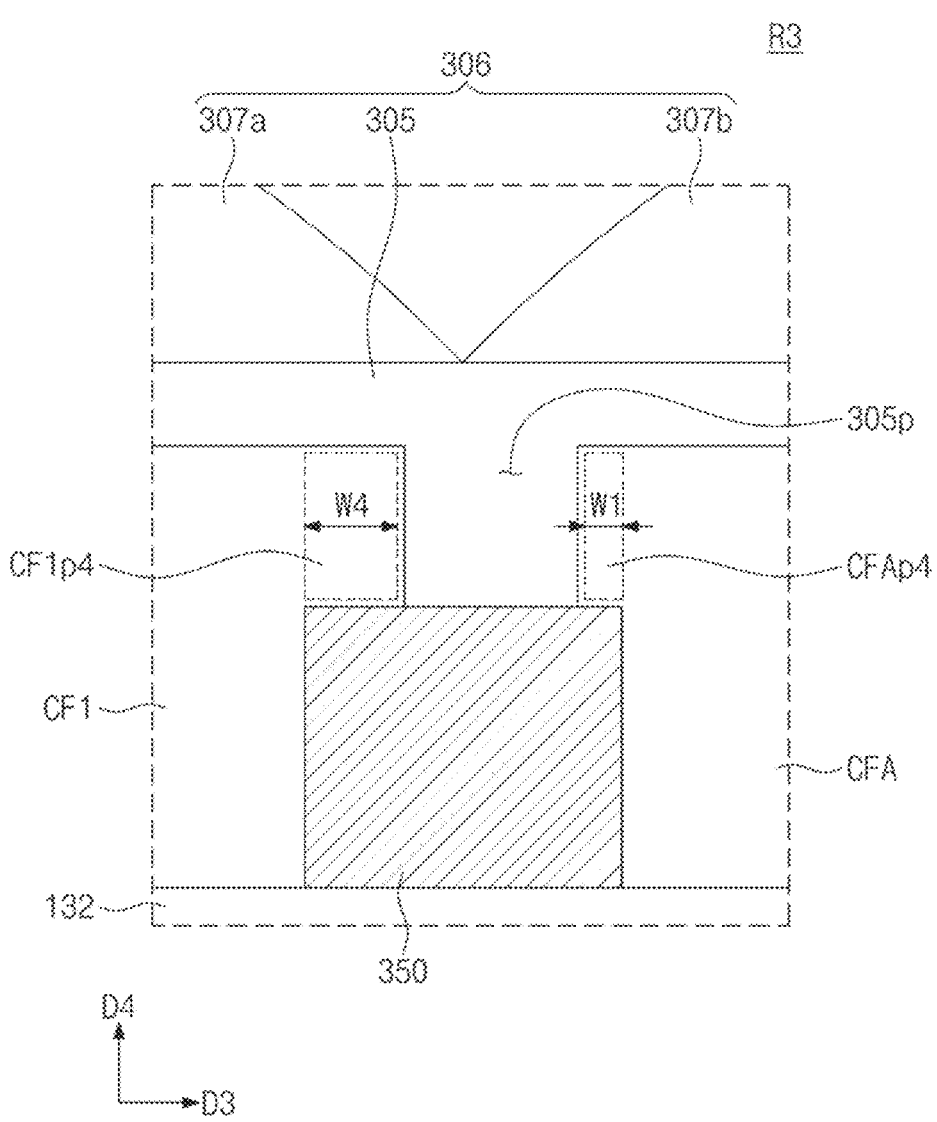
FIG. 16C is an enlarged cross-sectional view illustrating section R3 of FIG. 15C according to one or more embodiments of the disclosure.
Figure 16D:
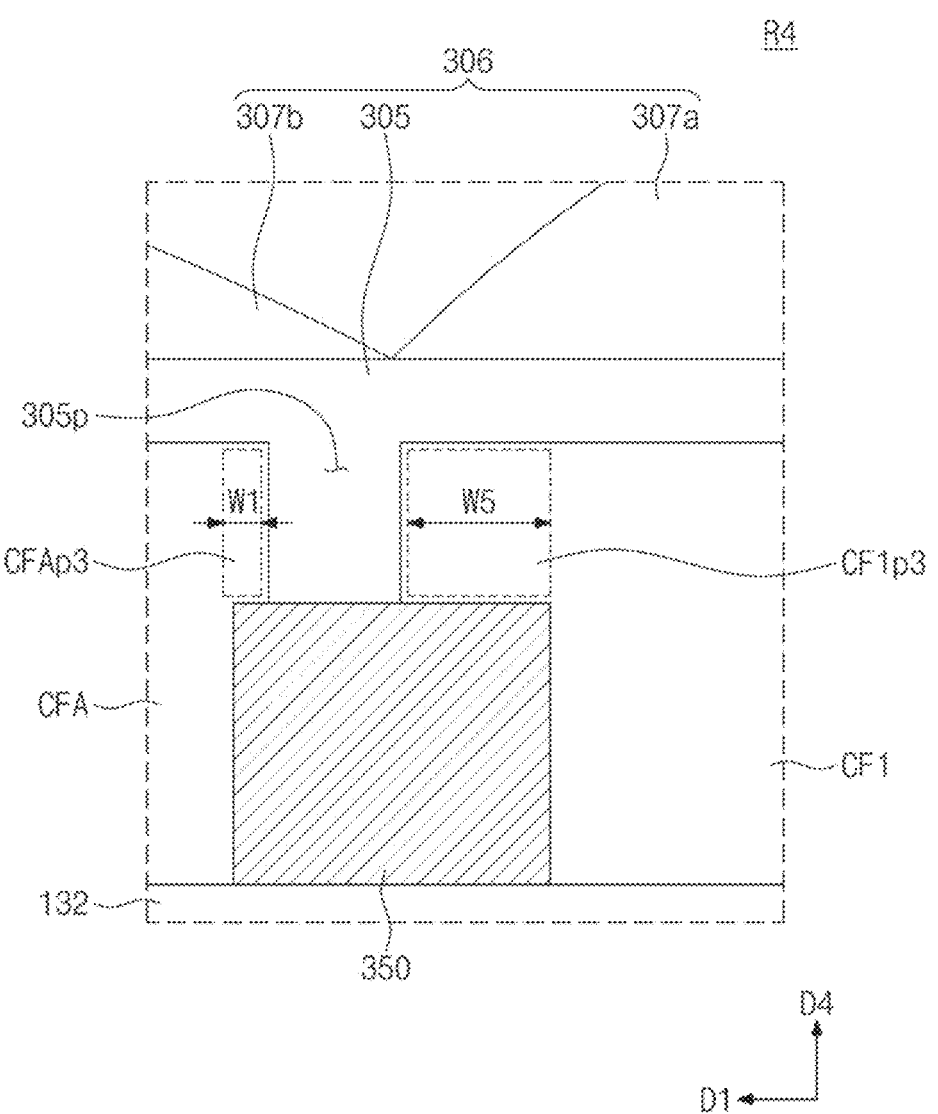
FIG. 16D is an enlarged cross-sectional view illustrating section R4 of FIG. 15D according to one or more embodiments of the disclosure.

FIG. 14 is an enlarged plan view of M depicted in FIG. 2, illustrating an image sensor according to one or more embodiments of the disclosure. FIGS. 15A, 15B, 15C, and are cross-sectional views respectively taken along lines A-A', B-B', C-C', and D-D' of FIG. 14 according to one or more embodiments of the disclosure. FIG. 16A is an enlarged cross-sectional view illustrating section R1 of FIG. 15A according to one or more embodiments of the disclosure. FIG. 16B is an enlarged cross-sectional view illustrating section R2 of FIG. according to one or more embodiments of the disclosure. FIG. 16C is an enlarged cross-sectional view illustrating section R3 of FIG. 15C according to one or more embodiments of the disclosure. FIG. 16D is an enlarged cross-sectional view illustrating section R4 of FIG. according to one or more embodiments of the disclosure. Repeated descriptions made with reference to FIGS. 4, 5A to 5D, and 6A to 6D may be omitted.

Referring to FIGS. 14 and 15A to 15D, each of the second pixel group G2 and the third pixel group G3 may have a 3×3 Nona pixel arrangement. The first pixel group G1 may have seven pixels arranged in a 3×3 arrangement. An autofocus color filter CFA may be disposed on the autofocus pixel group AG. The first color filter CF1 may be disposed on the first pixel group G1. The autofocus color filter CFA may be spaced apart from the first color filter CF1. The autofocus color filter CFA may be, for example, a green color filter. The first pixel group G1 may include first pixels PX1$a$ adjacent to the autofocus pixel group AG in the first direction D1, first pixels PX1$b$ adjacent to the autofocus pixel group AG in the second direction D2, and a first pixel PX1$c$ adjacent to the autofocus pixel group AG in the third direction D3.

The first color filter CF1 positioned on the upside of the pixel array area AR may include a second protrusion CF1$p$2 adjacent to the autofocus pixel group AG in the first direction D1. The first color filter CF1 positioned on the downside of the pixel array area AR in a plan view may include a third protrusion CF1$p$3 adjacent to the autofocus pixel group AG in the second direction D2 and a fourth protrusion CF1$p$4 adjacent in the third direction D3 to the autofocus pixel group AG in the third direction D3.

Referring to FIG. 16A, the autofocus color filter CFA may include a first protrusion CFAp1 adjacent to the second color filter CF2 in the third direction D3. The first protrusion CFAp1 of the autofocus color filter CFA may protrude in a direction toward the second pixel PX2$a$. The first protrusion CFAp1 of the autofocus color filter CFA may vertically overlap or at least partially vertically overlap the light-shield pattern 350. The second color filter CF2 may include a first protrusion CF2$p$1 adjacent to the autofocus color filter CFA in the third direction D3. The first protrusion CF2$p$1 of the second color filter CF2 may protrude in a direction toward the second autofocus pixel AF2. The first protrusion CF2$p$1 of the second color filter CF2 may vertically overlap or at least partially vertically overlap the light-shield pattern 350.

The first protrusion CFAp1 of the autofocus color filter CFA may have a first width W1 in the third direction D3. The first protrusion CF2$p$1 of the second color filter CF2 may have a second width W2 in the third direction D3. The second width W2 may be greater than the first width W1.

Referring to FIG. 16B, the autofocus color filter CFA may include a second protrusion CFAp2 adjacent to the first color filter CF1 in the first direction D1. The second protrusion CFAp2 of the autofocus color filter CFA may protrude in a direction toward the first pixel PX1$a$. The second protrusion CFAp2 of the autofocus color filter CFA may vertically overlap or at least partially vertically overlap the light-shield pattern 350. The first color filter CF1 may include a second protrusion CF1$p$2 adjacent to the autofocus color filter CFA in the first direction D1. The second protrusion CF1$p$2 of the first color filter CF1 may protrude in a direction toward the first autofocus pixel AF1 and the second autofocus pixel AF2. The second protrusion CF1$p$2 of the first color filter CF1 may vertically overlap or at least partially vertically overlap the light-shield pattern 350.

The second protrusion CF1$p$2 of the first color filter CF1 may have a third width W3 in the first direction D1. The third width W3 may be greater than a width W1 in the first direction D1 of the second protrusion CFAp2 of the autofocus color filter CFA.

Referring to FIG. 16C, the autofocus color filter CFA may include a fourth protrusion CFAp4 adjacent to the fourth protrusion CF1$p$4 of the first color filter CF1 in the third direction D3. The fourth protrusion CFAp4 of the autofocus color filter CFA may protrude in a direction toward the first pixel PX1$c$. The fourth protrusion CF1$p$4 of the first color filter CF1 may protrude in a direction toward the first autofocus pixel AF1. The fourth protrusion CF1$p$4 of the first color filter CF1 may vertically overlap or at least partially vertically overlap the light-shield pattern 350.

The fourth protrusion CF1$p$4 of the first color filter CF1 may have a fourth width W4 in the third direction D3. The fourth width W4 may be greater than a width W1 in the third direction D3 of the fourth protrusion CFAp4 of the autofocus color filter CFA.

Referring to FIG. 16D, the autofocus color filter CFA may include a third protrusion CFAp3 adjacent to the third protrusion CF1$p$3 of the first color filter CF1 in the second direction D2. The third protrusion CFAp3 of the autofocus color filter CFA may protrude in a direction toward the first pixel PX1$b$. The third protrusion CF1$p$3 of the first color filter CF1 may protrude in a direction toward the first autofocus pixel AF1 and the second autofocus pixel AF2. The third protrusion CF1$p$3 of the first color filter CF1 may vertically overlap or at least partially vertically overlap the light-shield pattern 350.

The third protrusion CF1$p$3 of the first color filter CF1 may have a fifth width W5 in the first direction D1. The fifth width W5 may be greater than a width W1 in the first direction D1 of the third protrusion CFAp3 of the autofocus color filter CFA.

According to the disclosure, based on design of the image senor and/or asymmetry of color ratio between regions of the image sensor, the first color filter CF1 may be formed to selectively include a protrusion on locations adjacent to the autofocus pixel group AG.

Figure 17:
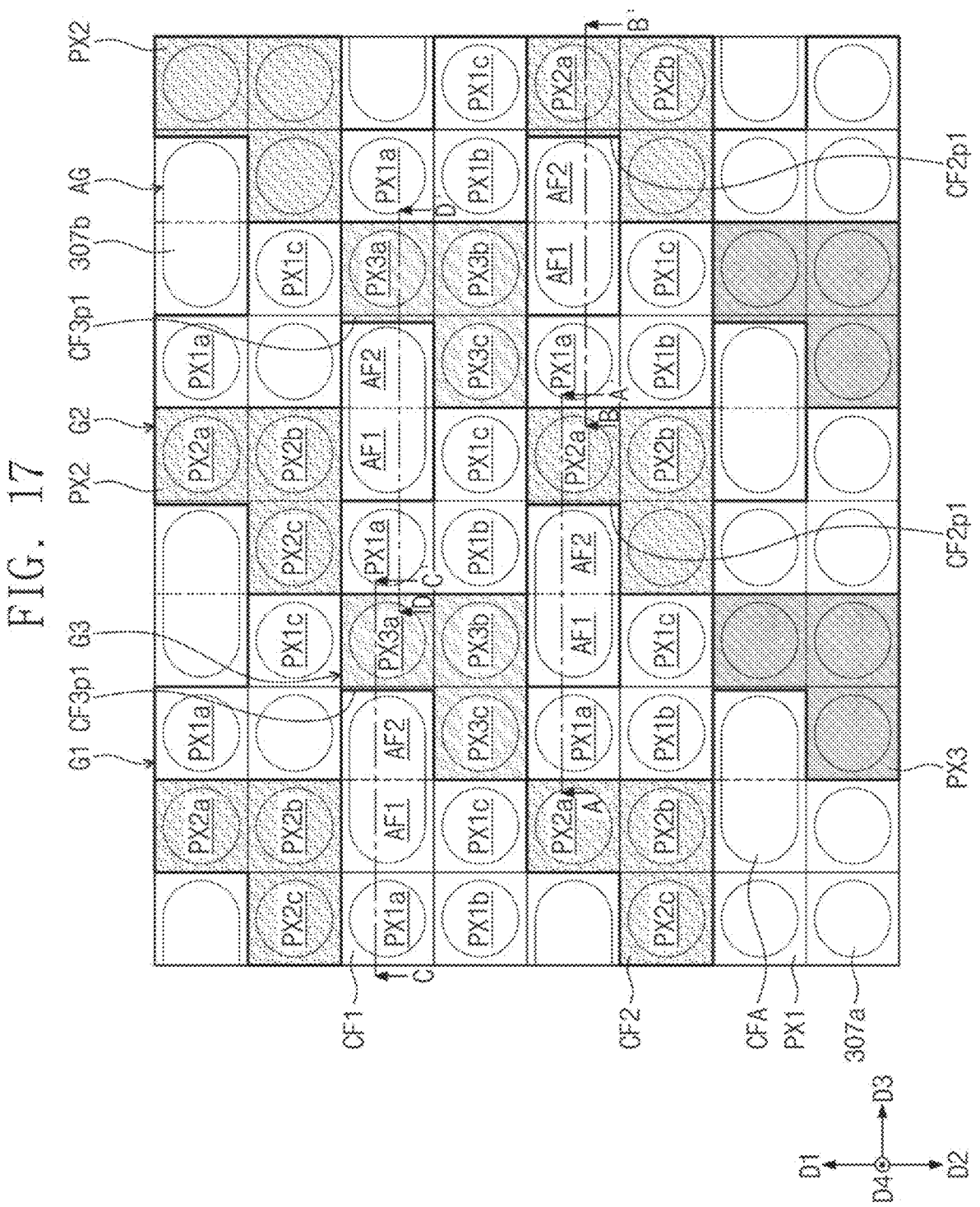
FIG. 17 is an enlarged plan view of M depicted in FIG. 2, illustrating an image sensor according to one or more embodiments of the disclosure.
Figure 18A:
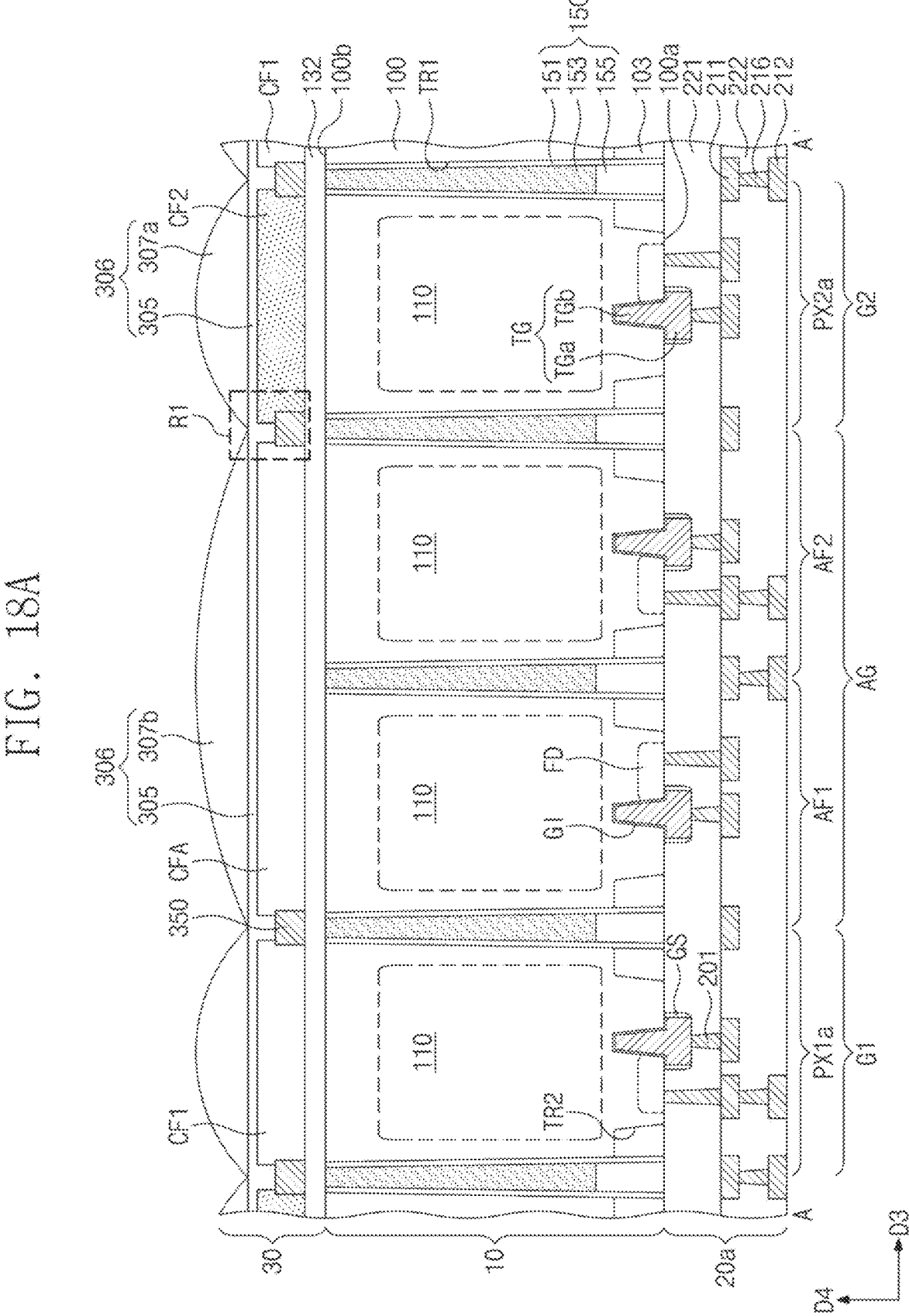
FIGS. 18A, 18B, 18C, and 18D are cross-sectional views respectively taken along lines A-A', B-B', C-C', and D-D' of FIG. 17 according to one or more embodiments of the disclosure.
Figure 18B:
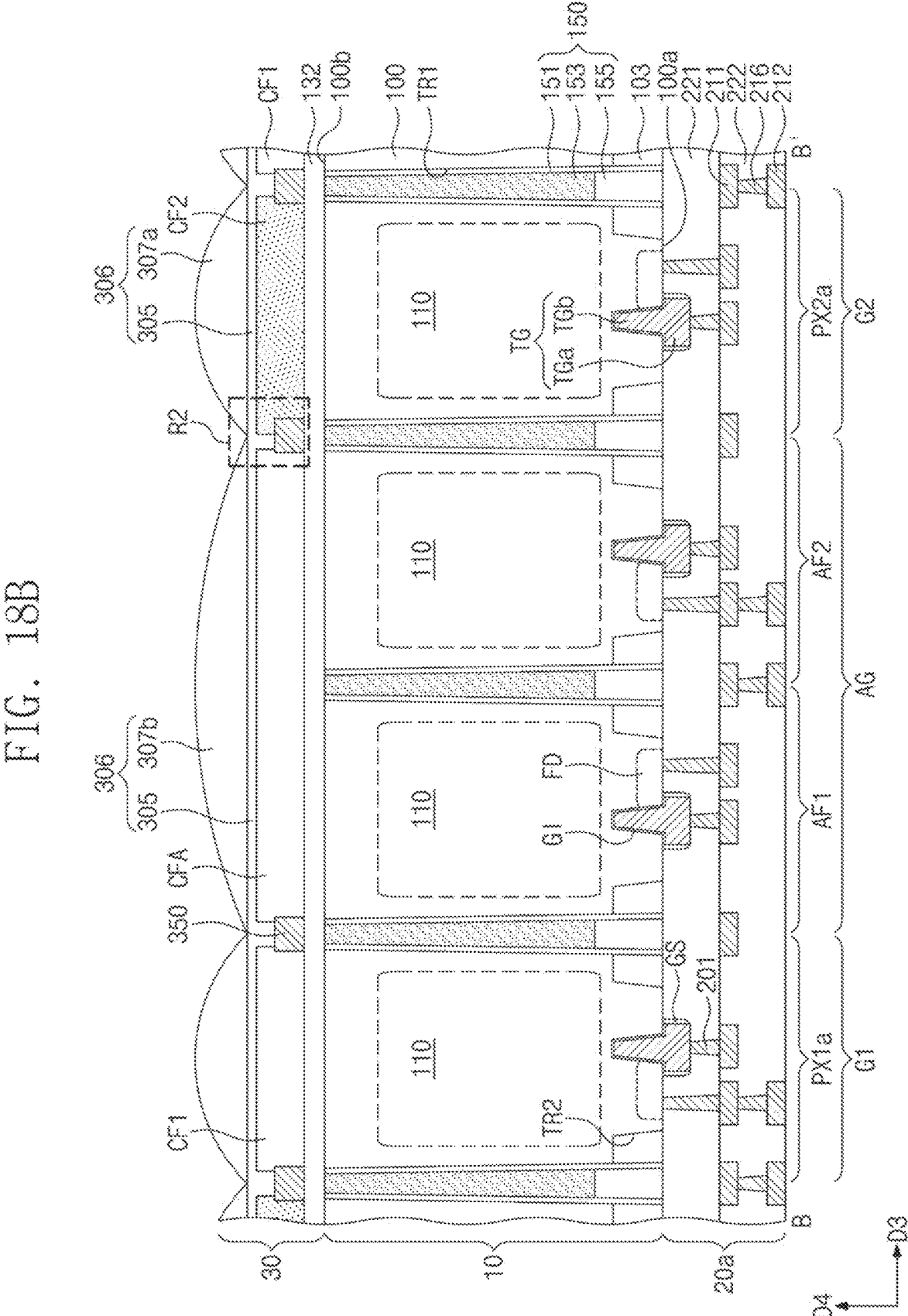
Figure 18C:
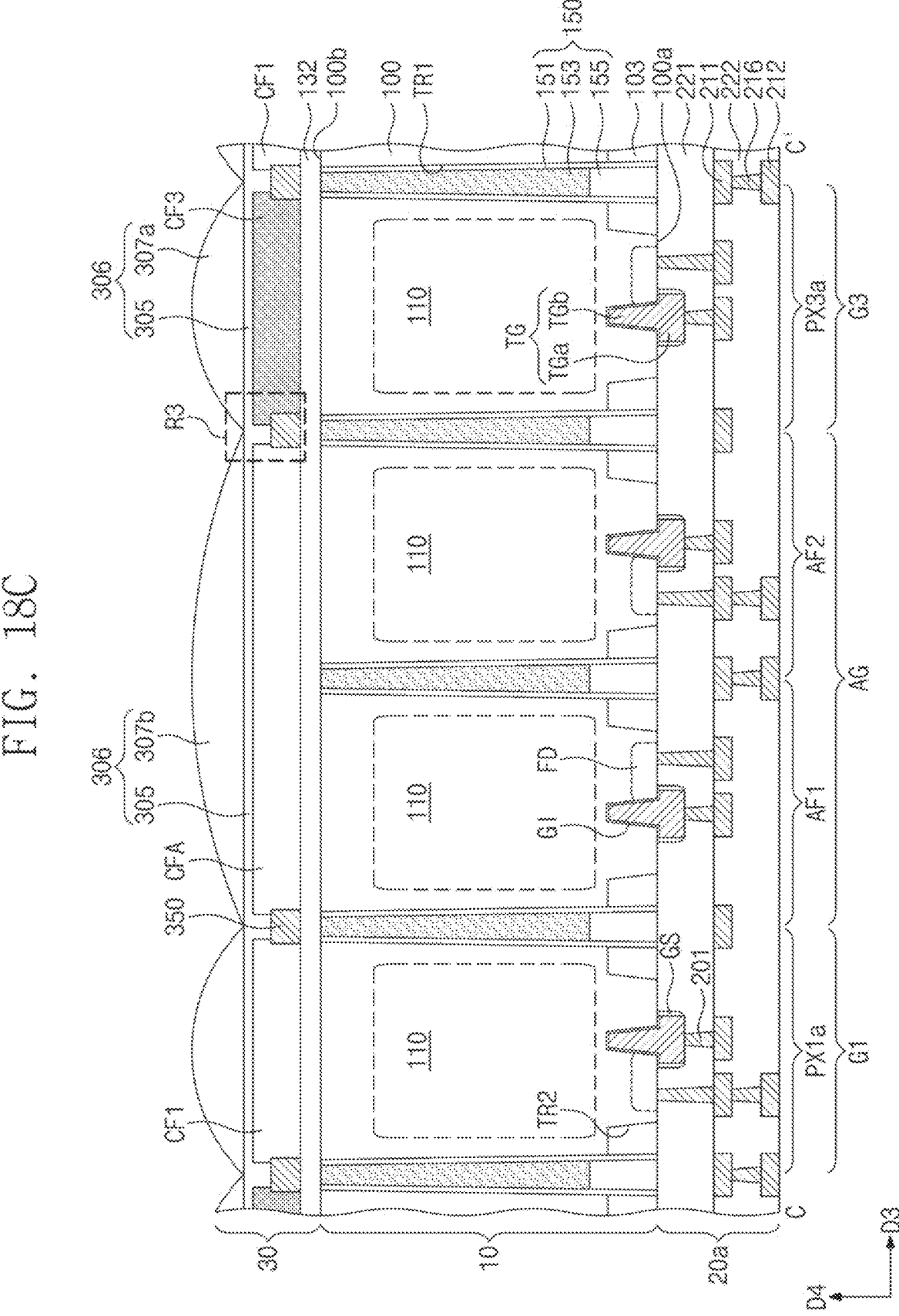
Figure 18D:
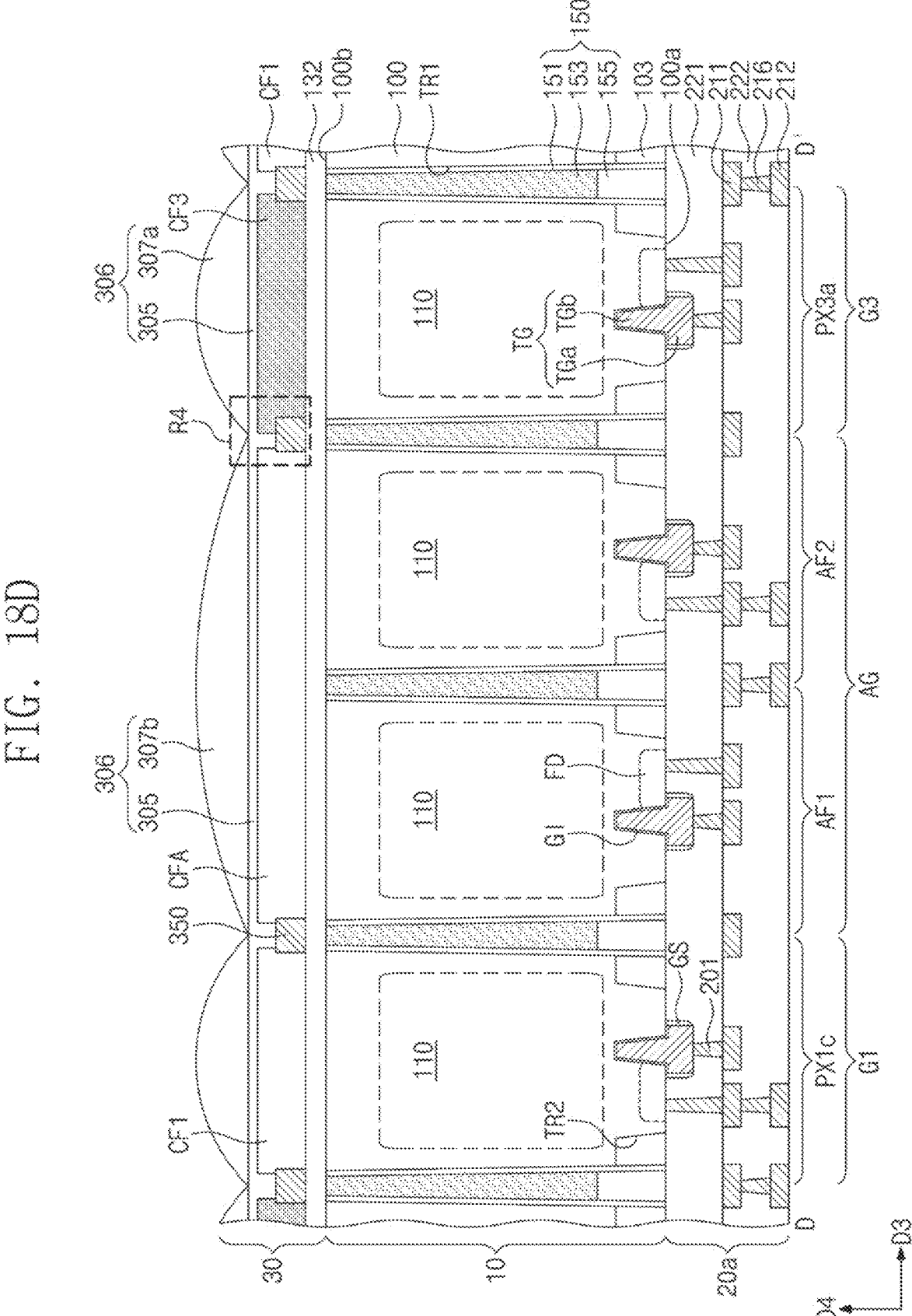
Figure 19A:
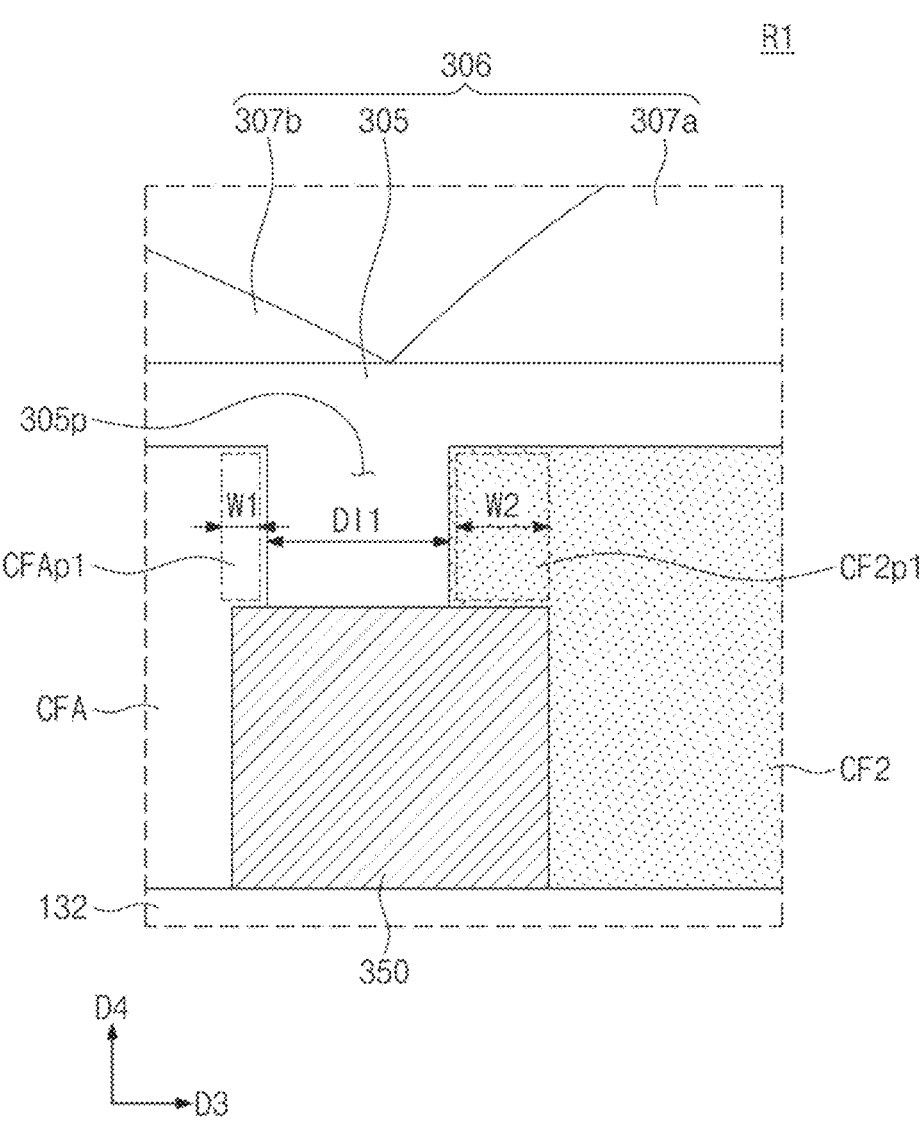
FIG. 19A is an enlarged cross-sectional view illustrating section R1 of FIG. 18A according to one or more embodiments of the disclosure.
Figure 19B:
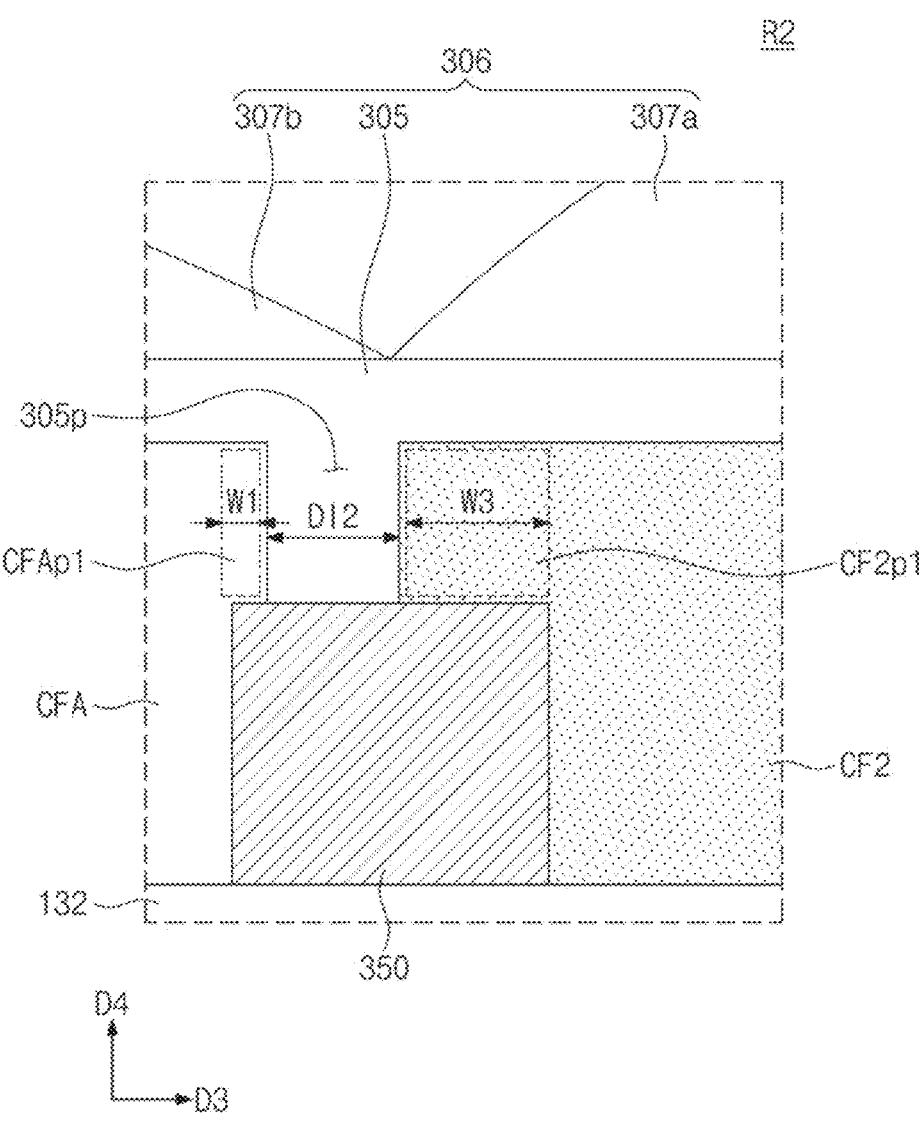
FIG. 19B is an enlarged cross-sectional view illustrating section R2 of FIG. 18B according to one or more embodiments of the disclosure.
Figure 19C:
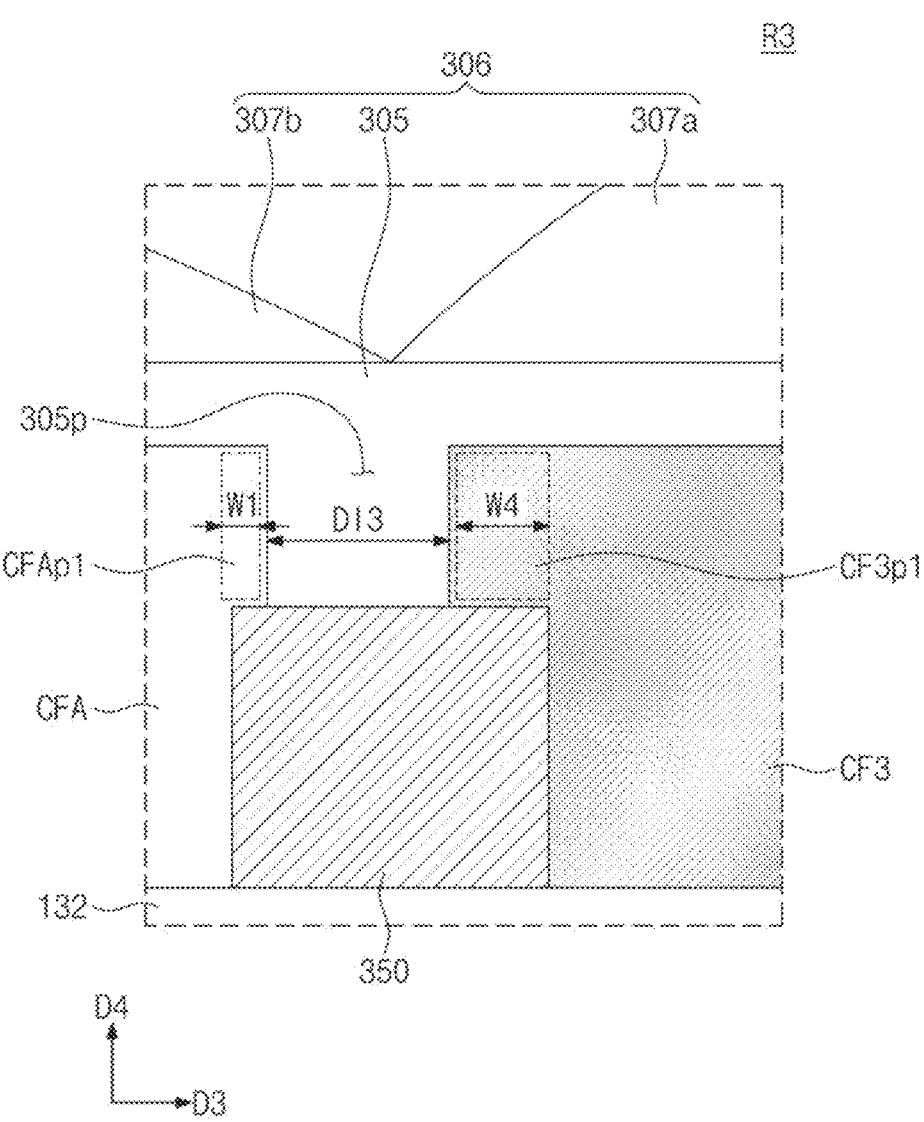
FIG. 19C is an enlarged cross-sectional view illustrating section R3 of FIG. 18C according to one or more embodiments of the disclosure.
Figure 19D:
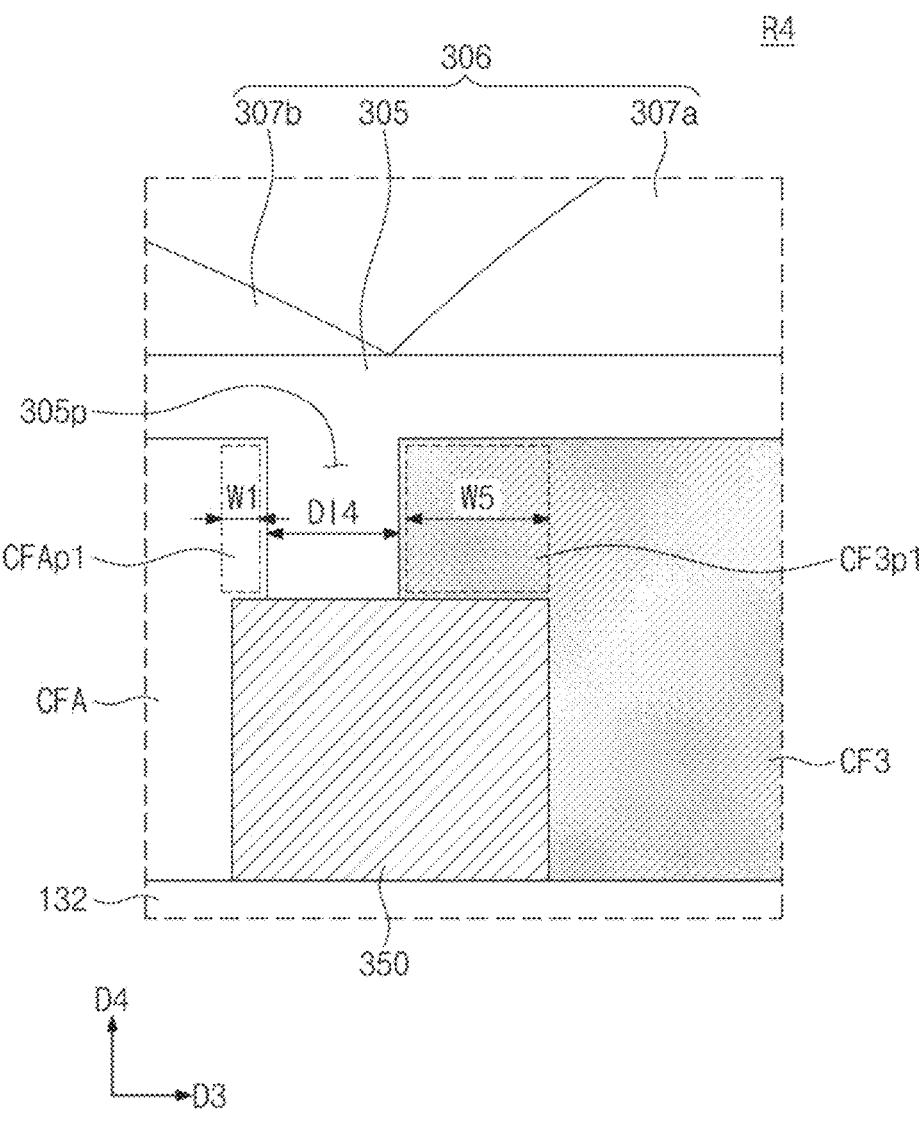
FIG. 19D is an enlarged cross-sectional view illustrating section R4 of FIG. 18D according to one or more embodiments of the disclosure.

FIG. 17 is an enlarged plan view of M depicted in FIG. 2, illustrating an image sensor according to one or more embodiments of the disclosure. FIGS. 18A, 18B, 18C, and 18D are cross-sectional views respectively taken along lines A-A', B-B', C-C', and D-D' of FIG. 17 according to one or more embodiments of the disclosure. FIG. 19A is an enlarged cross-sectional view illustrating section R1 of FIG. 18A according to one or more embodiments of the disclosure. FIG. 19B is an enlarged cross-sectional view illustrating section R2 of FIG. 18B according to one or more embodiments of the disclosure. FIG. 19C is an enlarged cross-sectional view illustrating section R3 of FIG. 18C according to one or more embodiments of the disclosure. FIG. 19D is an enlarged cross-sectional view illustrating section R4 of FIG. 18D according to one or more embodiments of the disclosure. Repeated descriptions made with reference to FIGS. 4, 5A to 5D, and 6A to 6D may be omitted.

Referring to FIGS. 17 and 18A to 18D, the image sensor may have a 2×2 Tetra pixel arrangement. The autofocus pixel group AG may have 2×1 arranged pixels. Each of the first, second, and third pixel groups G1, G2, and G3 may have three pixels arranged in a 2×2 arrangement. An autofocus color filter CFA may be disposed on the autofocus pixel group AG. The first color filter CF1 may be disposed on the first pixel group G1. The autofocus color filter CFA may be spaced apart from the first color filter CF1. The autofocus color filter CFA may be, for example, a green color filter.

The first pixel group G1 may include a first pixel PX1a adjacent to the first autofocus pixel AF1 in the third direction D3, a first pixel PX1b adjacent to the second autofocus pixel AF2 in the second direction D2, and a first pixel PX1c adjacent to the first autofocus pixel AF1 in the second direction D2. The second pixel group G2 may include a second pixel PX2a adjacent to the second autofocus pixel AF2 in the third direction D3, a second pixel PX2b adjacent to the first autofocus pixel AF1 in the first direction D1, and a second pixel PX2c adjacent to the second autofocus pixel AF2 in the third direction D3. The third pixel group G3 may have a structure substantially the same as that of the second pixel group G2.

Referring to FIG. 19A, the autofocus color filter CFA may include a first protrusion CFAp1 adjacent to the second color filter CF2 in the third direction D3. The first protrusion CFAp1 of the autofocus color filter CFA may protrude in a direction toward the second pixel PX2a. The first protrusion CFAp1 of the autofocus color filter CFA may vertically overlap or at least partially vertically overlap the light-shield pattern 350. The second color filter CF2 may include a first protrusion CF2p1 adjacent to the autofocus color filter CFA in the third direction D3. The first protrusion CF2p1 of the second color filter CF2 may protrude in a direction toward the second autofocus pixel AF2. The first protrusion CF2p1 of the second color filter CF2 may vertically overlap or at least partially vertically overlap the light-shield pattern 350.

The first protrusion CFAp1 of the autofocus color filter CFA may have a first width W1 in the third direction D3. The first protrusion CF2p1 of the second color filter CF2 may have a second width W2 in the third direction D3. The second width W2 may be greater than the first width W1. A first distance DI1 may be a minimum distance in the third direction D3 between the autofocus color filter CFA and the second color filter CF2. The first distance DI1 may be a minimum distance between the first protrusion CFAp1 of the autofocus color filter CFA and the first protrusion CF2p1 of the second color filter CF2.

Referring to FIG. 19B, the first protrusion CF2p1 of the second color filter CF2 that is closer than the second color filter CF2 (described with reference to FIG. 19A) to the edge of the first substrate 100 (e.g., adjacent to the pad area PAD described with reference to FIG. 2) may have a third width W3. The third width W3 may be greater than the second width W2. For example, the first protrusion CF2p1 of the second color filter CF2 may have a width that increases in the third direction D3. A second distance DI2 may be a minimum distance between the first protrusion CF2p1 of the second color filter CF2 and the first protrusion CFAp1 of the autofocus color filter CFA that is closer than the autofocus color filter CFA described with reference to FIG. 19A to the edge of the first substrate 100. The second distance DI2 may be less than the first distance DI1.

Referring to FIG. 19B, the autofocus color filter CFA may include a first protrusion CFAp1 adjacent to the third color filter CF3 in the third direction D3. The first protrusion CFAp1 of the autofocus color filter CFA may protrude in a direction toward the third pixel PX3a. The third color filter CF3 may include a first protrusion CF3p1 adjacent in the third direction D3 to the first color filter CF1. The first protrusion CF3p1 of the third color filter CF3 may protrude in a direction toward the second autofocus pixel AF2. The first protrusion CF3p1 of the third color filter CF3 may vertically overlap or at least partially vertically overlap the light-shield pattern 350.

The first protrusion CF3p1 of the third color filter CF3 may have a fourth width W4 in the third direction D3. The fourth width W4 may be greater than the first width W1. A third distance DI3 may be a minimum distance in the third direction D3 between the autofocus color filter CFA and the third color filter CF3. The third distance DI3 may be a minimum distance between the first protrusion CFAp1 of the autofocus color filter CFA and the first protrusion CF3p1 of the third color filter CF3.

Referring to FIG. 19D, the first protrusion CF3p1 of the third color filter CF3 that is closer than the third color filter CF3 (described with reference to FIG. 19C) to the edge of the first substrate 100 may have a fifth width W5. The fifth width W5 may be greater than the fourth width W4. For example, the first protrusion CF3p1 of the third color filter CF3 may have a width that increases in the third direction D3. A fourth distance DI4 may be a minimum distance between the first protrusion CF3p1 of the third color filter CF3 and the first protrusion CFAp1 of the autofocus color filter CFA that is closer than the autofocus color filter CFA described with reference to FIG. 19C to the edge of the first substrate 100. The fourth distance DI4 may be less than the third distance DI3.

Figure 20A:
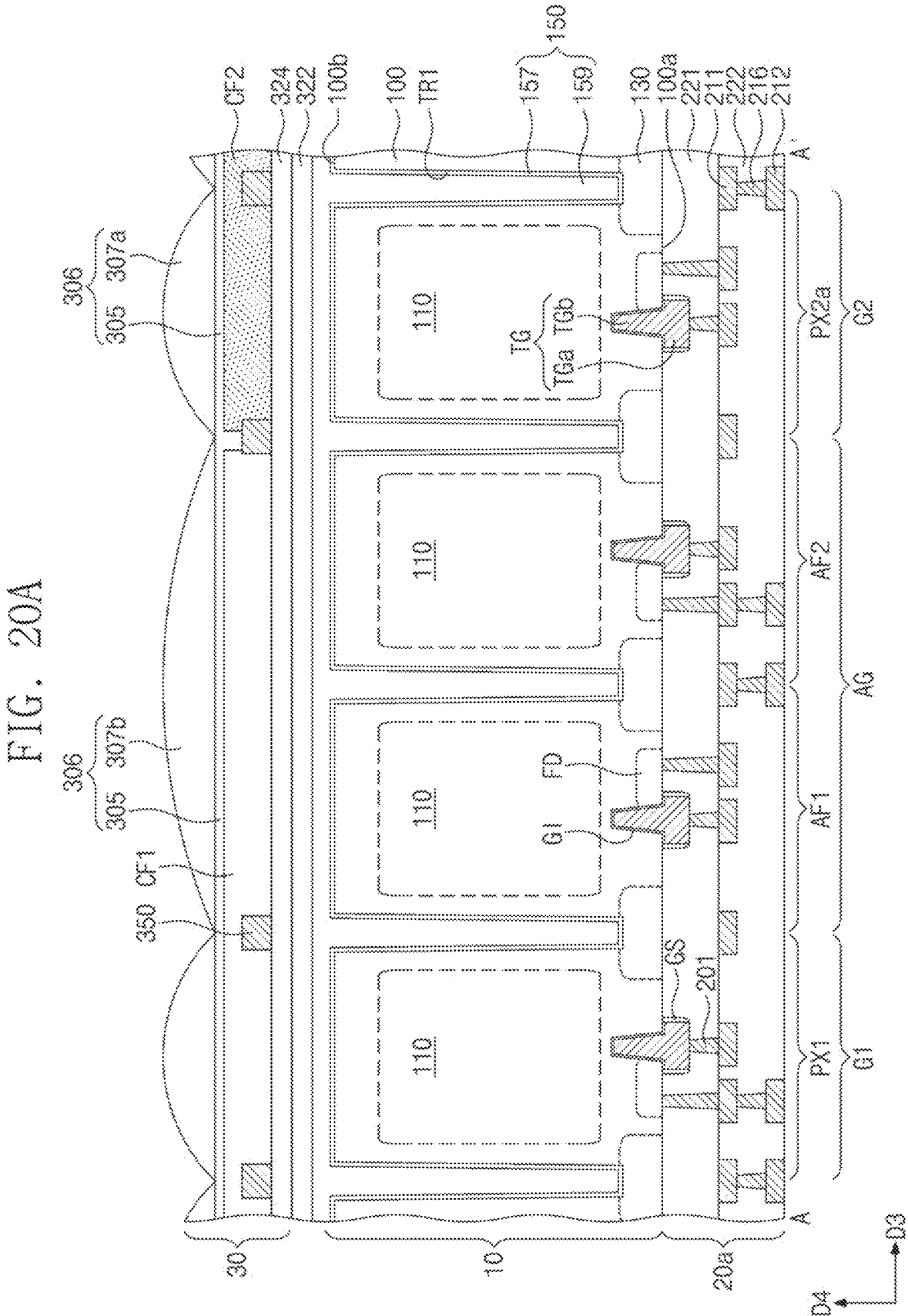
FIGS. 20A, 20B and 20C are cross-sectional views taken along line A-A' of FIG. 4, illustrating an image sensor according to one or more embodiments of the disclosure.
Figure 20B:
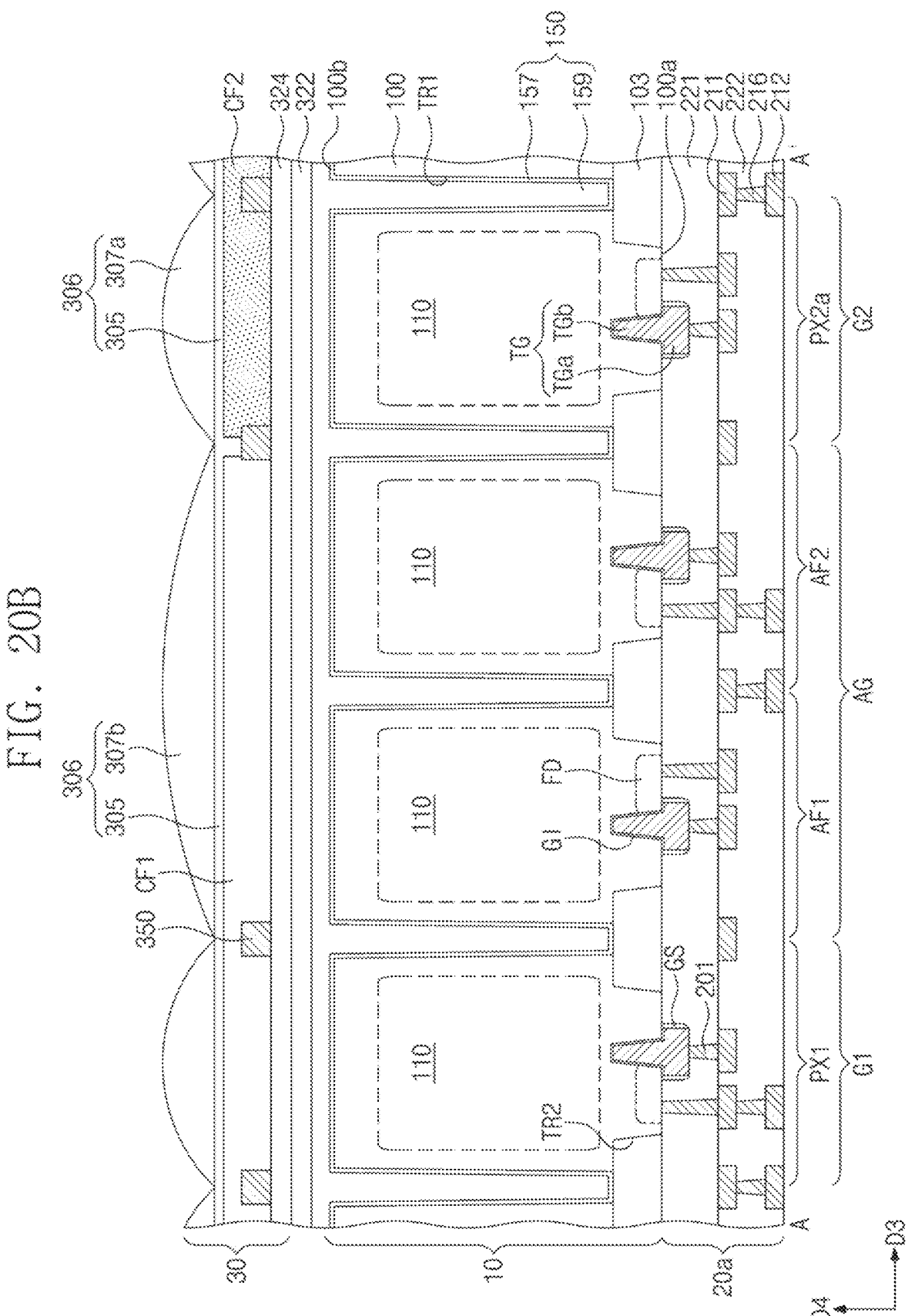
Figure 20C:
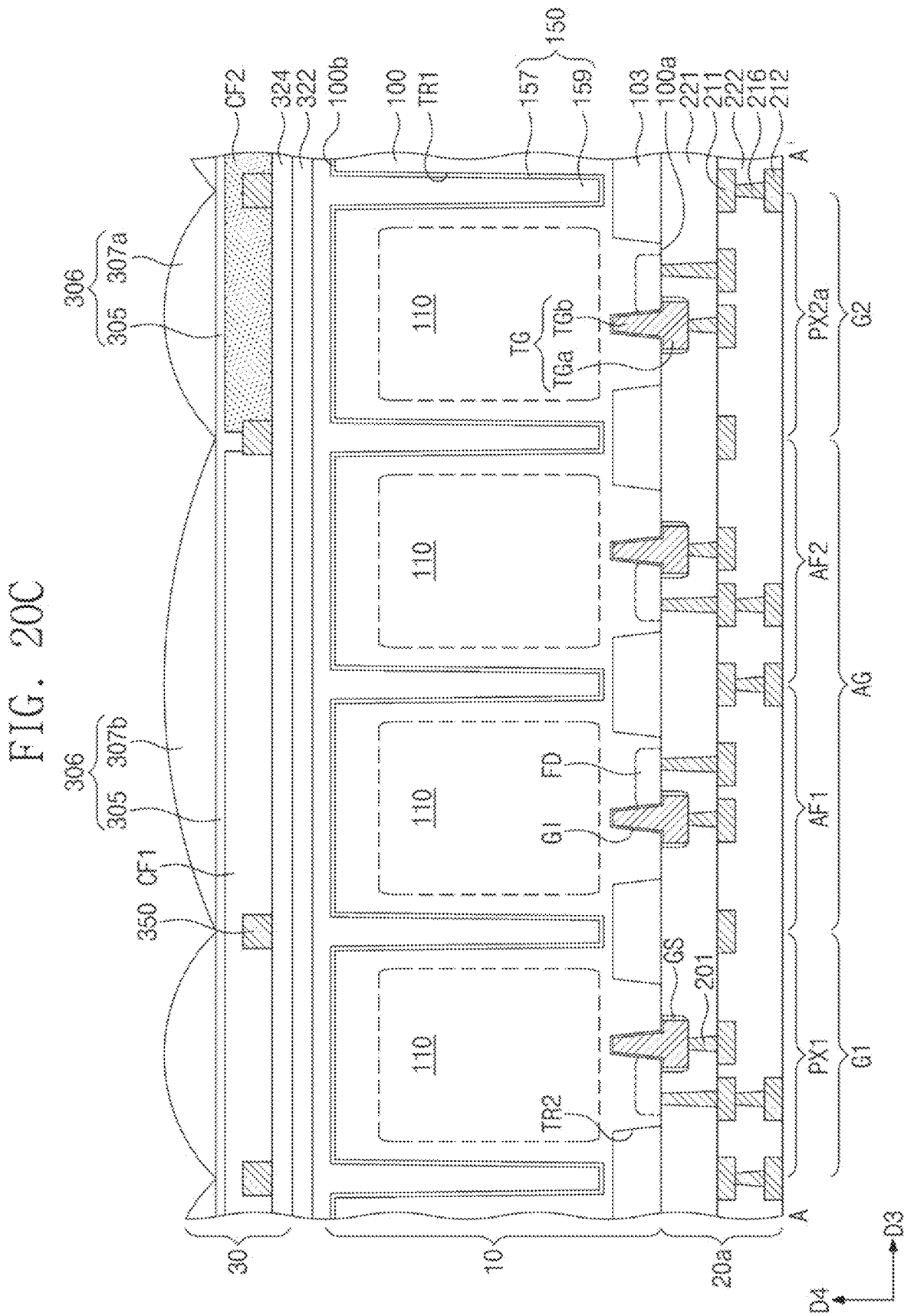

FIGS. 20A, 20B and 20C are cross-sectional views taken along line A-A' of FIG. 4, illustrating an image sensor according to one or more embodiments of the disclosure. Repeated descriptions made with reference to FIGS. 4, 5A to 5D, and 6A to 6D may be omitted.

Referring to FIG. 20A, the pixel isolation pattern 150 may be provided in the first trench TR1. The first trench TR1 may be recessed from the second surface 100b of the first substrate 100. The pixel isolation pattern 150 may have a width that decreases in a direction from the second surface 100b toward the first surface 100a of the first substrate 100.

The pixel isolation pattern 150 may include a fixed charge layer 157 conformally provided along an inner wall of the first trench TR1 and a buried dielectric pattern 159 provided on the fixed charge layer 157. The fixed charge layer 157 may have a negative fixed charge. The fixed charge layer 157 may be formed of one of metal oxide and metal fluoride that include at least one metal selected from hafnium (Hf), zirconium (Zr), aluminum (Al), tantalum (Ta), titanium (Ti), yttrium (Y), and lanthanide. For example, the fixed charge layer 157 may be a hafnium oxide layer or an aluminum oxide layer. Hole accumulation may occur around the fixed charge layer 157. Therefore, dark current and white spot may be effectively reduced. The buried dielectric pattern 159 may include a dielectric material with excellent step coverage. For example, the buried dielectric pattern 159 may include a silicon oxide layer. The fixed charge layer 157 may extend onto the second surface 100b of the first substrate 100. The buried dielectric pattern 159 may also extend onto the second surface 100b of the first substrate 100. A doped region 130 may be provided between the pixel isolation pattern 150 and the first surface 100a of the first substrate 100. The doped region 130 may have the first conductivity type (e.g., p-type). The doped region 130 may surround or at least partially surround a bottom surface of the pixel isolation pattern 150.

Referring to FIG. 20B, the pixel isolation pattern 150 may be substantially the same as the pixel isolation pattern 150 of FIG. 20A, and the first device isolation pattern 103 may contact the pixel isolation pattern 150. The first device isolation pattern 103 may be interposed between the pixel isolation pattern 150 and the first surface 100a of the first substrate 100.

Referring to FIG. 20C, the pixel isolation pattern 150 may be substantially the same as the pixel isolation pattern 150 of FIG. 20A, and the first device isolation pattern 103 may be provided between the pixel isolation pattern 150 and the first surface 100a of the first substrate 100. The first device isolation pattern 103 and the pixel isolation pattern 150 may be vertically spaced apart from each other. For example, a portion of the first substrate 100 may extend between the first device isolation pattern 103 and the pixel isolation pattern 150.

Figure 21:
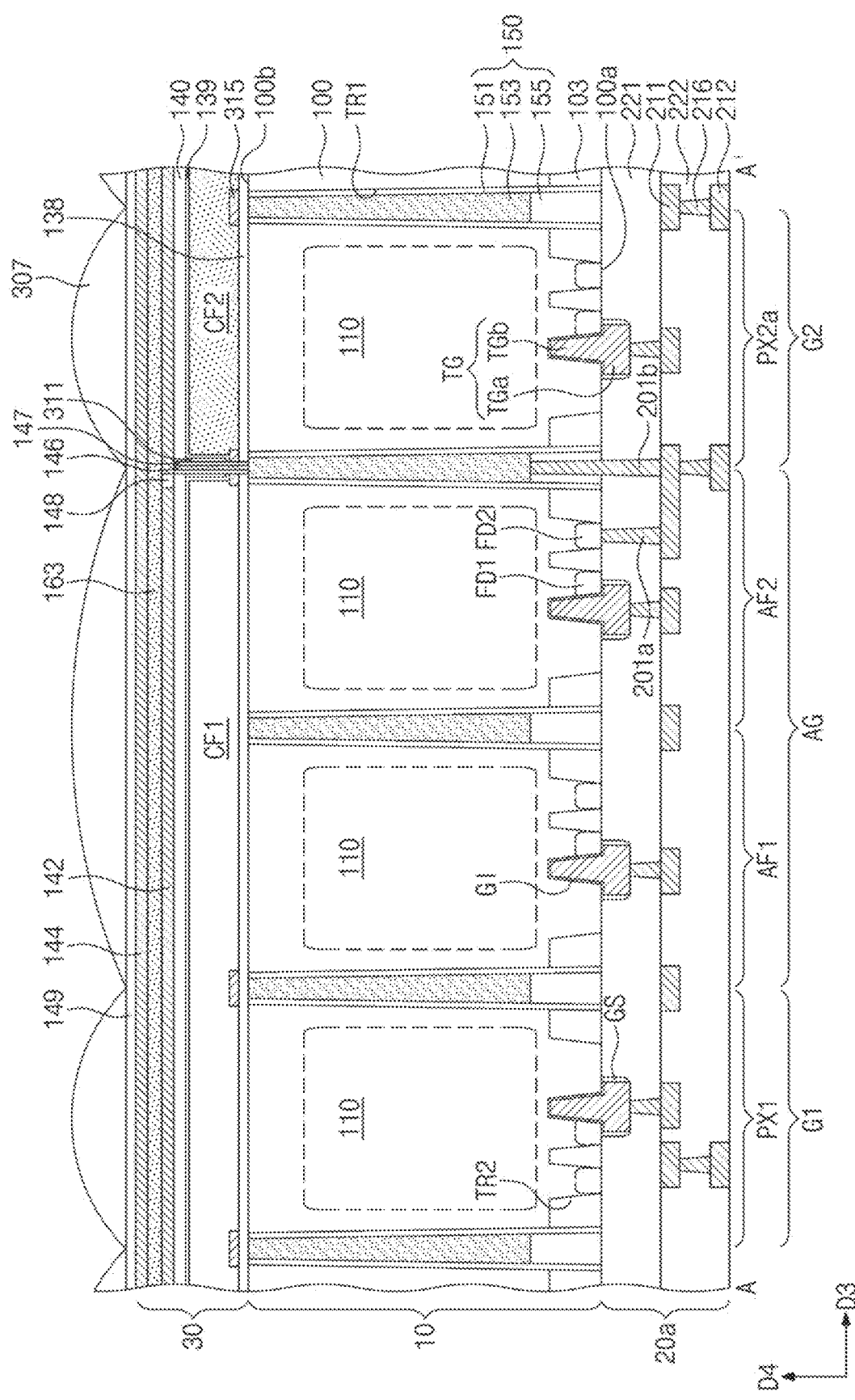
FIG. 21 is a cross-sectional view taken along line A-A' of FIG. 4, illustrating an image sensor according to one or more embodiments of the disclosure.

FIG. 21 is a cross-sectional view taken along line A-A' of FIG. 4, illustrating an image sensor according to one or more embodiments of the disclosure. Repeated descriptions made with reference to FIGS. 4, 5A to 5D, and 6A to 6D may be omitted.

Referring to FIGS. 4 and 21, a first floating diffusion region FD1 and a second floating diffusion region FD2 may be provided adjacent to the first surface 100a of the first substrate 100. The first device isolation pattern 103 may separate the second floating diffusion region FD2 from the first floating diffusion region FD1.

A first dielectric layer 138 may be provided on the second surface 100b of the first substrate 100. The first dielectric layer 138 may be provided thereon with the color filters CF1, CF2, and CF3 for corresponding pixels. The first dielectric layer 138 may be provided thereon with a light-shield layer 315 between the color filters CF1, CF2, and CF3. A second dielectric layer 139 may cover or at least partially cover a top surface of the light-shield layer 315 and lateral and top surfaces of the color filters CF1, CF2, and CF3. A low-refractive pattern 311 may fill a space between the color filters CF1, CF2, and CF3.

A third dielectric layer 140 may be provided on the second dielectric layer 139 and the low-refractive pattern 311. The third dielectric layer 140 may be provided thereon with a pixel electrode 142 for each pixel. A dielectric pattern 148 may be interposed between the pixel electrodes 142. The dielectric pattern 148 may include, for example, a silicon oxide layer or a silicon nitride layer. A photoelectric conversion pattern 163 may be provided on the pixel electrodes 142. A common electrode 144 may be provided on the photoelectric conversion pattern 163. A passivation layer 149 may be provided on the common electrode 144. The first and second microlenses 307a and 307b may be provided on the passivation layer 149.

The pixel electrode 142 and the common electrode 144 may include one or more of indium tin oxide (ITO), indium zinc oxide (IZO), zinc oxide (ZnO), and an organic transparent conductive material. The photoelectric conversion pattern 163 may be, for example, an organic photoelectric conversion layer. The photoelectric conversion pattern 163 may include a p-type organic semiconductor material and an n-type organic semiconductor material, and the p-type organic semiconductor material and the n-type organic semiconductor material may form a p-n junction. Alternatively, the photoelectric conversion pattern 163 may include quantum dots or chalcogenide.

The pixel electrode 142 may be electrically connected through a via plug 146 to the pixel isolation pattern 150. For example, the pixel electrode 142 may be electrically connected to the second isolation pattern 153 of the pixel isolation pattern 150. The via plug 146 may penetrate the third dielectric layer 140, the low-refractive pattern 311, the second dielectric layer 139, the light-shield layer 315, and the first dielectric layer 138 to come into contact with the pixel isolation pattern 150. A sidewall of the via plug 146 may be covered or at least partially covered with a via dielectric layer 147. The pixel isolation pattern 150 may be electrically connected to the second floating diffusion region FD2 through the first upper wiring line 211 and first and second upper contacts 201a and 201b. The first upper contacts 201a may be coupled to one or more of the transfer gate TG and the first and second floating diffusion regions FD1 and FD2. The second upper contact 201b may be coupled to the second isolation pattern 153. A top surface of the second upper contact 201b may be located at a higher level than that of top surfaces of the first upper contacts 201a.

Figure 22:
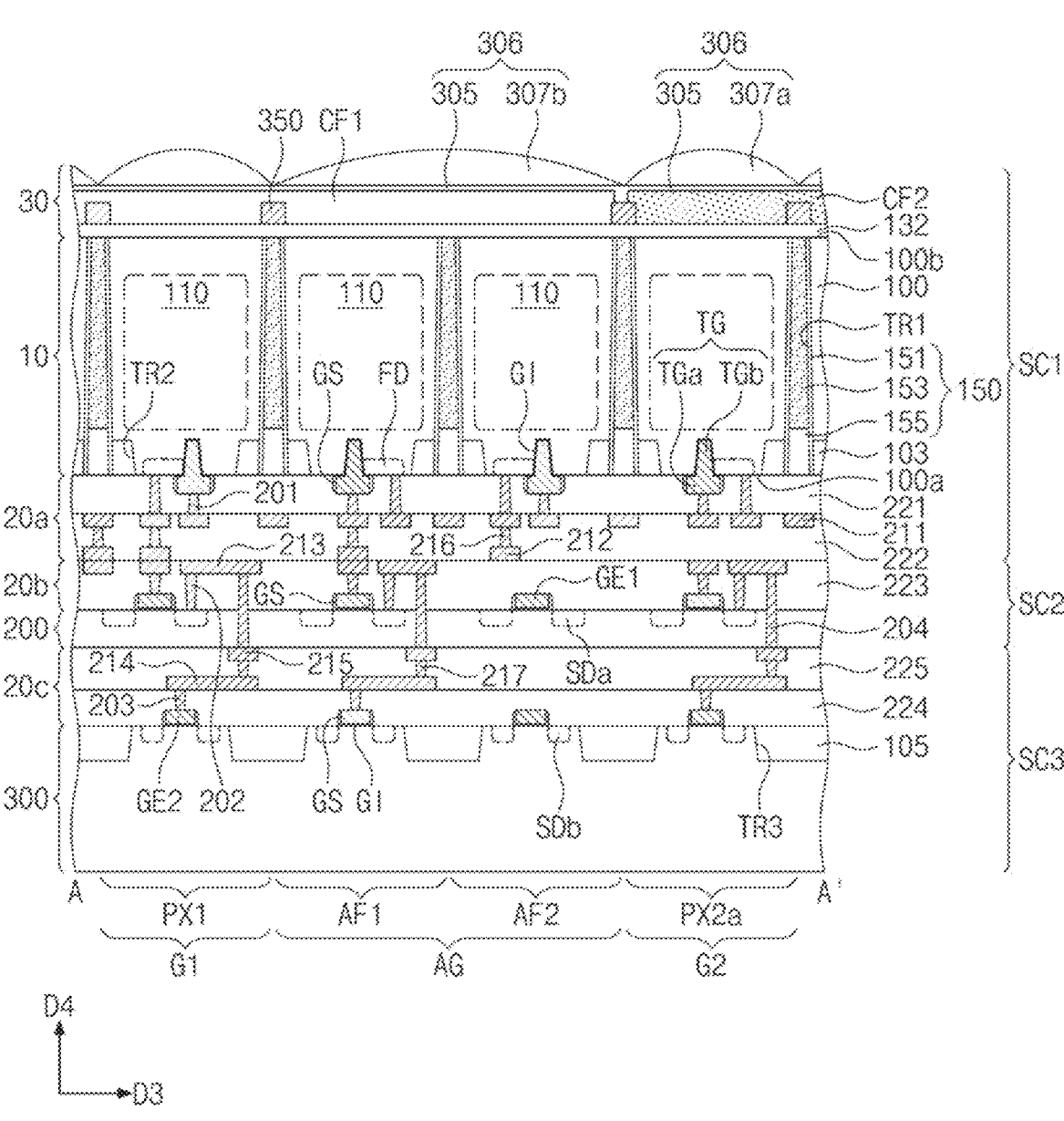
FIG. 22 is a cross-sectional view taken along line A-A' of FIG. 4, illustrating an image sensor according to one or more embodiments of the disclosure.

FIG. 22 is a cross-sectional view taken along line A-A' of FIG. 4, illustrating an image sensor according to one or more embodiments of the disclosure. Repeated descriptions made with reference to FIGS. 4, 5A to 5D, and 6A to 6D may be omitted.

Referring to FIG. 22, a second semiconductor chip SC2 may be stacked below a first semiconductor chip SC1. A third semiconductor chip SC3 may be stacked below the second semiconductor chip SC2. The second semiconductor chip SC2 may include a second substrate 200 and a second wiring layer 20b. The second substrate 200 may be a silicon substrate or an SOI substrate. The second substrate 200 may include impurities having a first conductivity type. A first gate electrode GE1 may be disposed on the second substrate 200. First source/drain regions SDa may be provided on opposite sides of the first gate electrode GE1. The first source/drain regions SDa may be provided in the second substrate 200. For example, the first source/drain region SDa may have a second conductivity type (e.g., n-type) opposite to that of the second substrate 200.

A second wiring layer 20b may be provided between the first wiring layer 20a and the second substrate 200. The second wiring layer 20b may include an intermediate dielectric layer 223, an intermediate contact 202, and an intermediate wiring line 213. The intermediate dielectric layer 223 may cover or at least partially cover the first gate electrodes GE1. The intermediate dielectric layer 223 may include a non-conductive material. The intermediate wiring lines 213 may be provided in the intermediate dielectric layer 223. The intermediate wiring lines 213 may be provided in an upper portion of the intermediate dielectric layer 223. The intermediate contacts 202 may be provided in the intermediate dielectric layer 223. The intermediate contact 202 may be connected to one of the first gate electrode GE1 or the first source/drain region SDa.

The intermediate wiring line 213 may be connected through the intermediate contact 202 to one of the first gate electrode GE1 and the first source/drain region SDa. The intermediate wiring line 213 of the second wiring layer 20b may contact the second upper wiring line 212 of the first wiring layer 20a. For example, a thermocompression process may be employed to bond the intermediate wiring line 213 to the second upper wiring line 212. A connection contact 204 may be provided to penetrate the second substrate 200. The connection contact 204 may electrically connect the third semiconductor chip SC3 to the second semiconductor chip SC2. The intermediate contact 202, the intermediate wiring line 213, and the connection contact 204 may include a metallic material.

The third semiconductor chip SC3 may include a third substrate 300 and a third wiring layer 20c. The third wiring layer 20c may be provided between the third substrate 300 and the second substrate 200. The third substrate 300 may be a silicon substrate or an SOI substrate. The third substrate 300 may include impurities having the first conductivity type. A second device isolation pattern 105 may be provided in the third substrate 300. For example, the second device isolation pattern 105 may be provided in a third trench TR3. The second device isolation pattern 105 may have a structure the same as or similar to that of the first device isolation pattern 103.

A second gate electrode GE2 may be disposed on the third substrate 300. Second source/drain regions SDb may be provided on opposite sides of the second gate electrode GE2. The second source/drain regions SDb may be provided in the third substrate 300. For example, the second source/drain region SDb may have the second conductivity type (e.g., n-type) opposite to that of the third substrate 300. The second gate electrode GE2 and the second source/drain regions SDb may form a logic transistor. The logic transistor may constitute logic circuits.

The third wiring layer 20c may include lower dielectric layers 224 and 225, lower contacts 203, lower wiring lines 214 and 215, and lower vias 217. The lower dielectric layers 224 and 225 may include a first lower dielectric layer 224 and a second lower dielectric layer 225. The first lower dielectric layer 224 may cover or at least partially cover the second gate electrode GE2. The second lower dielectric layer 225 may be provided on a bottom surface of the first lower dielectric layer 224. The first and second lower dielectric layers 224 and 225 may include a non-conductive material.

The lower wiring lines 214 and 215 may be provided in the second lower dielectric layer 225. The lower wiring lines 214 and 215 may include first lower wiring lines 214 and second lower wiring lines 215. First lower wiring lines 214 may be provided in a lower portion of the second lower dielectric layer 225. Second lower wiring lines 215 may be provided in an upper portion of the second lower dielectric layer 225. The connection contact 204 may be disposed between and electrically connect the second lower wiring line 215 and the intermediate wiring line 213.

The lower vias 217 may be provided in the second lower dielectric layer 225. The lower vias 217 may connect the first lower wiring lines 214 to the second lower wiring lines 215. The lower contacts 203 may penetrate the first lower dielectric layer 224. One of the lower wiring lines 214 and 215 may be connected through the lower contact 203 to one of the second gate electrode GE2 or the second source/drain region SDb.

An arrangement of the lower wiring lines 214 and 215 is not limited to that shown, but may be variously changed. The lower wiring lines 214 and 215, the lower vias 217, and the lower contacts 203 may include a metallic material.

Figure 23:
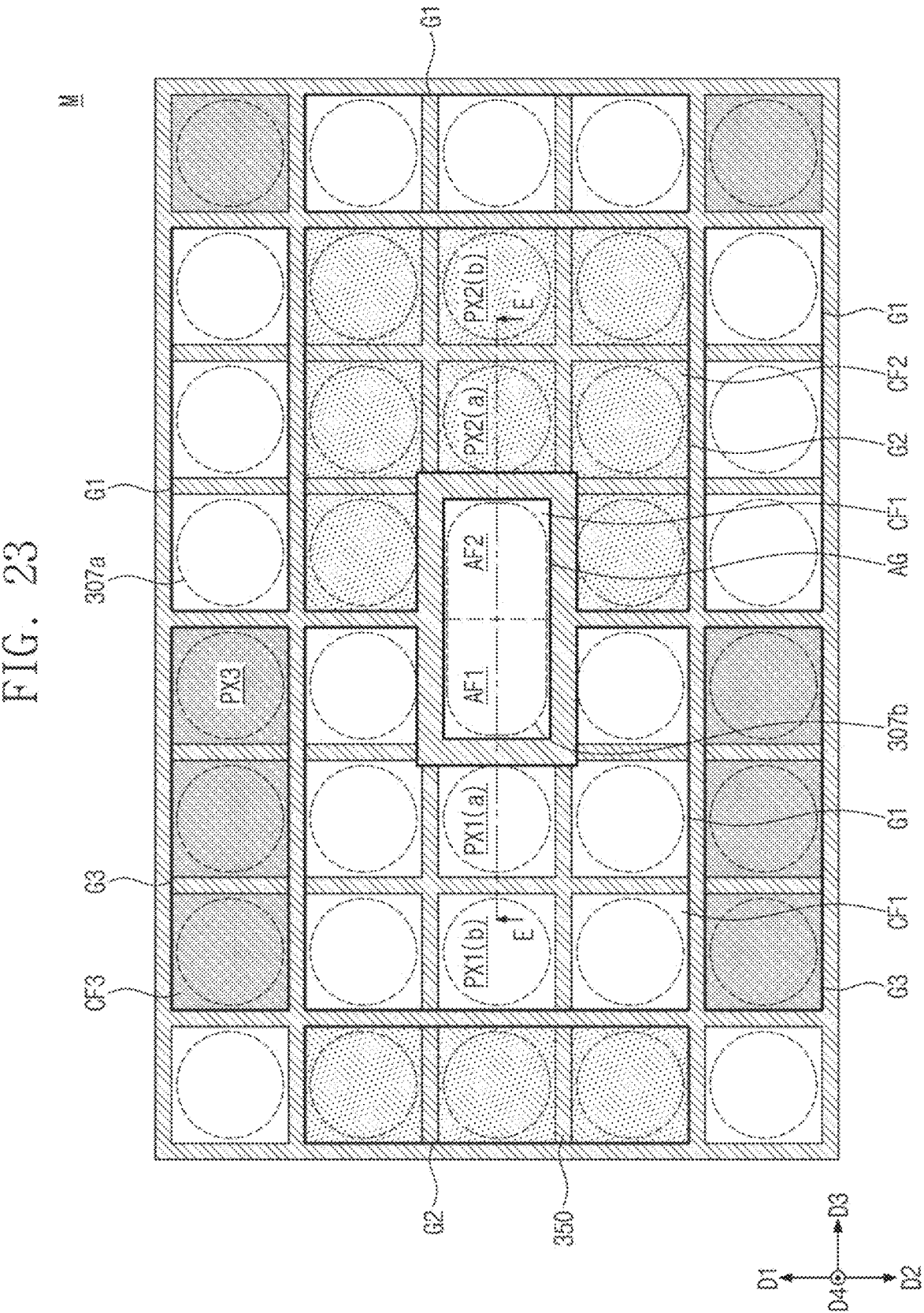
FIG. 23 is an enlarged plan view illustrating section M of an image sensor depicted in FIG. 2 according to one or more embodiments of the disclosure.
Figure 24A:
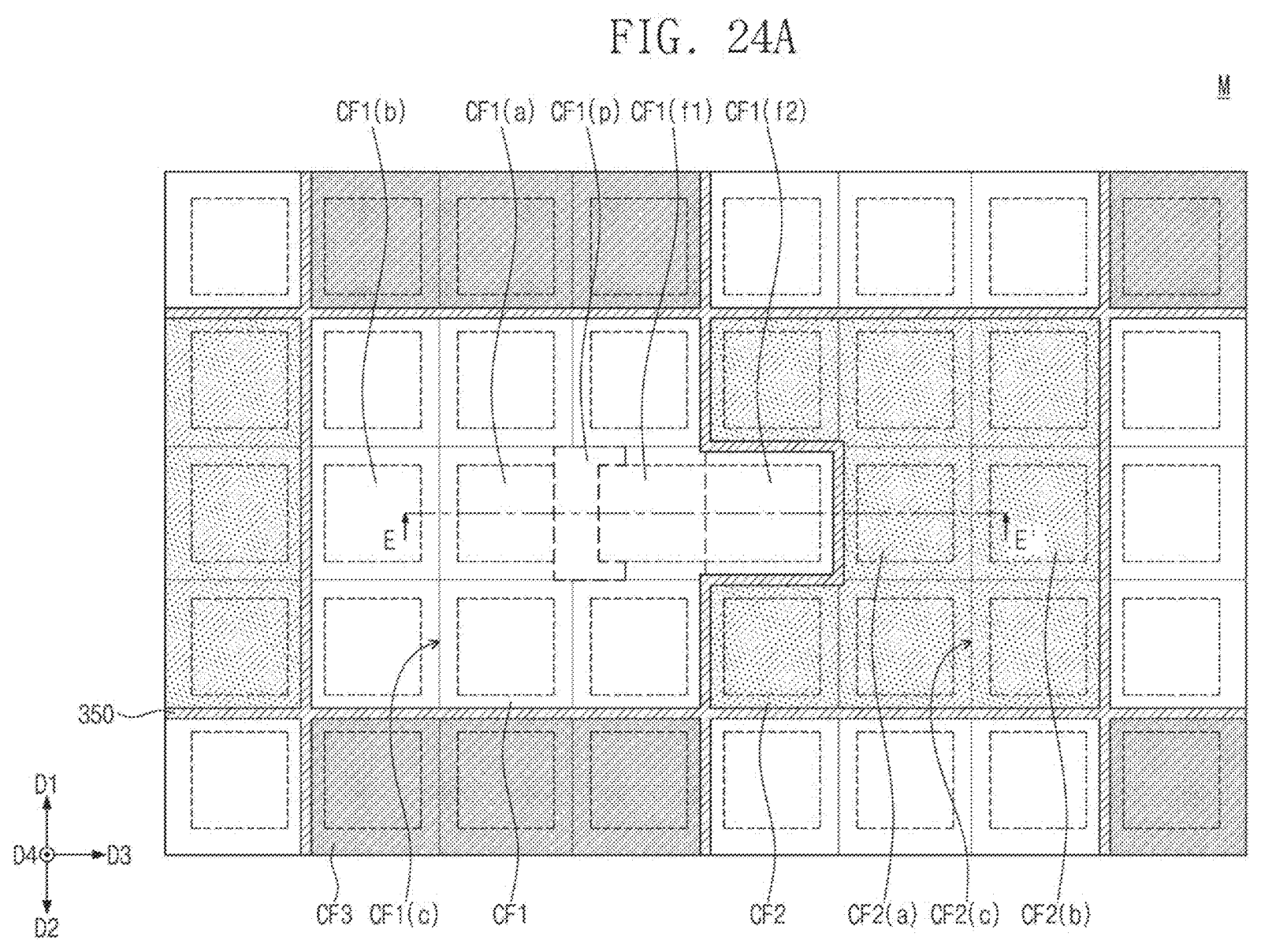
Figure 24B:
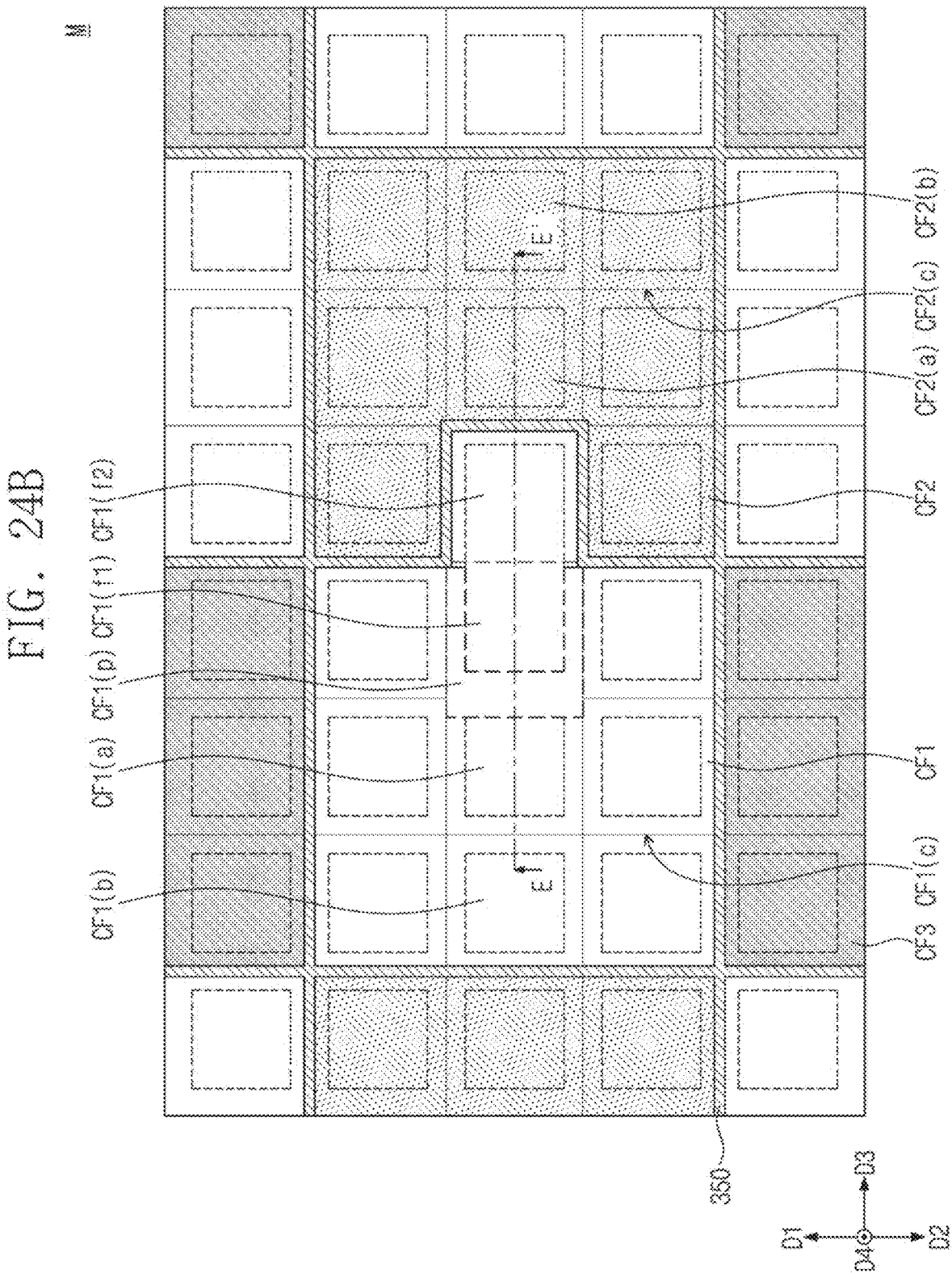
Figure 25:
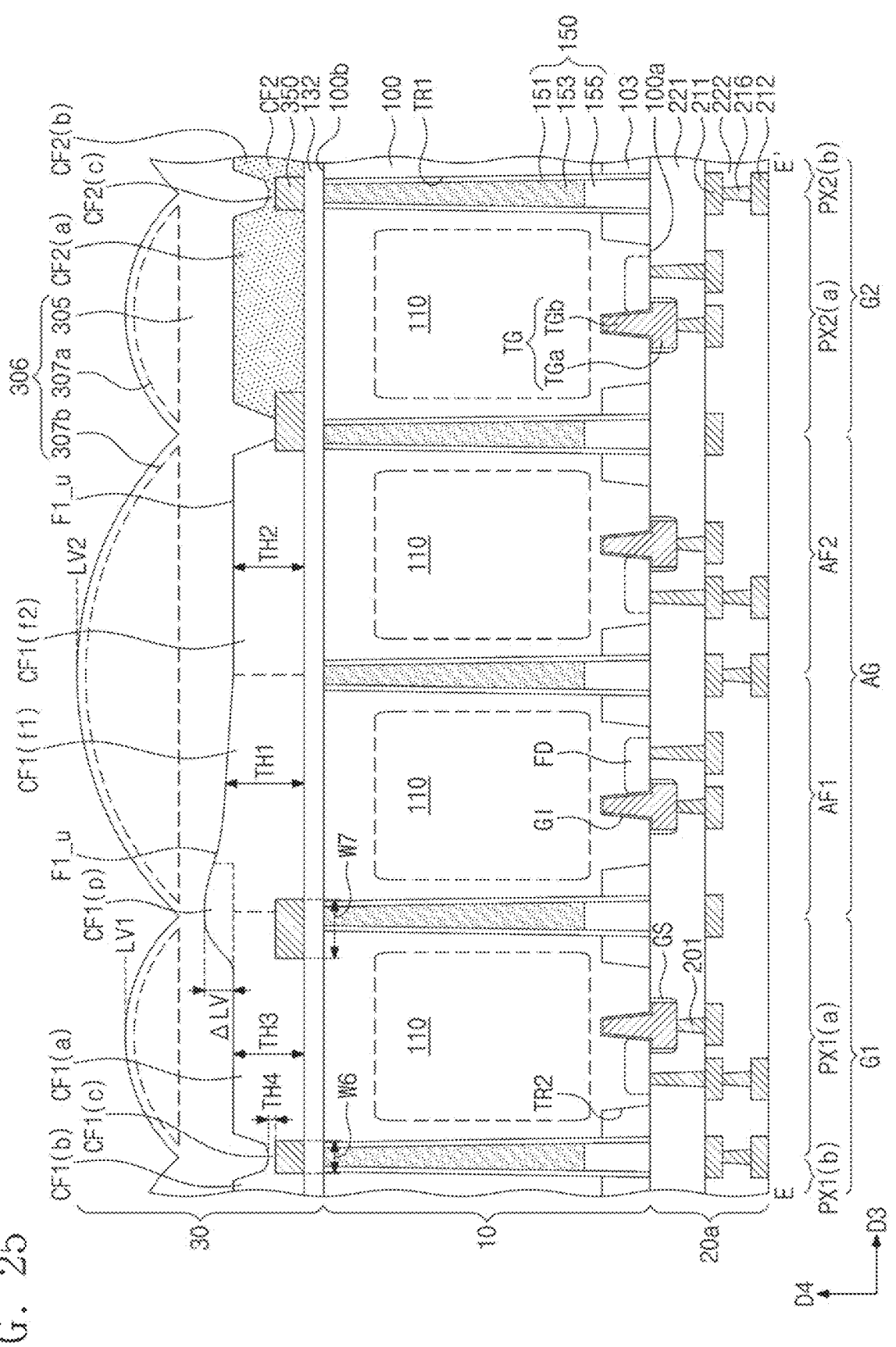
FIG. 25 is a cross-sectional view illustrating an image sensor taken along line E-E' of FIG. 23, 24A, or 24B according to one or more embodiments of the disclosure.

FIG. 23 is an enlarged plan view illustrating section M of an image sensor depicted in FIG. 2 according to one or more embodiments of the disclosure. FIGS. 24A and 24B are enlarged plan views illustrating section M of an image sensor depicted in FIG. 2 according to one or more embodiments of the disclosure. FIG. 25 is a cross-sectional view illustrating an image sensor taken along line E-E' of FIG. 23, 24A, or 24B according to one or more embodiments of the disclosure.

Referring to FIGS. 23, 24A, and 25, an image sensor according to one or more embodiments may include a plurality of pixels PX1, PX2, PX3, AF1, and AF2. The plurality of pixels PX1, PX2, PX3, and PX4 may include image pixels PX1, PX2, and PX3 and AF pixels AF1 and AF2. The image pixels PX1, PX2, and PX3 may include first, second, and third image pixels PX1, PX2, and PX3 for image sensing. The first image pixel PX1 may detect a light component of a first color. The third image pixel PX2 may detect a light component of a second color. The third image pixel PX3 may detect a light component of a third color. The AF pixels AF1 and AF2 may include first and second AF pixels AF1 and AF2 that are adjacent to each other and detect phases. For example, the image sensor may perform an autofocus correction function by comparing with each other a phase of an image detected by the first AF pixel AF1 and a phase of an image detected by the second AF pixel AF2.

The first image pixels PX1 may constitute first pixel groups G1. One first pixel group G1 may include the first image pixels PX1 arranged in a 3×3 arrangement. The second image pixels PX2 may constitute second pixel groups G2. One second pixel group G2 may include the second image pixels PX2 arranged in a 3×3 arrangement. The third image pixels PX3 may constitute third pixel groups G3. One third pixel group G3 may include the third image pixels PX3 arranged in a 3×3 arrangement. Although one pixel group includes image pixels arranged in a 3×3 arrangement in the present embodiment, the disclosure is not limited thereto, and one pixel group may include image sensors arranged in a 2×2 arrangement, or a 4×4 or large arrangement.

An AF pixel group AG may be disposed between the first pixel group G1 and the second pixel group G2. Although the AF pixel group AG includes the AF pixels AF1 and AF2 arranged in a 2×1 arrangement in the present embodiment, the disclosure is not limited thereto. The AF pixel group AG may include the AF pixels AF1 and AF2 arranged in an m×n arrangement. The m and/or n may each be a natural number equal to or greater than 2. In one or more embodiments, the first AF pixel AF1 may correspond to one first image pixel PX1 adjacent to the second pixel group G2 among the first image pixels PX1 of the first pixel group G1. Therefore, the first pixel group G1 adjacent to the AF pixel group AG may include eight first image pixels PX1 obtained by subtracting one pixel from pixels arranged in the 3×3 arrangement. Likewise, the second AF pixel AF2 may correspond to one second image pixel PX2 adjacent to the first pixel group G1 among the second image pixels PX2 of the second pixel group G2. Therefore, the second pixel group G2 adjacent to the AF pixel group AG may include eight second image pixels PX2 obtained by subtracting one pixel from pixels arranged in the 3×3 arrangement.

A backside dielectric layer 132 may be disposed on the second surface 100b of the first substrate 100. The backside dielectric layer 132 may include a fixed charge layer in contact with the second surface 100b of the first substrate 100. The fixed charge layer may have a negative fixed charge. The fixed charge layer may include metal oxide. The fixed charge layer may have a single-layered or multi-layered structure including one or more of aluminum oxide and hafnium oxide.

A light-shield pattern 350 may be disposed on the backside dielectric layer 132. The light-shield pattern 350 may have a grid shape in a plan view. The light-shield pattern 350 may overlap or at least partially overlap the pixel isolation pattern 150. The light-shield pattern 350 may be absent on (i.e., not provided on) the pixel isolation pattern 150 between the first AF pixel AF1 and the second AF pixel AF2. In a plan view, the light-shield pattern 350 may surround or at least partially surround the AF pixel group AG. As shown in FIG. 25, the light-shield pattern 350 may have a sixth width W6 on a position between the first image pixels PX1, between the second image pixels PX2, and between the third image pixels PX3. The light-shield pattern 350 may have a seventh width W7 on an edge of the AF pixel group AG. For example, the light-shield pattern 350 may have the seventh width W7 on the pixel isolation pattern 150 between the first AF pixel AF1 and its adjacent first image pixel PX1(a). The seventh width W7 may be greater than the sixth width W6. A portion of the light-shield pattern 350 may overlap or at least partially overlap the first and second image pixels PX1 and PX2 adjacent to the AF pixel group AG.

The backside dielectric layer 132 may be provided thereon with first, second, and third color filters CF1, CF2, and CF3. The first color filter CF1 may include a pigment of the first color. The first color filter CF1 may be disposed on the first pixel group G1 and the AF pixel group AG. The second color filter CF2 may include a pigment of the second color. The second color filter CF2 may be disposed on the second pixel group G2. The third color filter CF3 may include a pigment of the third color. The third color filter CF3 may be disposed on the third pixel group G3. The first color may be, for example, a green color. The second color may be, for example, a blue color. The third color may be, for example, a red color. A top surface of the light-shield pattern 350 may be partially exposed between the first, second, and third color filters CF1, CF2, and CF3.

The first image pixels PX1 may include a 1-1$^{st}$ image pixel PX1(a) and a 1-2$^{nd}$ image pixel PX1(b). The 1-1$^{st}$ image pixel PX1(a) may be disposed between the 1-2$^{nd}$ image pixel PX1(b) and the first AF pixel AF1. The second image pixels PX2 may include a 2-1$^{st}$ image pixel PX2(a) and a 2-2$^{nd}$ image pixel PX2(b). The 2-1$^{st}$ image pixel PX2(a) may be disposed between the 2-2$^{nd}$ image pixel PX2(b) and the second AF pixel AF2.

The first, second, and third color filters CF1, CF2, and CF3 may have uneven structures on top surfaces thereof. For example, the first color filter CF1 may include a first portion CF1(a) on the 1-1$^{st}$ image pixel PX1(a), a second portion CF1(b) on the 1-2$^{nd}$ image pixel PX1(b), and a connection portion CF1(c) on the pixel isolation pattern 150 between the 1-1$^{st}$ image pixel PX1(a) and the 1-2$^{nd}$ image pixel PX1(b). The first color filter CF1 may further include a third portion CF1(f1) on the first AF pixel AF1 and a fourth portion CF1(f2) on the second AF pixel AF2. The first color filter CF1 may further include a protrusion CF1(p) between the first portion CF1(a) and the third portion CF1(f1). The first portion CF1(a), the second portion CF1(b), the connection portion CF1(c), the third portion CF1(f1), the fourth portion CF1(f2), and the protrusion CF1(p) may be connected into a single unitary body.

The third portion CF1(f1) of the first color filter CF1 may have a first thickness TH1, and the fourth portion CF1(f2) may have a second thickness TH2. The first thickness TH1 may be greater than the second thickness TH2. The first thickness TH1 may increase in a direction from the fourth portion CF1(f2) toward the first portion CF1(a). The third portion CF1(f1) of the first color filter CF1 may have an inclined top surface F1_u. The fourth portion CF1(f2) of the first color filter CF1 may have a flat top surface. The first portion CF1(a) of the first color filter CF1 may have a third thickness TH3. The third thickness TH3 may be substantially the same as the second thickness TH2. The first portion CF1(a) of the first color filter CF1 may have a flat top surface. The second portion CF1(b) of the first color filter CF1 may have a flat top surface and the third thickness TH3. The connection portion CF1 (c) of the first color filter CF1 may have a fourth thickness TH4. The fourth thickness TH4 may be less than the third thickness TH3. The first color filter CF1 may have an inclined lateral surface at the fourth portion CF1(f2), the first portion CF1(a), and the second portion CF1(b).

The connection portion CF1(c) of the first color filter CF1 may cover or at least partially cover the light-shield pattern 350. The protrusion CF1(p) of the first color filter CF1 may overlap or at least partially overlap the pixel isolation pattern 150 between the first AF pixel AF1 and the 1-1$^{st}$ image pixel PX1(a). The protrusion CF1(p) of the first color filter CF1 may overlap or at least partially overlap the light-shield pattern 350. The protrusion CF1(p) of the first color filter CF1 may have a top end higher than the top surfaces of the first portion CF1(a), the third portion CF1(f1), and the fourth portion CF1(f2) of the first color filter CF1. A level difference ALV of about 10 nm to about 50 nm may be provided between an uppermost point of the protrusion CF1(p) of the first color filter CF1 and the top surface of the first portion CF1(a) of the first color filter CF1.

In a plan view, the protrusion CF1(p) of the first color filter CF1 may have a "C" shape as shown in FIG. 24A or 24B. A portion of the protrusion CF1(p) of the first color filter CF1 may be positioned in the first direction D1 or the second direction D2 between the first AF pixel AF1 and the first image pixels PX1. In a plan view, as shown in FIG. 24A, a portion of the protrusion CF1(p) of the first color filter CF1 may be spaced apart from the light-shield pattern 350 as shown in FIG. 24A, or may further extend in the third direction D3 to contact the light-shield pattern 350 as shown in FIG. 24B.

The second color filter CF2 may include a first portion CF2(a) on the 2-1$^{st}$ image pixel PX1(a), a second portion CF2(b) on the 2-2$^{nd}$ image pixel PX2(b), and a connection portion CF2(c) on the pixel isolation pattern 150 between the 2-1$^{st}$ image pixel PX2(a) and the 2-2$^{nd}$ image pixel PX2(b). The first portion CF2(a), the second portion CF2(b), and the connection portion CF2(c) of the second color filter CF2 may be connected into a single unitary body. The first portion CF2(a) and the second portion CF2(b) of the second color filter CF2 may each have a flat top surface and the third thickness TH3. The connection portion CF2 (c) of the second color filter CF2 may have the fourth thickness TH4. The fourth thickness TH4 may be less than the third thickness TH3. The second color filter CF2 may have an inclined lateral surface at the first portion CF2(a) and the second portion CF2(b). The third color filter CF3 may have a structure the same as or similar to that of the second color filter CF2.

A microlens section 306 may be disposed on the first, second, and third color filters CF1, CF2, and CF3. The microlens section 306 may include a flat portion 305 and first and second microlenses 307a and 307b on the flat portion 305. The first microlenses 307a may correspondingly overlap or at least partially overlap the first, second, and third image pixels PX1, PX2, and PX3. One second microlens 307b may cover or at least partially cover both the first and second AF pixels AF1 and AF2 that are adjacent to each other. The first microlenses 307a may have their top ends located at a first level LV1. The second microlens 307b may have a top end located at a second level LV2 higher than the first level LV1. The flat portion 305 of the microlens section 306 may be inserted into between the first, second, and third color filters CF1, CF2, and CF3 to contact the top surface of the light-shield pattern 350. Other structural features may be identical or similar to those described above.

In typical image sensors, the first color filter CF1 disposed on the AF pixels AF1 and AF2 may have a constant or substantially constant thickness. Among the AF pixels AF1 and AF2 included in the AF pixel group AG, a certain AF pixel whose color is different from that of an adjacent image pixel (or, the second AF pixel AF2 disposed below the first color filter CF1 having a different color from that of the second color filter CF2) may experience a large light loss to an adjacent image pixel (e.g., PX2(a)) caused by crosstalk and difference in wavelength of light due to color difference. For example, compared to the first AF pixel AF1, the second AF pixel AF2 may exhibit a large light loss. This may lead to photosensitivity imbalance between the AF pixels AF1 and AF2 and difficulty in detecting a phase difference therebetween, with the result that it may be hard to satisfactorily perform a function of autofocus correction.

In contrast, in the disclosure, the third portion CF1(f1) of the first color filter CF1 positioned on the first AF pixel AF1 may have the first thickness TH1 greater than the second thickness TH2 of the fourth portion CF1(f2) of the first color filter CF1. This configuration may reduce an amount of light that passes through the third portion CF1(f1) of the first color filter CF1, and thus the first AF pixel AF1 may have photosensitivity the same as or similar to that of the second AF pixel AF2. Therefore, a photosensitivity balance may be achieved between the first AF pixel AF1 and the second AF pixel AF2, and as a result, an autofocus correction function may be satisfactorily performed.

The AF pixel group AG may be provided thereon with the second microlens 307b, and a relatively large amount of light may be concentrated on the image pixels PX1 and PX2 adjacent to the AF pixel group AG. This may cause image defectiveness. However, in an image sensor according to the disclosure, as the light-shield pattern 350 has the seventh width W7 on an edge of the AF pixel group AG, the light-shield pattern 350 may partially overlap the image pixels PX1 and PX2 adjacent to the AF pixel group AG. Thus, an aperture ratio of the image pixels PX1 and PX2 adjacent to the AF pixel group AG may be reduced to prevent concentration of a relatively large amount of light. Therefore, an image sensor according to the disclosure may obtain overall uniform and sharp images. For example, in the disclosure, in order to compensate sensitivity properties and heterogeneous characteristics of an image pixel adjacent to an AF pixel, a width of a light-shield pattern may be used to adjust a pixel aperture. The aforementioned components may provide an image sensor according to the disclosure with high sensitivity properties at low illumination.

Figure 26:
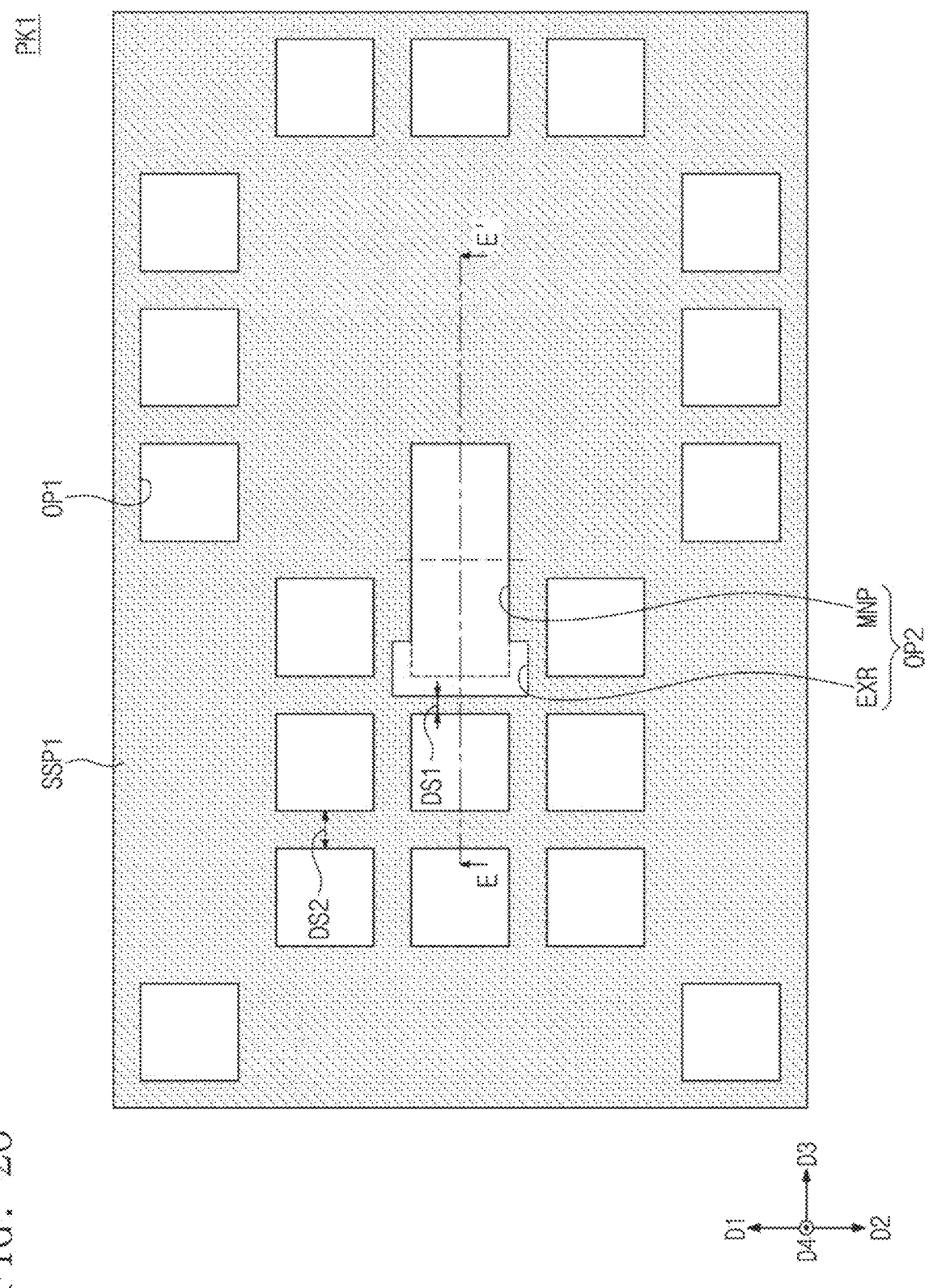
FIG. 26 is a plan view partially illustrating a first photomask for fabricating an image sensor according to one or more embodiments of the disclosure.
Figure 27:
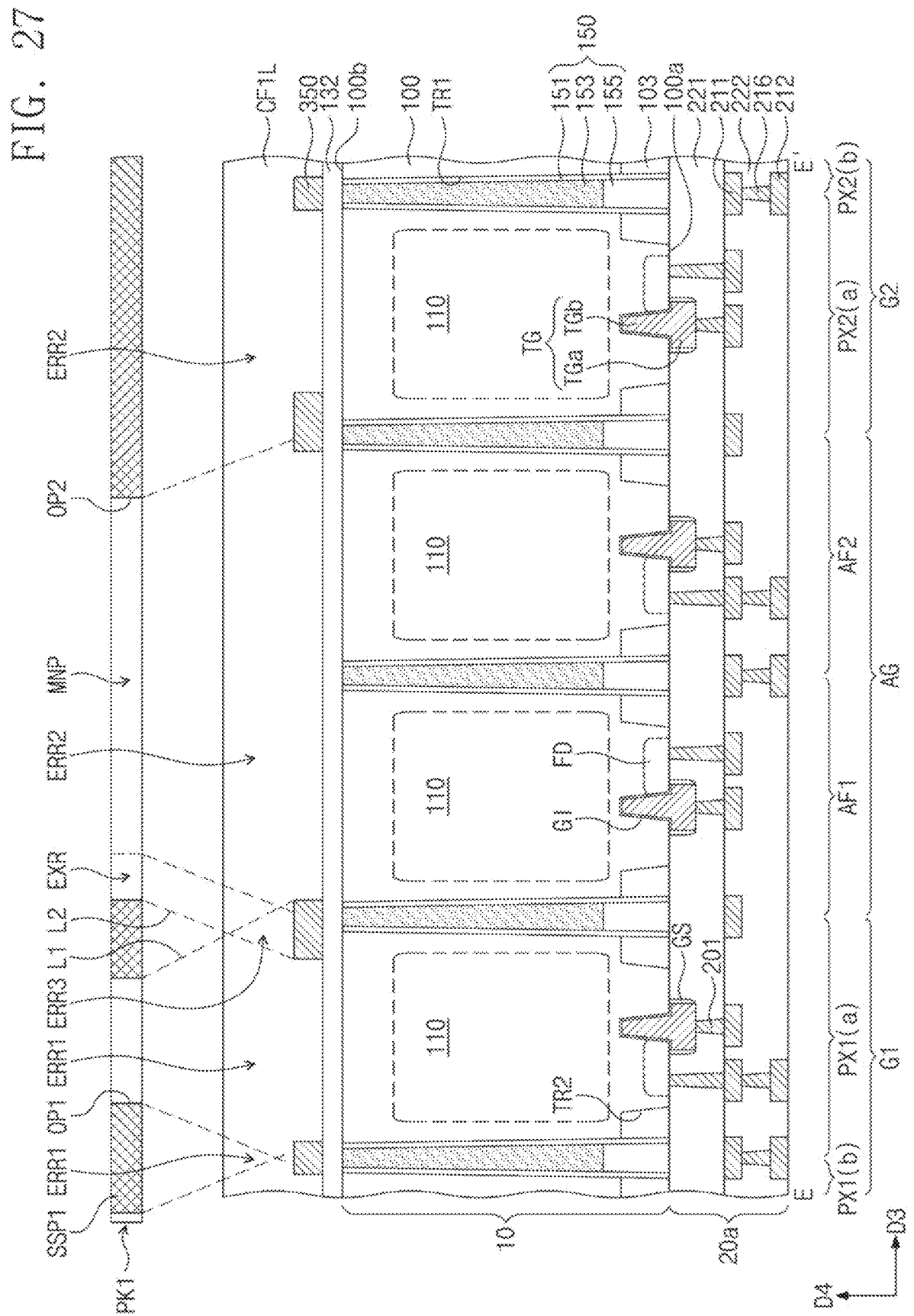
Figure 28:
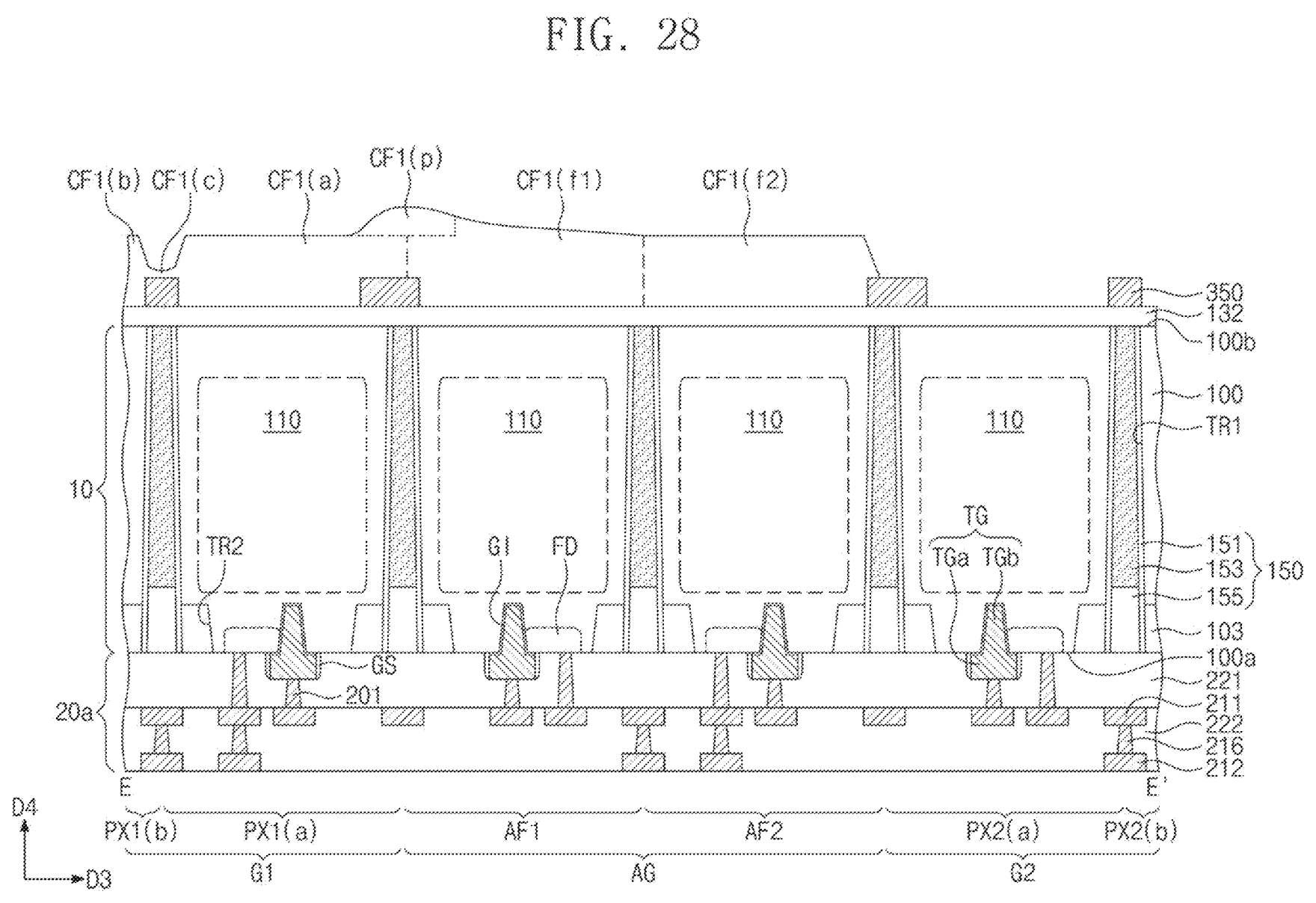
Figure 29:
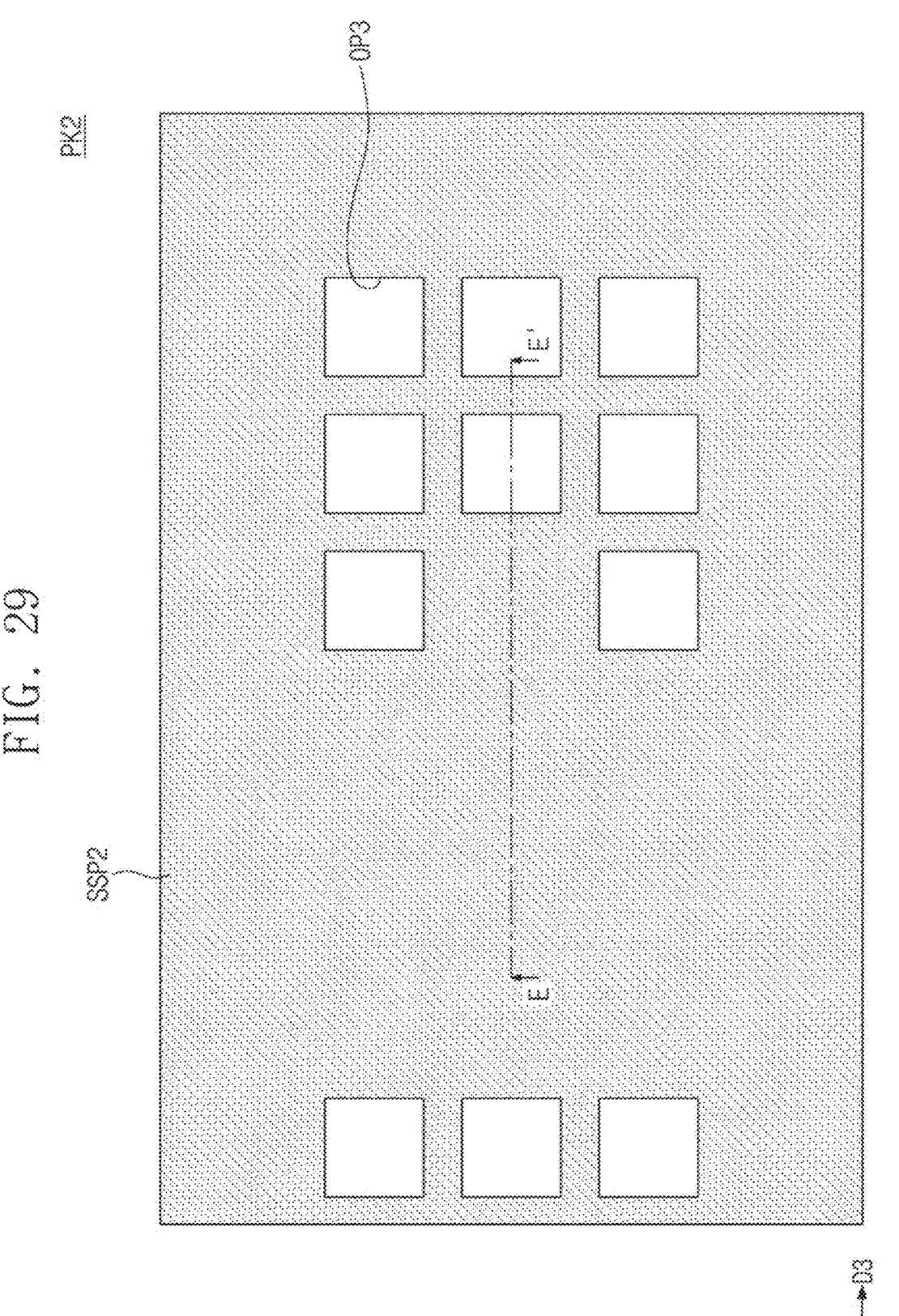
FIG. 29 is a plan view partially illustrating a second photomask for fabricating an image sensor according to one or more embodiments of the disclosure.
Figure 30:
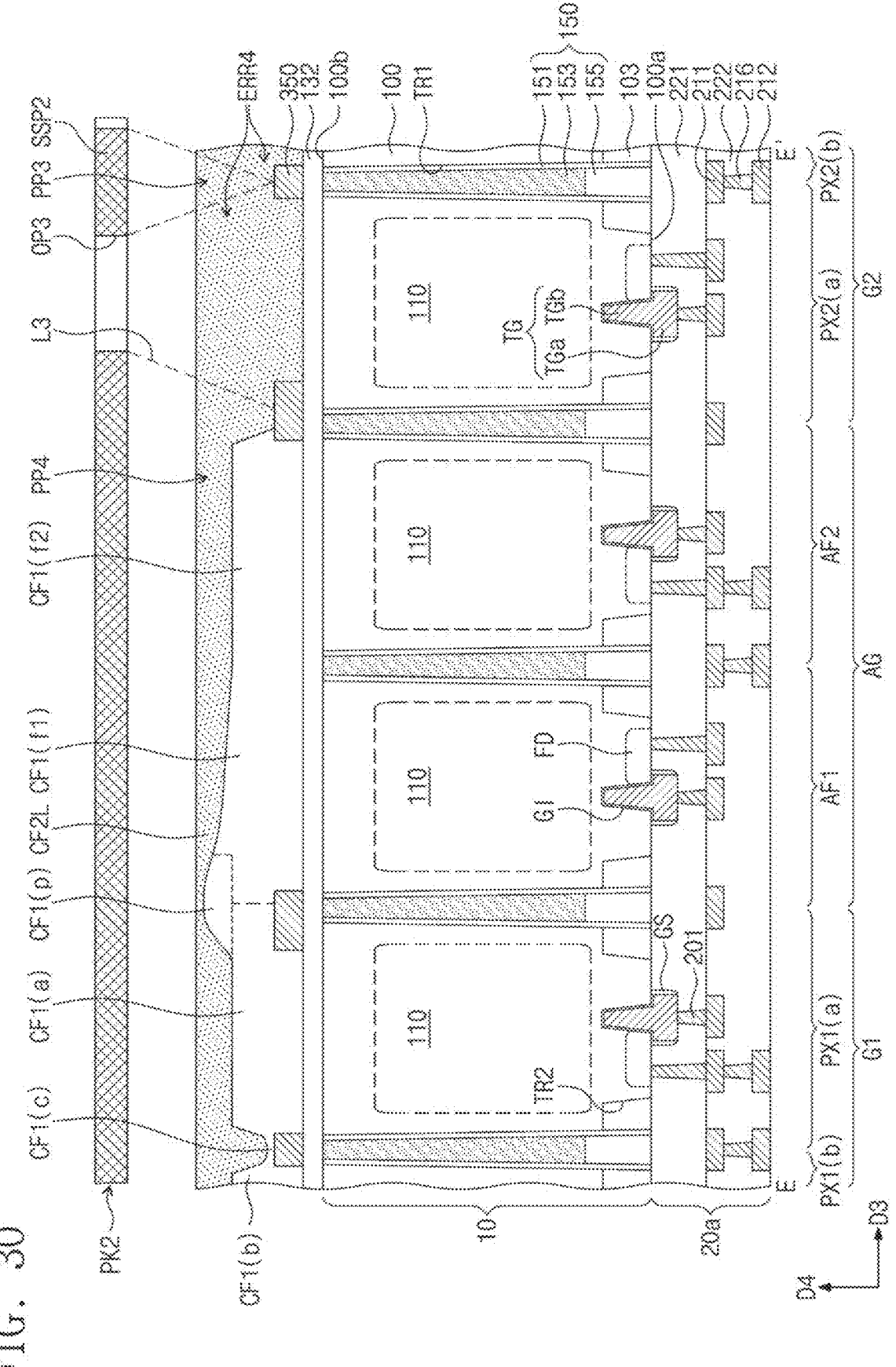

FIG. 26 is a plan view partially illustrating a first photomask for fabricating an image sensor according to one or more embodiments of the disclosure. FIGS. 27, 28, and 30 are cross-sectional views illustrating a method of fabricating an image sensor having a cross-section of FIG. 25 according to one or more embodiments of the disclosure. FIG. 29 is a plan view partially illustrating a second photomask for fabricating an image sensor according to one or more embodiments of the disclosure. FIG. 30 is a cross-sectional view taken along line E-E' of FIG. 29 according to one or more embodiments of the disclosure.

Referring to FIGS. 26 and 27, in the operation shown in FIG. 7C, a backside dielectric layer 132 may be formed on the second surface 100b of the first substrate 100. A light-shield pattern 350 may be formed on the backside dielectric layer 132. The light-shield pattern 350 may be formed to have a grid shape having a sixth width W6 and a seventh width W7 as described with reference to FIGS. 23 and 25. A first color filter layer CF1L may be coated and baked on the second surface 100b of the first substrate 100 on which the light-shield pattern 350 is formed. The first color filter layer CF1L may be a photoresist layer to which a pigment having a first color is added. A first photomask PK1 may be positioned on the second surface 100b of the first substrate 100, and then a first exposure process may be performed.

Referring to FIG. 26, the first photomask PK1 may have a first light-shield portion SSP1 and first and second transmission portions OP1 and OP2. The first light-shield portion SSP1 may be a segment through which light does not pass. The first and second transmission portions OP1 and OP2 may be segments through which light passes. The first transmission portions OP1 may have their square island shapes that are spaced apart from each other, and may define positions of 1-1$^{st}$ and 1-2$^{nd}$ portions CF1(a) and CF1(b) of a first color filter CF1. The second transmission portion OP2 may define an AF pixel group AG. The second transmission portion OP2 may have a main portion MNP having a bar shape elongated in the third direction D3 and an extension region EXR positioned at one end of the main portion MNP. The main portion MNP may define third and fourth portions CF(f1) and CF1(f2) of a first color filter CF1 depicted in FIG. 25. The extension region EXR may define a protrusion CF1(p) of a first color filter CF1 depicted in FIG. 25. The extension region EXR may be positioned between the main portion MNP and one of the first transmission portions OP1 that is adjacent to the second transmission portion OP2. The extension region EXR may be connected to the main portion MNP while being spaced apart from the first transmission portions OP1. The extension region EXR may cause that a first interval DS1 between the second transmission portion OP2 and its adjacent first transmission portion OP1 is less than a second interval DS2 between the first transmission portions OP1. The extension region EXR may have a "C" shape in a plan view.

In the first exposure process, first light L1 and second light L2 may pass through the first and second transmission portions OP1 and OP2 to enter the first color filter layer CF1L to form exposed portions ERR1, ERR2, and ERR3 and non-exposed portions PP1 and PP2 in the first color filter layer CF1L. The first light L1 may pass through the first transmission portions OP1. The second light L2 may pass through the second transmission portion OP2. A curing reaction may occur in the exposed portions ERR1, ERR2, and ERR3 in the first color filter layer CF1L. A first exposed portion ERR1 may be positioned below the first transmission portion OP1. A second exposed portion ERR2 may be positioned below the main portion MNP of the second transmission portion OP2. A third exposed portion ERR3 may be positioned between the first exposed portion ERR1 and the second exposed portion ERR2. The first light L1 and the second light L2 may be obliquely incident due to scattering, diffraction, and interference of light. The third exposed portion ERR3 may receive both the first light L1 and the second light L2, and thus an amount of light may be increased. An increase in amount of incident light may induce an increase in the degree of the curing reaction in the exposed portions ERR1, ERR2, and ERR3. A first non-exposed portion PP1 may be positioned below the first light-shield portion SSP1 between the first transmission portions OP1. A second non-exposed portion PP2 may be positioned below the first transmission portions OP1 and the second transmission portion OP2.

Referring to FIG. 28, a development process may be performed to remove the non-exposed portions PP1 and PP2 of the first color filter layer CF1L. Therefore, a first color filter CF1 may be formed which is described with reference to FIGS. 24A and 25. The third exposed portion ERR3 may receive a large amount of light and undergo a lot of curing reaction and may thus be thicker than other exposed portions ERR1 and ERR2. Therefore, a protrusion CF1(*p*) of the first color filter CF1 may be formed. In addition, the extension region EXR of the second transmission portion OP2 may allow an increase in amount of light incident on a third portion CF1(*f*1) of the first color filter CF1, and thus the third portion CF1(*f*1) of the first color filter CF1 may be formed to have a first thickness TH1 that is relatively large as shown in FIG. 25.

Referring to FIGS. 29 and 30, a second color filter layer CF2L may be formed on the first color filter CF1. The second color filter layer CF2L may be a photoresist layer to which a pigment having a second color is added. A second photomask PK2 may be positioned on the second surface 100*b* of the first substrate 100, and then a second exposure process may be performed.

Referring to FIG. 29, the second photomask PK2 may have a second light-shield portion SSP2 and third transmission portions OP3. The third transmission portions OP3 may have their square island shapes that are spaced apart from each other, and may define positions of 2-1$^{st}$ and 2-2$^{nd}$ portions CF2(*a*) and CF2(*b*) of a second color filter CF2.

In the second exposure process, light L3 may pass through the third transmission portions OP3 of the second photomask PK2 to enter the second color filter layer CF2L to form exposed portions ERR4 and non-exposed portions PP3 and PP4 in the second color filter layer CF2L. A development process may be subsequently performed to remove the non-exposed portions PP3 and PP4 of the second color filter layer CF2L to form a second color filter CF2 of FIGS. 24A and 25. The same or similar method may be performed to form a third color filter CF3. Other process steps may be identical or similar to those described above.

Figure 31:
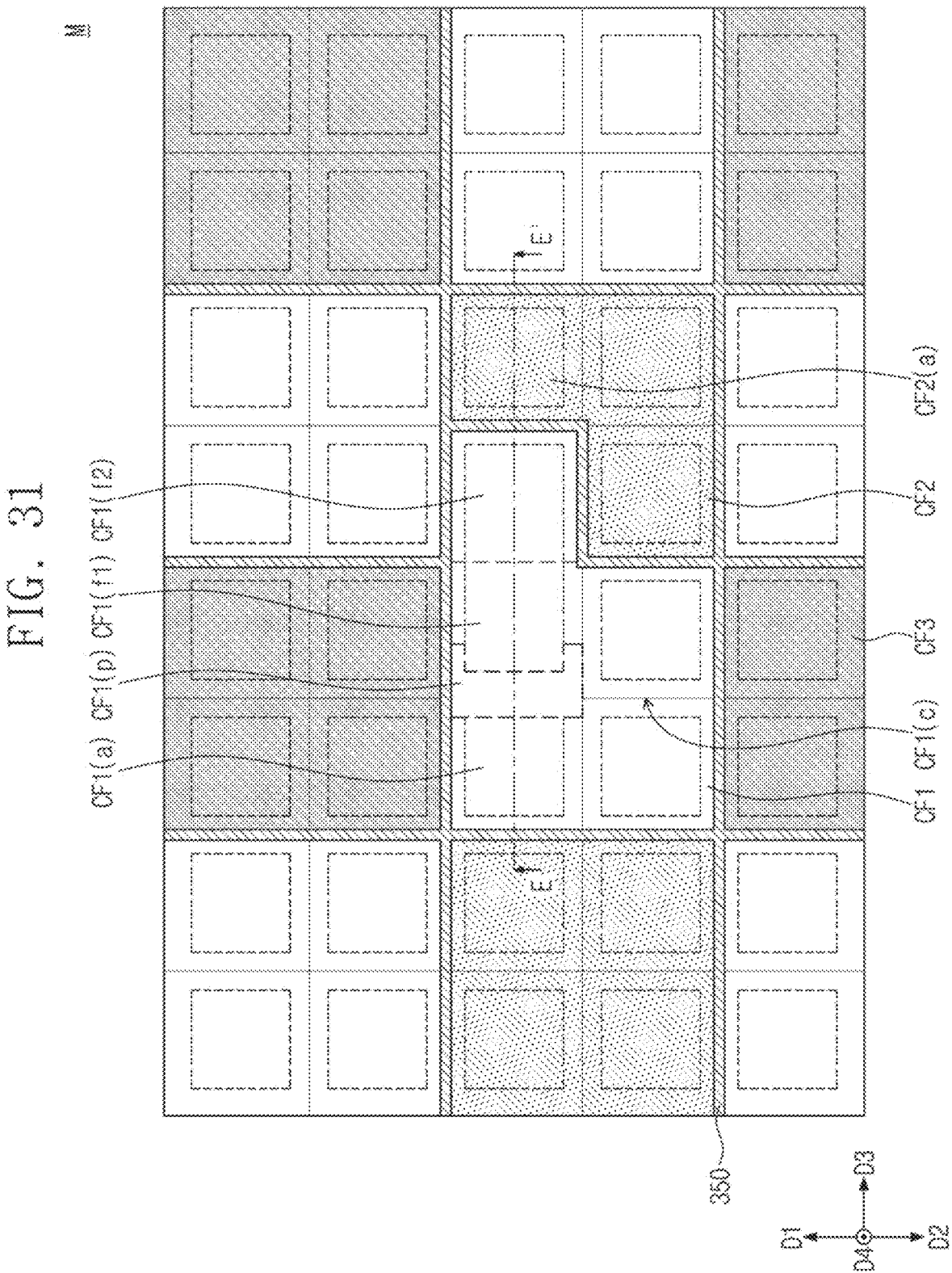
FIG. 31 is an enlarged plan view illustrating section M of an image sensor depicted in FIG. 2 according to one or more embodiments of the disclosure.
Figure 32:
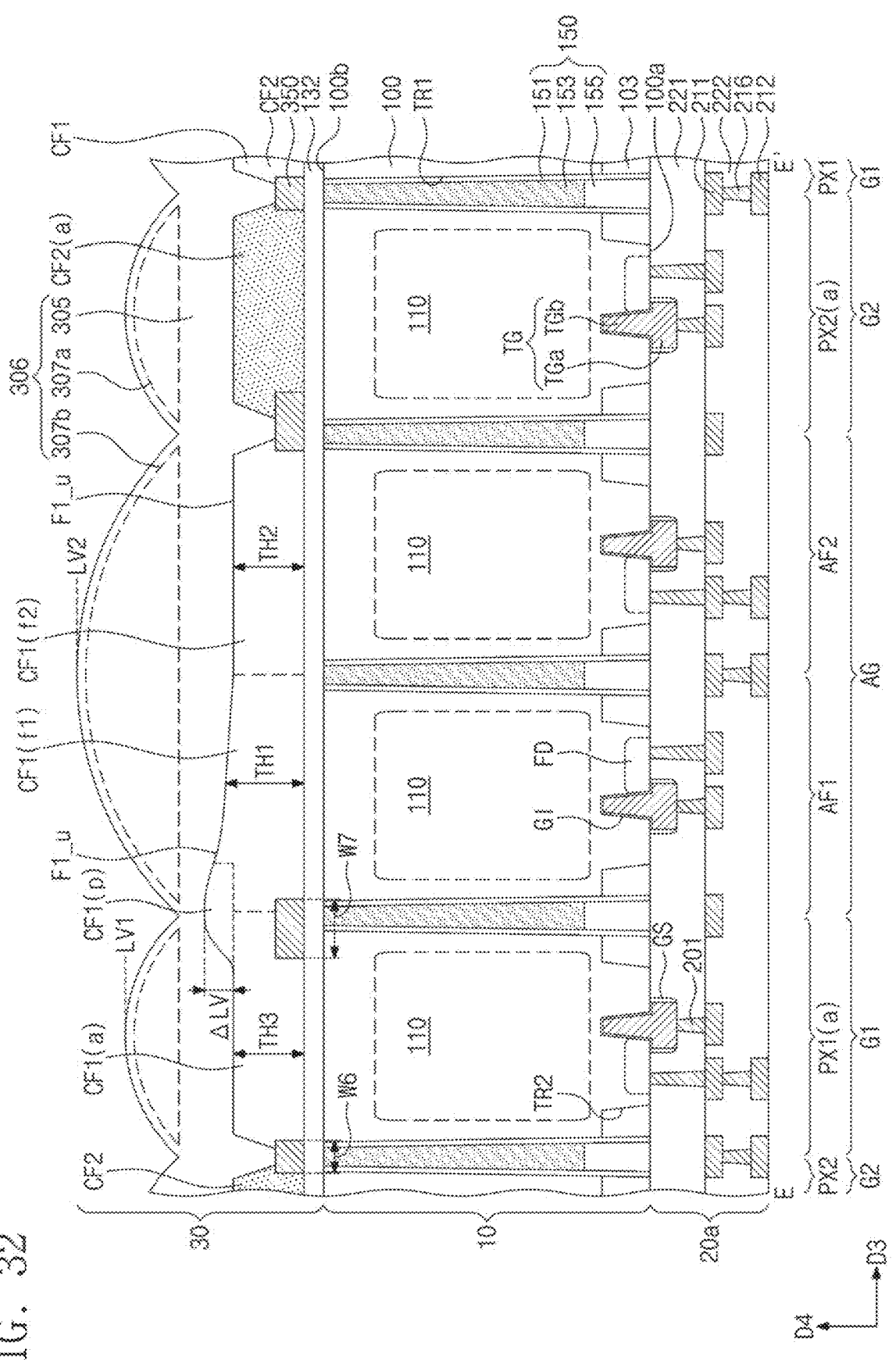
FIG. 32 is a cross-sectional view taken along line E-E' of FIG. 31 according to one or more embodiments of the disclosure.

FIG. 31 is an enlarged plan view illustrating section M of an image sensor depicted in FIG. 2 according to one or more embodiments of the disclosure. FIG. 32 is a cross-sectional view taken along line E-E' of FIG. 31 according to one or more embodiments of the disclosure.

Referring to FIGS. 31 and 32, an image sensor according to one or more embodiments of the disclosure may be configured such that each of pixel groups G1 to G3 includes image pixels PX1 to PX3 arranged in a 2×2 arrangement. An AF pixel group AG may be disposed between a first pixel group G1 and a second pixel group G2. The first pixel group G1 adjacent to the AF pixel group AG may include three first image pixels PX1 obtained by subtracting one pixel from pixels arranged in the 2×2 arrangement. The second pixel group G2 adjacent to the AF pixel group AG may include three second image pixels PX2 obtained by subtracting one pixel from pixels arranged in the 2×2 arrangement.

A top surface of a light-shield pattern 350 may be partially exposed between first, second, and third color filters CF1, CF2, and CF3. Other structural features may be identical or similar to those described above.

According to the disclosure, color filters adjacent to an autofocus pixel group may include their protrusions that protrude toward the autofocus pixel group. For example, as the color filters adjacent to the autofocus pixel group are formed to have their relatively large sizes, sensitivity of pixels adjacent to the autofocus pixel group may be reduced. Accordingly, an image sensor may decrease in irregularity of color ratio between regions thereof.

Moreover, because the color filters are formed to have their protrusions each having a width that gradually increases in a direction toward an edge of a first substrate, the occurrence of irregularity of color ratio between regions of the image sensor may be effectively reduced.

Furthermore, based on design of the image sensor and/or asymmetry of color ratio between regions of the image sensor, the color filters may be formed to selectively include their protrusions on locations adjacent to the autofocus pixel group. As a result, the image sensor may improve in optical properties.

In an image sensor according to the disclosure, a first color filter positioned on a first AF pixel adjacent to a first image pixel having the same color as that of the first AF pixel may have a thickness greater than that of a first color filter positioned on a second AF pixel adjacent to a second image pixel whose color is different from that of the second AF pixel. Therefore, the first AF pixel may have photosensitivity the same as or similar to that of the second AF pixel, and accordingly an autofocus function may be satisfactorily performed.

Furthermore, in an image sensor according to the disclosure, a light-shield pattern may have a relatively large width on an edge of an AF pixel group, and thus image pixels adjacent to the AF pixel group may be prevented from concentration of a large amount of light, which may result in an achievement of uniform and sharp images.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. An image sensor, comprising:
a first pixel group on a substrate and comprising a plurality of first pixels;
a second pixel group on the substrate and comprising a plurality of second pixels, at least one first pixel of the plurality of first pixels and at least one second pixel of the plurality of second pixels being adjacent to each other in a first direction;
a first autofocus pixel group between the first pixel group and the second pixel group, the first autofocus pixel group comprising a first autofocus pixel adjacent to the first pixel group and a second autofocus pixel adjacent to the second pixel group;
a first color filter on the first autofocus pixel and the second autofocus pixel;
a second color filter on the plurality of second pixels; and
a light-shield pattern that separates the first color filter and the second color filter,
wherein the first color filter comprises a first protrusion that protrudes in a second direction toward the second color filter and that at least partially vertically overlaps the light-shield pattern,
wherein the second color filter comprises a second protrusion that protrudes in a third direction toward the first color filter and that at least partially vertically overlaps the light-shield pattern,
wherein a width of the second protrusion in the first direction is greater than a width of the first protrusion in the first direction, and
wherein the first protrusion is spaced apart from the second protrusion in the first direction by a distance that is greater than the width of the first protrusion in the first direction.

2. The image sensor of claim 1, wherein the first color filter at least partially covers the plurality of first pixels.

3. The image sensor of claim 1, further comprising a third color filter that at least partially covers the plurality of first pixels, wherein the third color filter is spaced apart from the first color filter.

4. The image sensor of claim 1, further comprising:

a third pixel group and a fourth pixel group that are sequentially provided in the first direction from the second pixel group;

a second autofocus pixel group between the third pixel group and the fourth pixel group;

a third color filter on the second autofocus pixel group; and a fourth color filter on the fourth pixel group, wherein the light-shield pattern separates the third color filter and the fourth color filter, wherein the fourth color filter comprises a third protrusion that protrudes in a fourth direction toward the third color filter and that at least partially vertically overlaps the light-shield pattern, and wherein a width of the third protrusion in the first direction is greater than the width of the first protrusion in the first direction.

5. The image sensor of claim 4, wherein the first color filter and the third color filter comprise a green color filter.

6. The image sensor of claim 4, wherein the third color filter comprises a fourth protrusion that protrudes in a fifth direction toward the fourth color filter and that at least partially vertically overlaps the light-shield pattern, and wherein a distance between the third protrusion and the fourth protrusion is less than a distance between the first protrusion and the second protrusion.

7. The image sensor of claim 1, wherein the second color filter further comprises a third protrusion that protrudes in the third direction toward the first color filter and that at least partially vertically overlaps the light-shield pattern, and wherein the second direction intersects the first direction.

8. The image sensor of claim 1, wherein the light-shield pattern is absent between the first autofocus pixel and the second autofocus pixel.

9. An image sensor comprising:

a substrate comprising a first surface and a second surface opposite to the first surface;

a first pixel group on the substrate, the first pixel group comprising a plurality of first pixels;

a second pixel group on the substrate, the second pixel group comprising a plurality of second pixels, and at least one first pixel of the plurality of first pixels and at least one second pixel of the plurality of second pixels being adjacent in a first direction;

a first autofocus pixel group between the first pixel group and the second pixel group, the first autofocus pixel group comprising a first autofocus pixel adjacent to the first pixel group and a second autofocus pixel adjacent to the second pixel group;

a pixel isolation pattern in the substrate, the pixel isolation pattern being between the plurality of first pixels and between the plurality of second pixels;

a photoelectric conversion region in each of the plurality of first pixels and each of the plurality of second pixels;

a transfer gate on the first surface of the substrate;

a floating diffusion region in the substrate and adjacent to at least one side of the transfer gate;

a first dielectric layer that at least partially covers the transfer gate;

wiring lines in the first dielectric layer;

a backside dielectric layer on the second surface of the substrate;

a first color filter on the backside dielectric layer and at least partially covering the first pixel group and the first autofocus pixel group;

a second color filter on the backside dielectric layer and at least partially covering the second pixel group;

a light-shield pattern that separates the first color filter and the second color filter; and a microlens section on the first color filter and the second color filter, wherein the first color filter comprises a first protrusion that protrudes in a second direction toward the second color filter and that at least partially vertically overlaps the light-shield pattern, wherein the second color filter comprises a second protrusion that protrudes in a third direction toward the first color filter and that at least partially vertically overlaps the light-shield pattern, wherein a width of the second protrusion in the first direction is greater than a width of the first protrusion in the first direction, and wherein the first protrusion is spaced apart from the second protrusion in the first direction by a distance that is greater than the width of the first protrusion in the first direction.

10. An image sensor comprising:

a substrate comprises a first image pixel, a first autofocus pixel, a second autofocus pixel, and a second image pixel that are arranged sequentially in a first direction;

a first color filter on the substrate and at least partially covering the first image pixel, the first autofocus pixel, and the second autofocus pixel, wherein the first color filter comprises a first color; and a second color filter that at least partially covers the second image pixel and comprises a second color different from the first color, wherein the first color filter comprises a first thickness on the first autofocus pixel and a second thickness on the second autofocus pixel, and wherein the first thickness is greater than the second thickness.

11. The image sensor of claim 10, wherein the first color comprises has a third thickness on the first image pixel, and wherein the third thickness is substantially the same as the second thickness.

12. The image sensor of claim 10, wherein the first color filter is spaced apart from the second color filter.

13. The image sensor of claim 10, further comprising:

a pixel isolation pattern on the substrate and separating the first image pixel, the first autofocus pixel, the second autofocus pixel, and the second image pixel from each other; and a light-shield pattern between the substrate and the first color filter, and between the substrate and the second color filter, the light-shield pattern overlapping the pixel isolation pattern, wherein a top surface of the light-shield pattern is exposed between the first color filter and the second color filter.

14. The image sensor of claim 13, wherein the light-shield pattern is absent at a location between the first autofocus pixel and the second autofocus pixel.

15. The image sensor of claim 13, wherein the substrate further comprises a third image pixel spaced apart from the first autofocus pixel, wherein, in the first direction, the light-shield pattern has a first width on the first autofocus pixel and the first image pixel, wherein, in the first direction, the light-shield pattern has a second width on the first image pixel and the third image pixel, and wherein the first width is greater than the second width.

16. The image sensor of claim 10, wherein the substrate further comprises a third image pixel spaced apart from the first autofocus pixel, wherein the first color filter at least partially covers the third image pixel, wherein the first color filter has a third thickness between the first image pixel and the third image pixel, and wherein the third thickness is less than the second thickness.

17. The image sensor of claim 10, further comprising:

a pixel isolation pattern on the substrate and separating the first image pixel, the first autofocus pixel, the second autofocus pixel, and the second image pixel from each other;

a light-shield pattern between the substrate and the first color filter, and between the substrate and the second color filter, the light-shield pattern at least partially overlapping the pixel isolation pattern; and a microlens section that at least partially covers the first color filter and the second color filter, wherein a portion of the microlens section is between the first color filter and the second color filter and contacts the light-shield pattern.

18. The image sensor of claim 17, wherein the microlens section comprises:

a first lens portion that at least partially overlaps the first image pixel; and a second lens portion that at least partially covers the first autofocus pixel and the second autofocus pixel, and wherein a top end of the first lens portion is at a first height that is lower than a second height of a top end of the second lens portion.

19. The image sensor of claim 10, wherein the first color filter has an uppermost point between the first image pixel and the first autofocus pixel, wherein the first color filter comprises a first top surface on the second autofocus pixel, and wherein a level difference between the uppermost point and the first top surface is in a range of about 10 nm to about 50 nm.

20. The image sensor of claim 10, wherein a top surface of the first color filter is inclined on the first autofocus pixel.

* * * * *